(12) United States Patent
Breymesser et al.

(10) Patent No.: US 9,704,712 B1
(45) Date of Patent: Jul. 11, 2017

(54) METHOD OF MAKING A SEMICONDUCTOR DEVICE FORMED BY THERMAL ANNEALING

(71) Applicant: Infineon Technologies AG, Neubiberg (DE)

(72) Inventors: Alexander Breymesser, Villach (AT); Stephan Voss, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/983,611

(22) Filed: Dec. 30, 2015

(51) Int. Cl.
| | |
|---|---|
| H01L 21/225 | (2006.01) |
| H01L 21/02 | (2006.01) |
| H01L 21/308 | (2006.01) |
| H01L 21/268 | (2006.01) |
| H01L 29/34 | (2006.01) |
| H01L 29/06 | (2006.01) |

(52) U.S. Cl.
CPC .... *H01L 21/2252* (2013.01); *H01L 21/02675* (2013.01); *H01L 21/2258* (2013.01); *H01L 21/268* (2013.01); *H01L 21/308* (2013.01); *H01L 29/0684* (2013.01); *H01L 29/34* (2013.01)

(58) Field of Classification Search
CPC .. H01L 21/268; H01L 21/326; H01L 21/2636
See application file for complete search history.

(56) References Cited

U.S. PATENT DOCUMENTS

| | | | | | |
|---|---|---|---|---|---|
| 5,937,304 | A | * | 8/1999 | Yoshinouchi | ....... H01L 21/2236 257/E21.143 |
| 6,559,034 | B2 | * | 5/2003 | Sotani | ................. H01L 29/6675 257/E21.133 |
| 7,700,382 | B2 | * | 4/2010 | Jin | ....................... H01L 21/2236 257/E21.211 |
| 8,420,512 | B2 | * | 4/2013 | Nakazawa | ............ H01L 21/268 438/166 |
| 9,202,965 | B2 | * | 12/2015 | Lee | ......................... H01L 31/18 |

OTHER PUBLICATIONS

Hylton et al., "Absorption in Thin Textured Silicon Wafers", Proc. 14th EPVSEC, 1997, pp. 139-142, Barcelona, Spain.
Kim et al., "New excimer-laser-crystallization method for producing large-grained and grain boundary-location-controlled Si films for thin film transistors", Appl. Phys. Lett., Mar. 11, 1996, pp. 1513-1515, vol. 68, No. 11, American Institute of Physics, College Park (MD).

(Continued)

*Primary Examiner* — Dung Le
(74) *Attorney, Agent, or Firm* — Viering, Jentschura & Partner mbB

(57) ABSTRACT

According to various embodiments, a method may include: structuring a semiconductor region to form a structured surface of the semiconductor region; disposing a dopant in the semiconductor region; and activating the dopant at least partially by irradiating the structured surface at least partially with electromagnetic radiation having at least one discrete wavelength to heat the semiconductor region at least partially.

22 Claims, 24 Drawing Sheets

(56) References Cited

OTHER PUBLICATIONS

Gjessing et al., "Comparison of Light Trapping in Diffractive and Random Pyramidal Structures", 26th European Photovoltaic Solar Energy Conference and Exhibition, Sep. 5-9, 2011, pp. 2759-2763, Hamburg, Germany.

Battaglia et al., "Light Trapping in Solar Cells: Can Periodic Beat Random?", Feb. 29, 2012, pp. 2790-2797, vol. 6 (3), American Chemical Society, Washington, D.C.

Papet et al., "Pyramidal texturing of silicon solar cell with TMAH chemical anisotropic etching", Solar Energy Materials & Solar Cells, Apr. 19, 2006, pp. 2319-2328, vol. 90, Elsevier B.V., Amsterdam, The Netherlands.

Papet et al., "TMAH texturisation and etching of interdigitated back-contact solar cells", Materials Science—Poland, 2006, pp. 1043-1049, vol. 24, No. 4, Poland.

\* cited by examiner

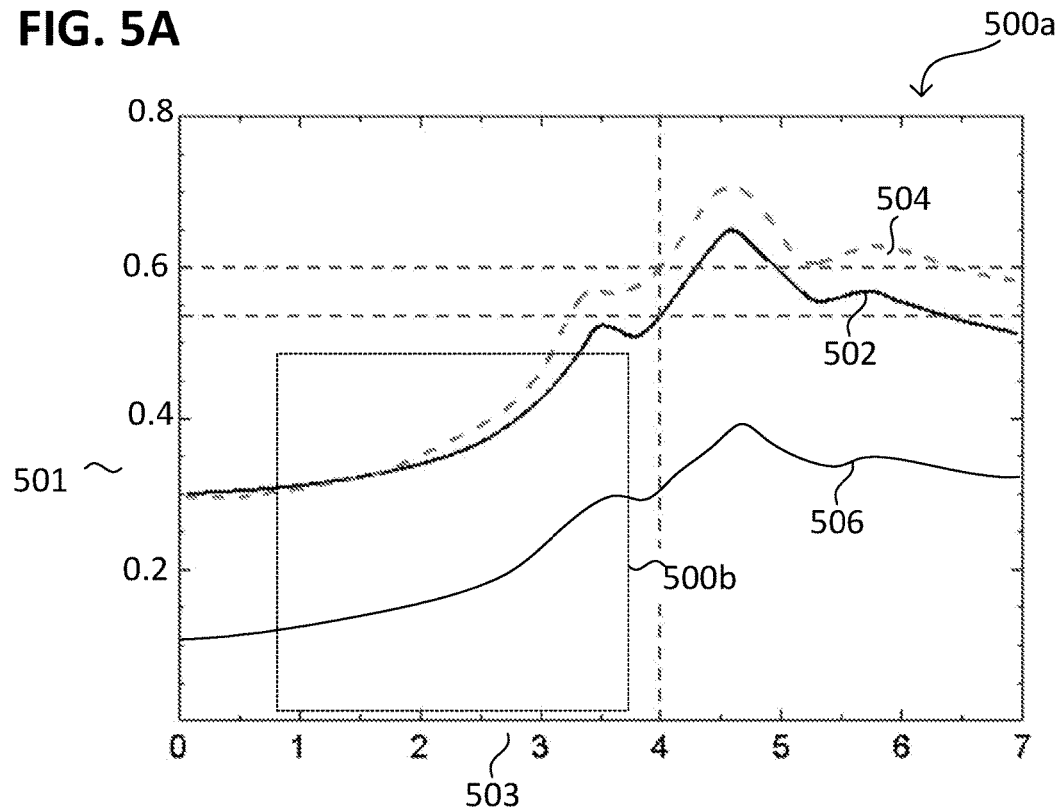
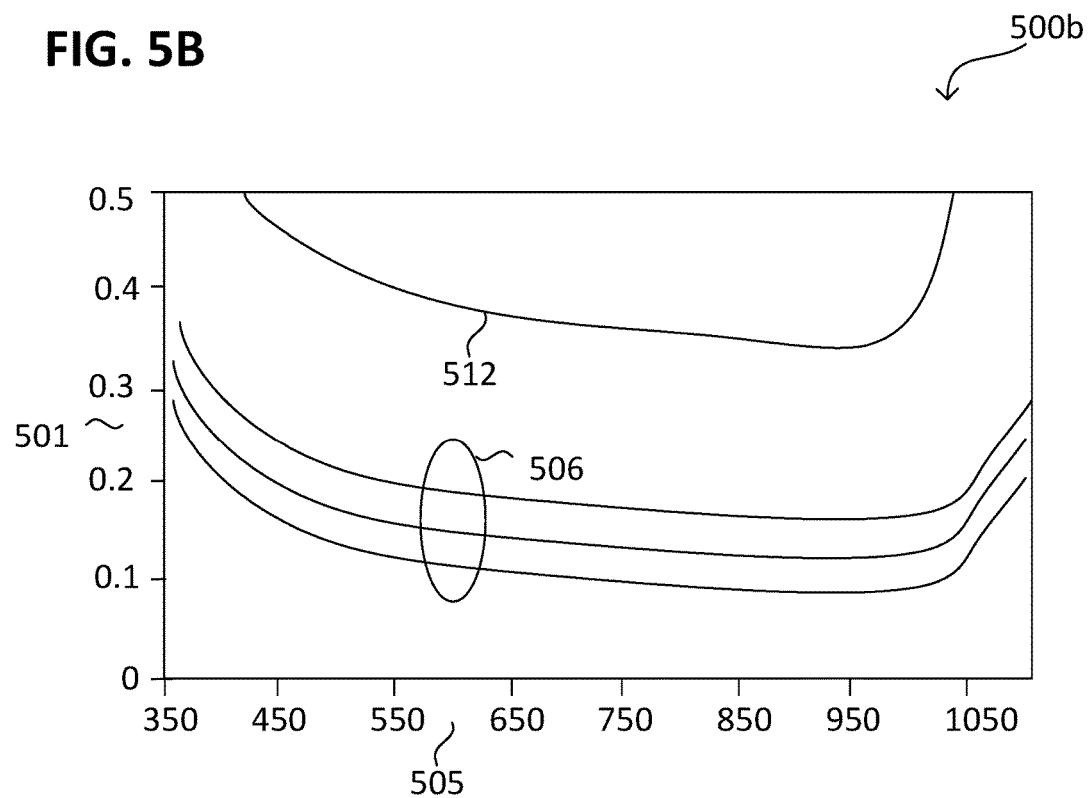

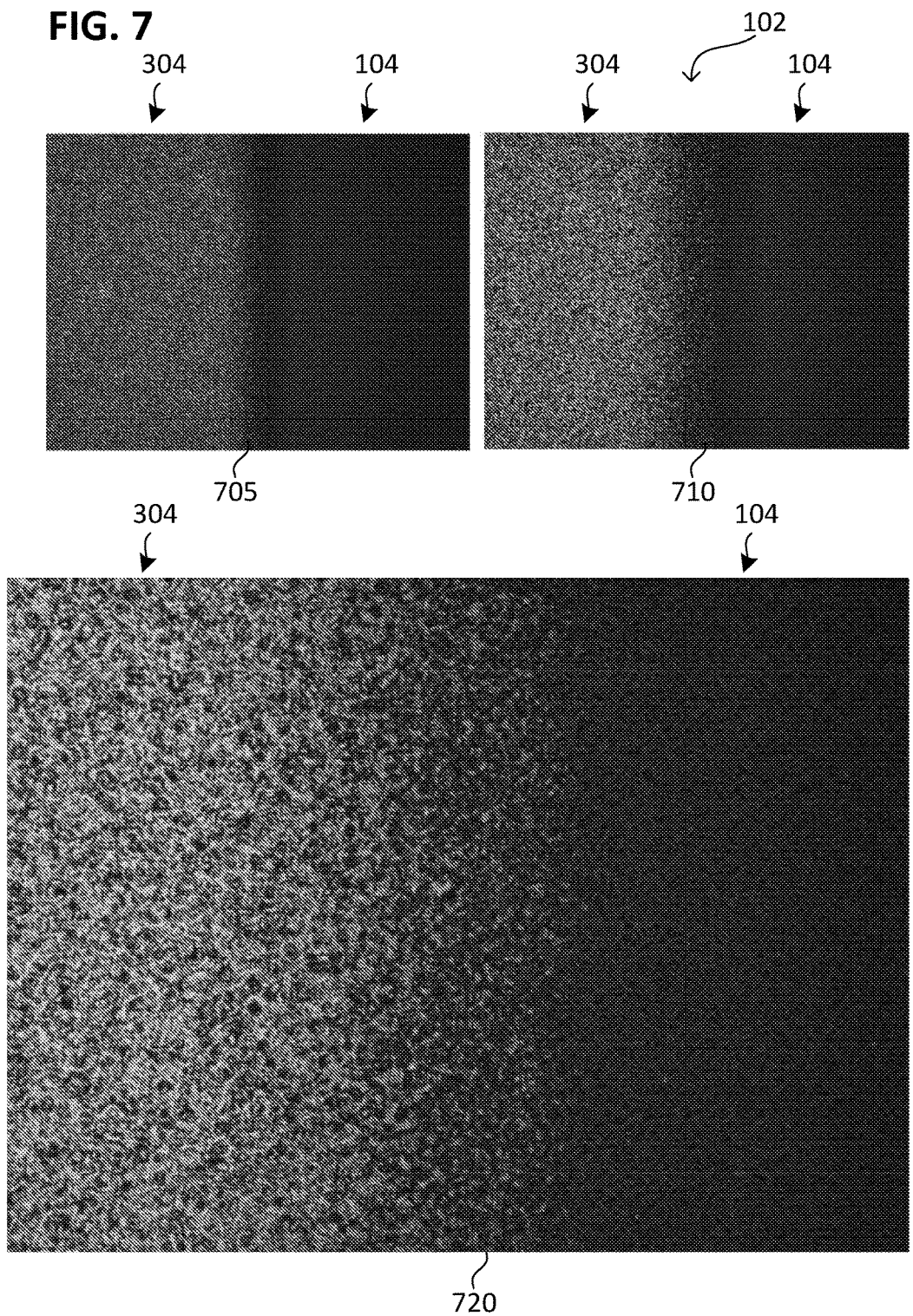

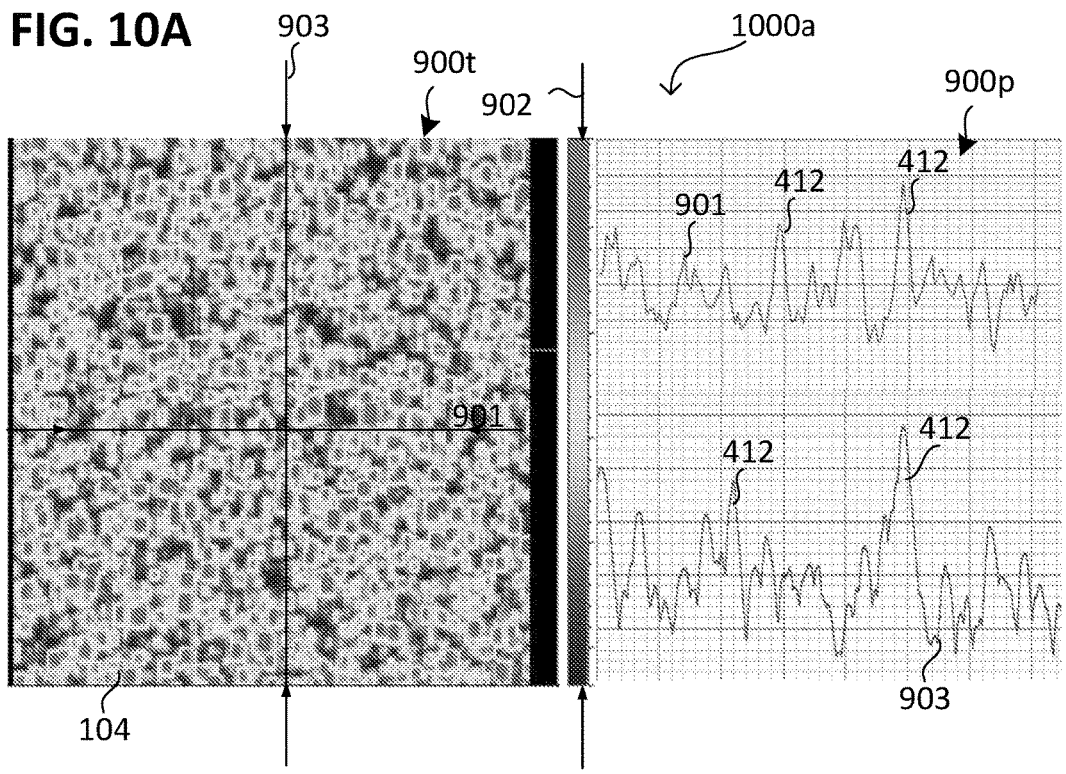
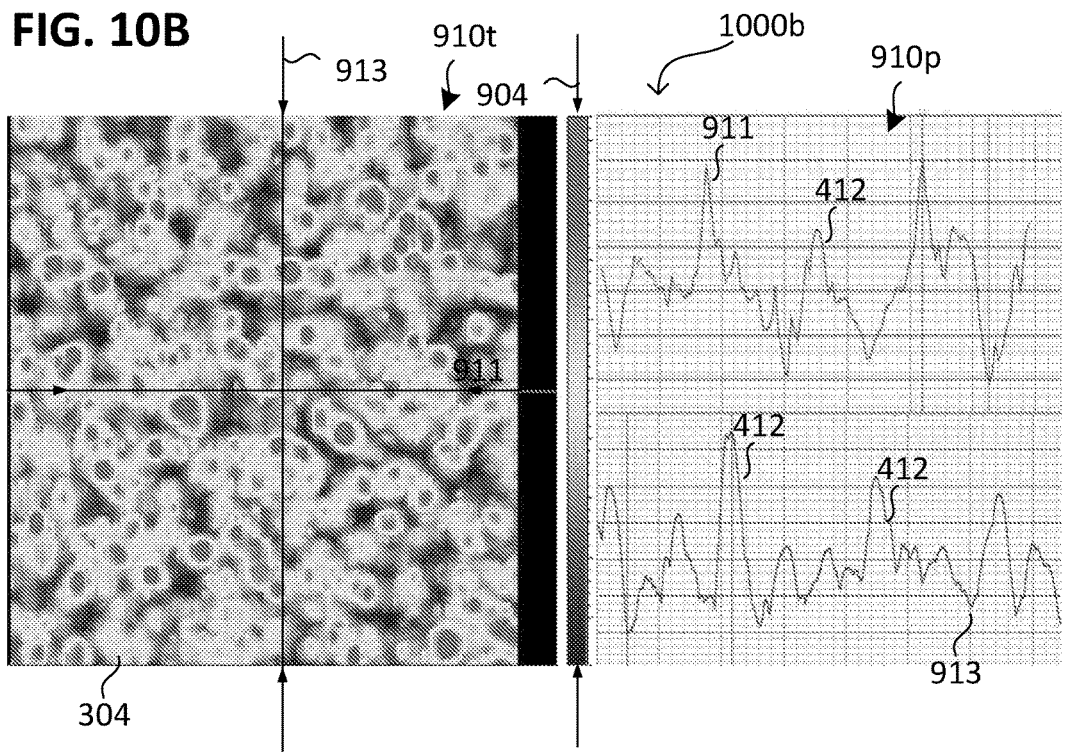

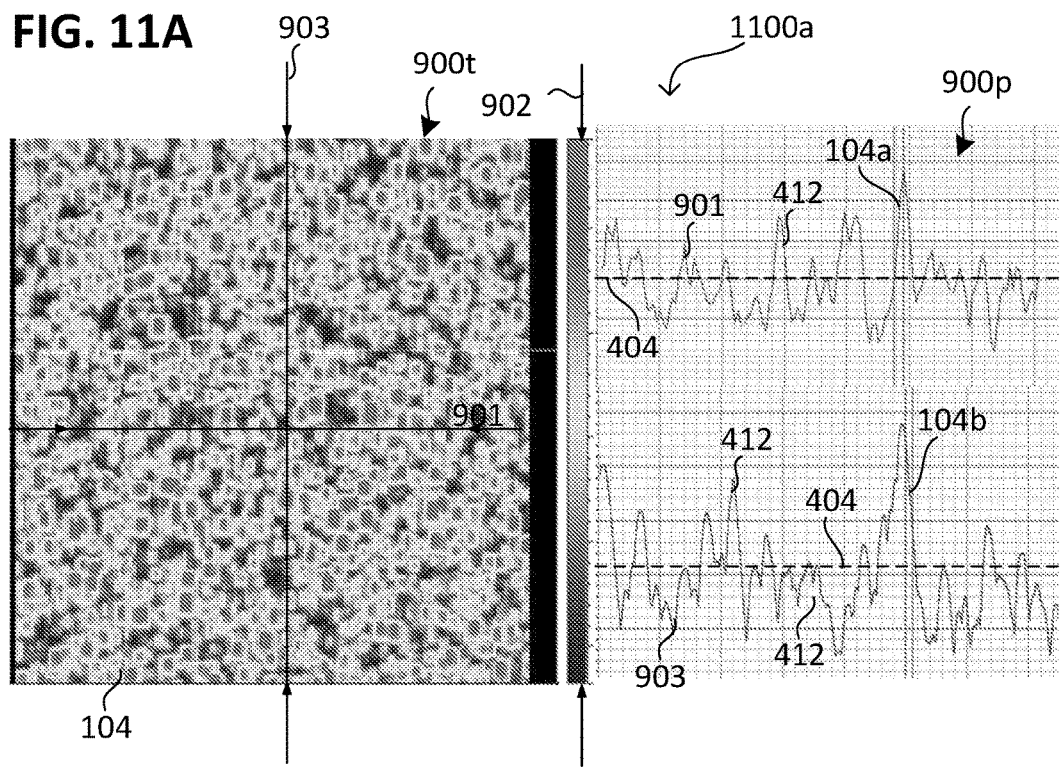
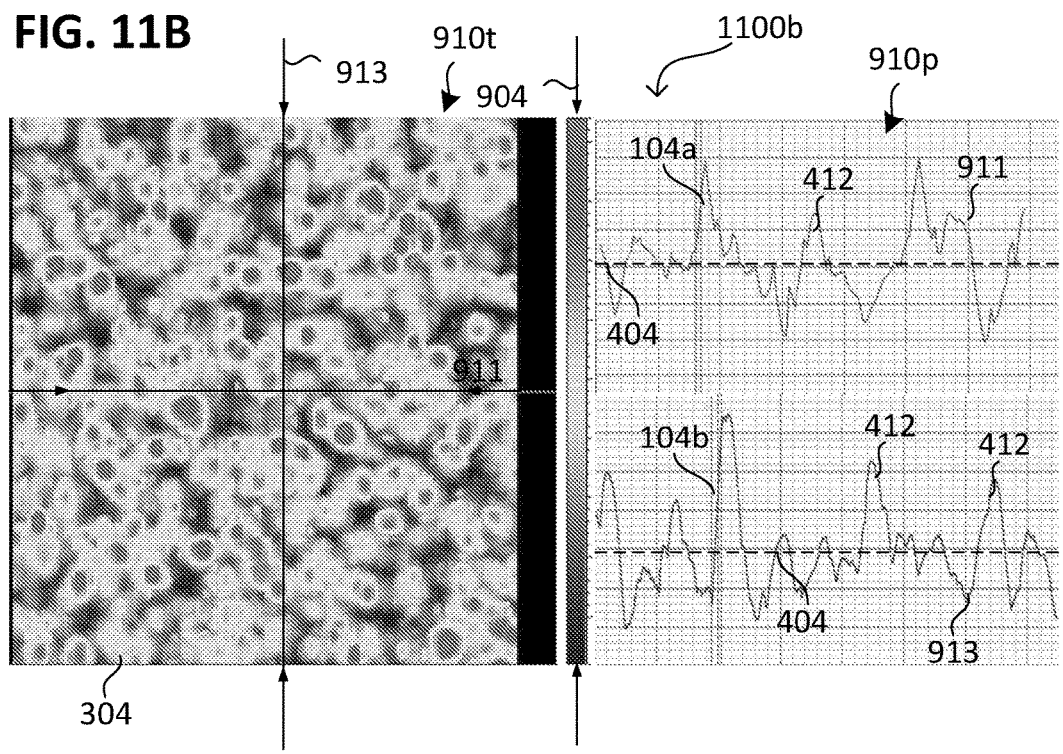

FIG. 15A 1500a   FIG. 15B 1500b
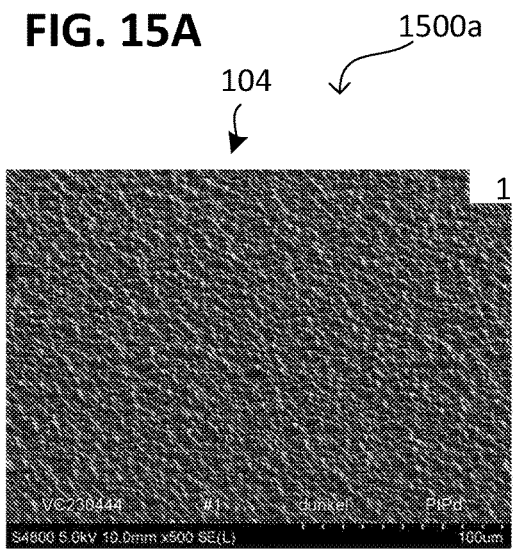
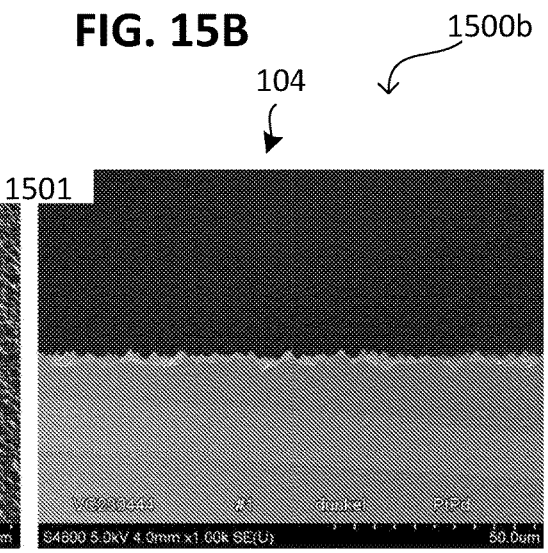
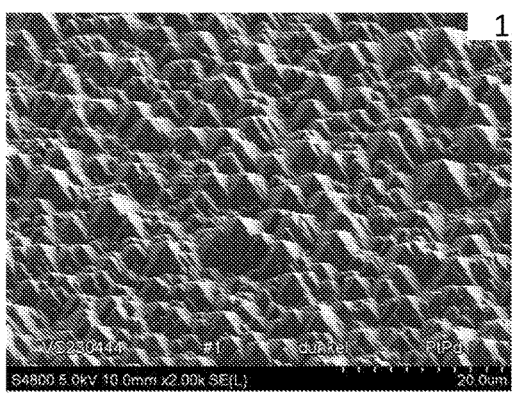
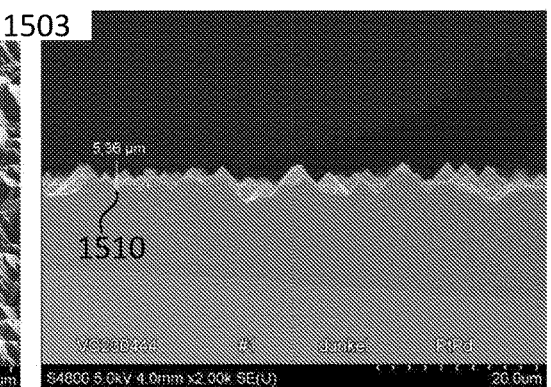
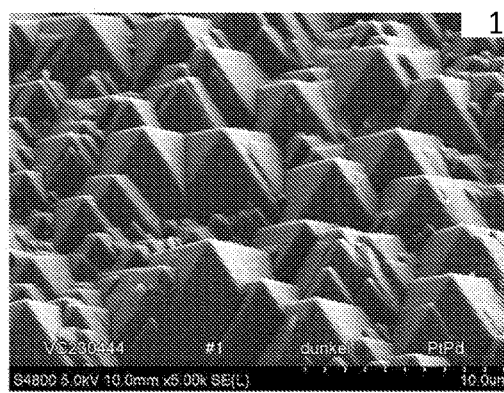
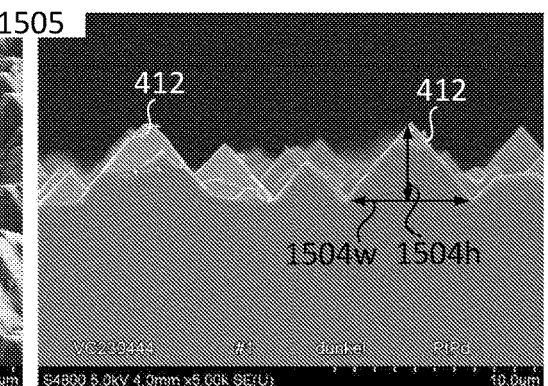

FIG. 16A 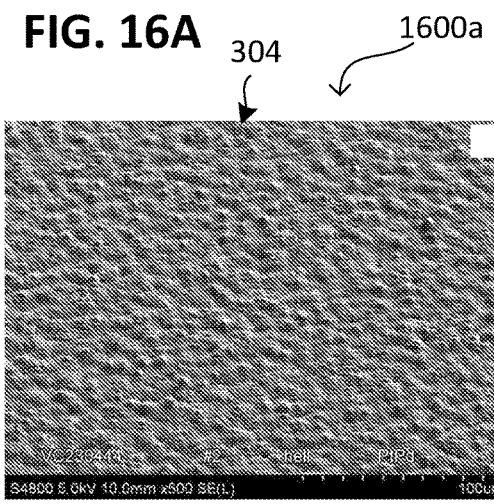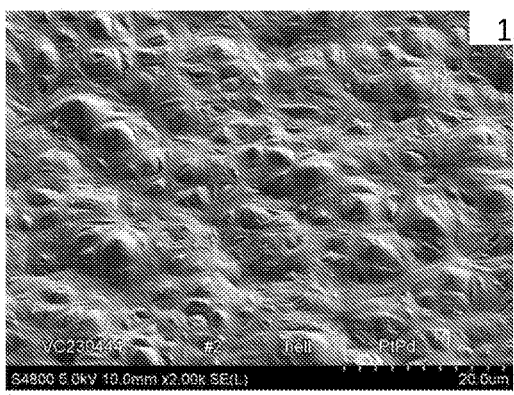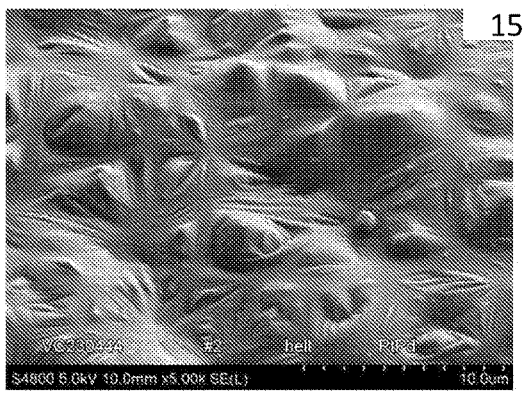
FIG. 16B 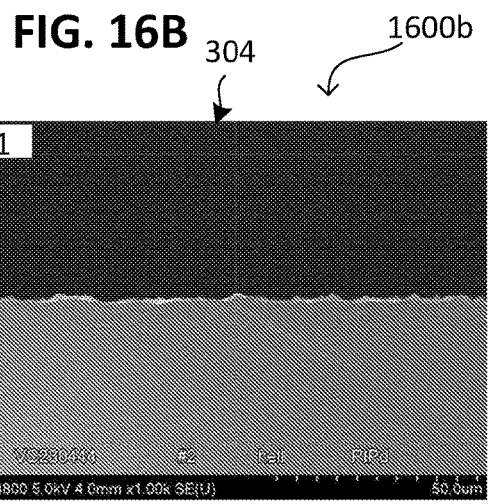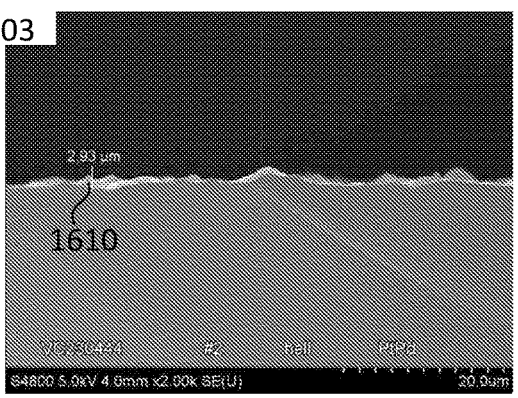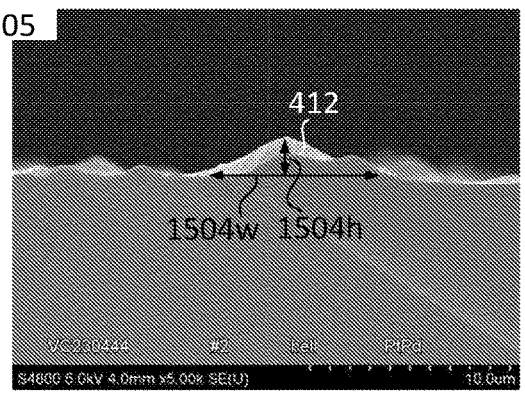

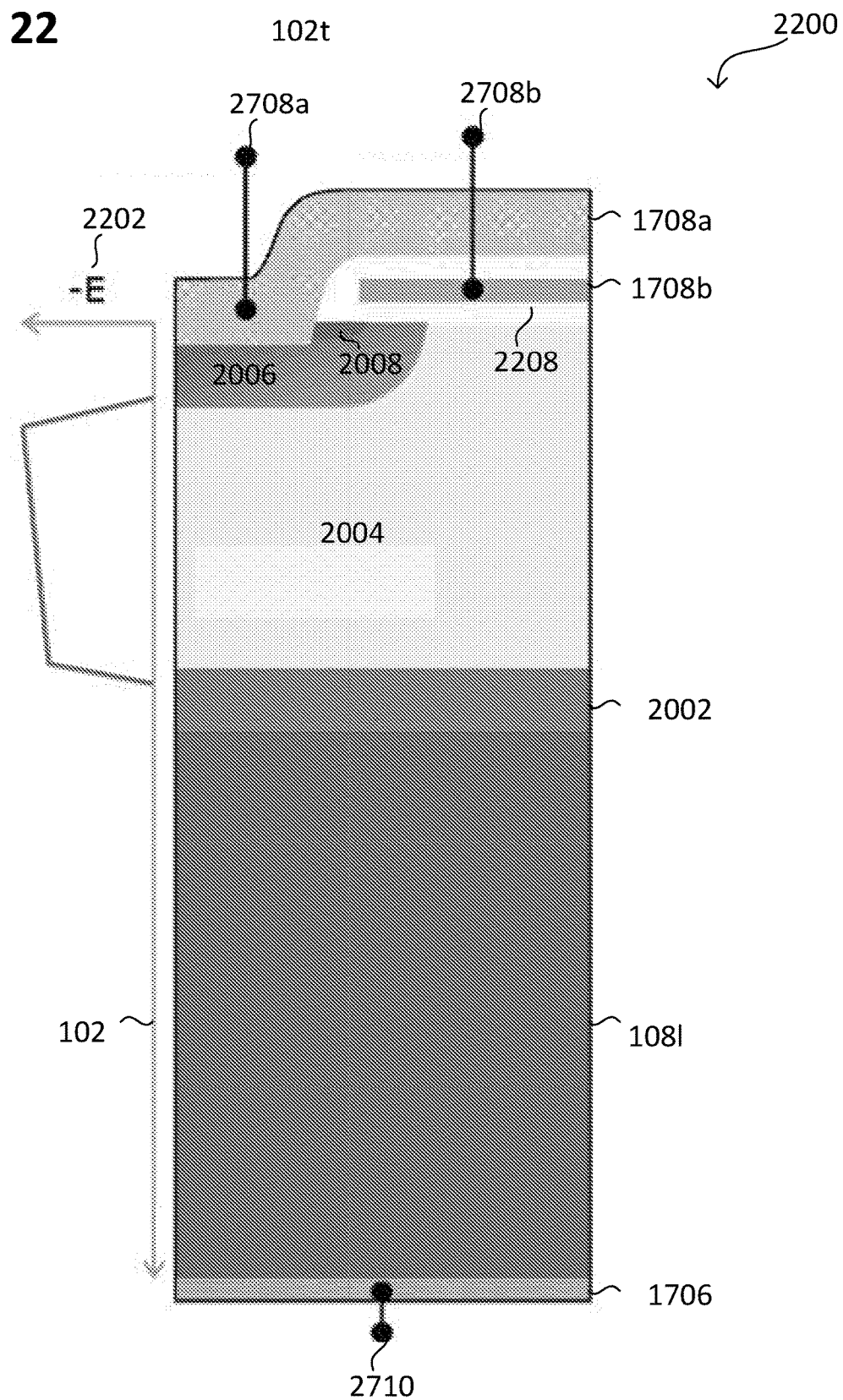

US 9,704,712 B1

METHOD OF MAKING A SEMICONDUCTOR DEVICE FORMED BY THERMAL ANNEALING

TECHNICAL FIELD

Various embodiments relate generally to a method for thermal annealing and a semiconductor device formed by the method.

BACKGROUND

In general, semiconductor materials may be processed in semiconductor technology on or in a substrate (also referred to as a wafer or a carrier), e.g. to fabricate integrated circuits (also referred to as chips). During processing the semiconductor material, certain process steps may be applied, such as thinning the substrate, doping a semiconductor material, or forming one or more layers over the substrate.

For doping the semiconductor material, a dopant may be implanted into the semiconductor material. The semiconductor material may be further processed to fully activate the dopant. Dopant activation may provide obtaining the desired electronic contribution from the dopant in the semiconductor material. For activating the dopant, thermal energy may be transferred to the semiconductor material following the dopant implantation. Conventionally, thermal annealing by a furnace or rapid thermal processing is used, providing a thermal equilibrium or a rapid process, with a high peak temperature for less than one second to minimize chemical diffusion of the dopant. For transferring thermal energy to the semiconductor material, laser light may be used, also referred to as Laser-Thermal Annealing (LTA).

Conventionally, a wavelength of the laser light is adapted according to the semiconductor material to provide a maximum transfer of energy to the semiconductor material. In other words, a high transfer efficiency may be provided, which reduces the energy needed for LTA. Alternatively, the wavelength of the laser light is adapted according to the desired absorption length. A short wavelength may result in a concentration of energy in the surface region.

One the one hand, due to the high absorption, also the penetration depth of the laser light may be limited depending on the wavelength of the laser light. The total energy of the laser light may be limited according to the thermal limits the semiconductor material can withstand. Therefore, the process itself may limit a depth of the semiconductor material in which the dopant is activated.

On the other hand, even if the wavelength of the laser light is adjusted according to a maximum transfer of energy, still a large portion of the laser light is inherently reflected by the semiconductor material and cannot be used for transferring energy to the semiconductor material anymore. For example, the semiconductor material reflects conventionally about 60% of the laser light. Therefore, the total energy needed to obtain a desired amount of thermal energy transferred to the semiconductor material is much higher than the thermal energy. Therefore, the power consumption of the laser light source and the corresponding investment costs to provide process equipment having the required power capability (e.g. sufficient optics, multiple pulse lasers, and multiple wavelength lasers) are conventionally high.

Conventionally, an antireflective coating is formed over the semiconductor material to reduce the amount of reflected light. However, the antireflective coating may affect the result of the thermal treatment due to mechanical stress incorporated in the antireflective coating. For example, a tensile stressed coating may relax when the underlying portion of the semiconductor material is melted. The topographical image of the relaxed coating may be in incorporated into the solidifying portion of the semiconductor material. A compressively stressed coating tends to crack and to spall if the support by the mechanically rigid underlying semiconductor material is lost due to its melting. Further, the coating may intermix with the melted semiconductor material and contaminate the semiconductor material. This may lead to processing faults or limit the processing range, e.g. the thermal treatment.

SUMMARY

According to various embodiments, a method may include: structuring a semiconductor region to form a structured surface of the semiconductor region; disposing a dopant in the semiconductor region; and activating the dopant at least partially by irradiating the structured surface at least partially with electromagnetic radiation having at least one discrete wavelength to heat the semiconductor region at least partially.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5A and FIG. 5B respectively show a reflection characteristic of a semiconductor device according to various embodiments in a method according to various embodiments in a schematic diagram;

FIG. 7 shows a structured surface according to various embodiments in a method according to various embodiments in a schematic top view;

FIG. 10A and FIG. 10B respectively show a structured surface according to various embodiments in a method according to various embodiments in a schematic analytic view;

FIG. 11A and FIG. 11B respectively show a structured surface according to various embodiments in a method according to various embodiments in a schematic analytic view;

FIG. 15A shows a structured surface according to various embodiments in a method according to various embodiments in a schematic perspective view;

FIG. 15B shows a structured surface according to various embodiments in a method according to various embodiments in a schematic cross sectional view;

FIG. 16A shows a structured surface according to various embodiments in a method according to various embodiments in a schematic perspective view;

FIG. 16B shows a structured surface according to various embodiments in a method according to various embodiments in a schematic cross sectional view;

FIG. 22 shows a semiconductor device according to various embodiments in a method according to various embodiments in a schematic cross sectional view;

DESCRIPTION

Figure 1A:
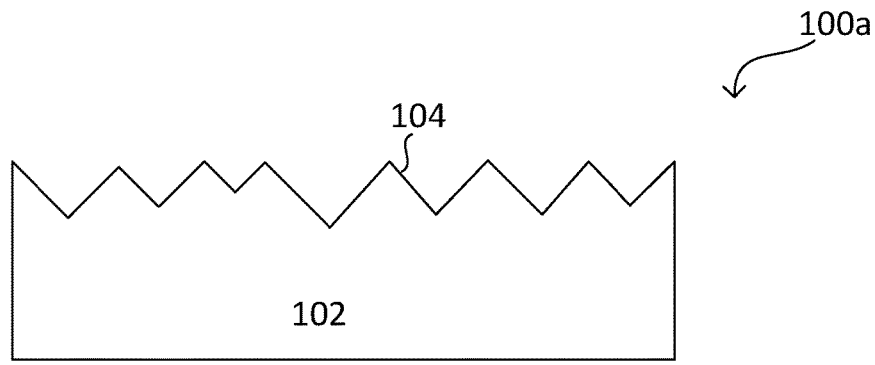
FIG. 1A, FIG. 1B and FIG. 1C respectively show a semiconductor device according to various embodiments in a method according to various embodiments in a schematic cross sectional view or side view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

The phrase "at least one of" in regard to a group of elements may be used herein to mean at least one element from the group consisting of the elements (e.g. Markush Group). For example, the phrase "at least one of" in regard to a group of elements may be used herein to mean a selection of: one of the listed elements, a plurality of one of the listed elements, a plurality of individual listed elements, or a plurality of a multiple of listed elements.

According to various embodiments, a semiconductor region may include or be formed from semiconductor materials of various types, including a group IV semiconductor (e.g. silicon or germanium), a compound semiconductor, e.g. a group III-V compound semiconductor (e.g. gallium arsenide) or other types, including group III semiconductors, group V semiconductors or polymers, for example. In an embodiment, the semiconductor region is made of silicon (doped or undoped), in an alternative embodiment, the semiconductor region is a silicon on insulator (SOI) wafer. As an alternative, any other suitable semiconductor material can be used for the semiconductor region, for example semiconductor compound material such as gallium phosphide (GaP), indium phosphide (InP), but also any suitable ternary semiconductor compound material or quaternary semiconductor compound material such as indium gallium arsenide (InGaAs).

According to various embodiments, the semiconductor region may be processed to form one or more semiconductor chips at least one of in or over the semiconductor region. A semiconductor chip may include an active chip area. The active chip area may be disposed in a portion of the semiconductor region and may include one or more semiconductor circuit elements like a transistor, a resistor, a capacitor, a diode or the like. The one or more semiconductor circuit elements may be configured to perform computing or storage operations. Alternatively or additionally, the one or more semiconductor circuit elements may be configured to perform switching or rectifying operations, e.g. in power electronics.

According to various embodiments, a semiconductor chip may be singulated from the semiconductor region by removing material from a kerf region of the semiconductor region (also called dicing or cutting the semiconductor region). For example, removing material from the kerf region of the semiconductor region may be processed by scribing and breaking, cleavage, blade dicing or mechanical sawing (e.g. using a dicing saw). After singulating the semiconductor chip, it may be electrically contacted and encapsulated, e.g. by mold materials, into a chip carrier (also called a chip housing) which may then be suitable for use in electronic devices. For example, the semiconductor chip may be bonded to a chip carrier by wires, and the chip carrier may be soldered onto a printed circuit board.

According to various embodiments, the absorbed energy from a laser beam by semiconductor region may be increased, e.g. during laser-thermal annealing (LTA). This may be used to increase a melting depth (illustratively, describing a thickness of a portion which melts) of the semiconductor region. Alternatively or additionally, a temperature budget may be increased in a non-melt mode within the semiconductor region (illustratively, without melting material of the semiconductor region).

According to various embodiments, during LTA, the melting depth or the temperature budget, respectively, may be increased by increasing an energy of the laser light (e.g. laser beam energy). Alternatively or additionally (to increasing the energy), a layer may be formed over the semiconductor region, which increases at least one of the antireflection properties (e.g. an antireflection layer) or the absorption properties (e.g. an absorptive layer).

According to various embodiments, a structured surface of the semiconductor region may be provided. The structured surface of the semiconductor region may increase the absorption of the laser light (e.g. in form of a laser beam) by reducing the portion of laser light reflected. An energy (energy of the laser light) utilization (illustratively, the transferred fraction of energy) for the structured surface of the semiconductor region may be greater than for a planar surface of the semiconductor region. The energy transferred to the semiconductor region may be used for melting a portion of the semiconductor region.

According to various embodiments, a surface of the semiconductor region may be structured, e.g. selectively, for increasing the absorption of laser light. The structured surface of the semiconductor region may increase (or maximize) the absorption of laser light via multiple reflections of the laser light at least one of at or in the structured surface. Forming the structured surface may be provided by various processes as described herein.

According to various embodiments, increasing the absorption of laser light may result in an increased energy transfer to the semiconductor region via the structured surface of the semiconductor region. Increasing the absorption of laser light (or the energy transfer to the semiconductor region respectively) may result in a flattening of the structured surface of the semiconductor region. Flattening of the structured surface of the semiconductor region may provide indirect evidence of an increased absorption of laser light (or the energy transfer respectively). Flattening of the structured surface may occur for example, if the melting depth is larger than a roughness or maximum height difference, respectively, of the structured surface of the semiconductor region.

According to various embodiments, the structured surface of the semiconductor region (e.g. including random-pyramids) may be used in semiconductor processing, e.g. in which a semiconductor structure is formed, for improving the semiconductor processing (which may include LTA).

A structuring process according to various embodiments, e.g. before LTA, may be confirmed by structural and/or chemical analysis of various types. For example, by analyzing a depth profile of the dopant, e g using at least one of: spreading resistance profiling (SRP) or electrochemical capacitance voltage profiling, a chemical concentration or a spatial distribution of the dopant in the semiconductor region (along a depth direction) may be obtained. The depth profile, e.g. after LTA, resulting from a structured surface according to various embodiments may differ from a respective depth profile resulting from a planar surface. Alternatively or additionally, by analyzing the structure and shape of the semiconductor region, e.g. using at least one of: a polished cross-section analysis of the semiconductor region, or a layer-by-layer removal analysis, the usage of a structured surface according to various embodiments may be confirmed. Even if the heated portion of the semiconductor region melts, it may maintain a flattened copy of the structured surface, which may be obtained.

Figure 1B:
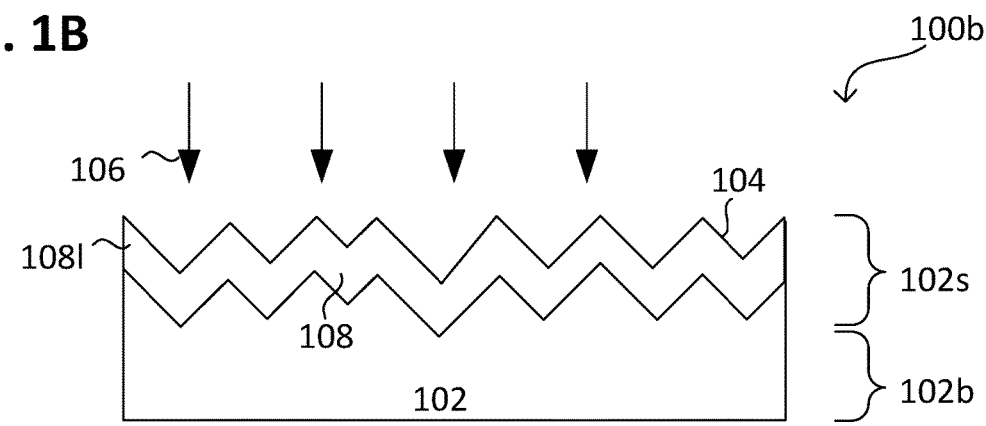
Figure 1C:
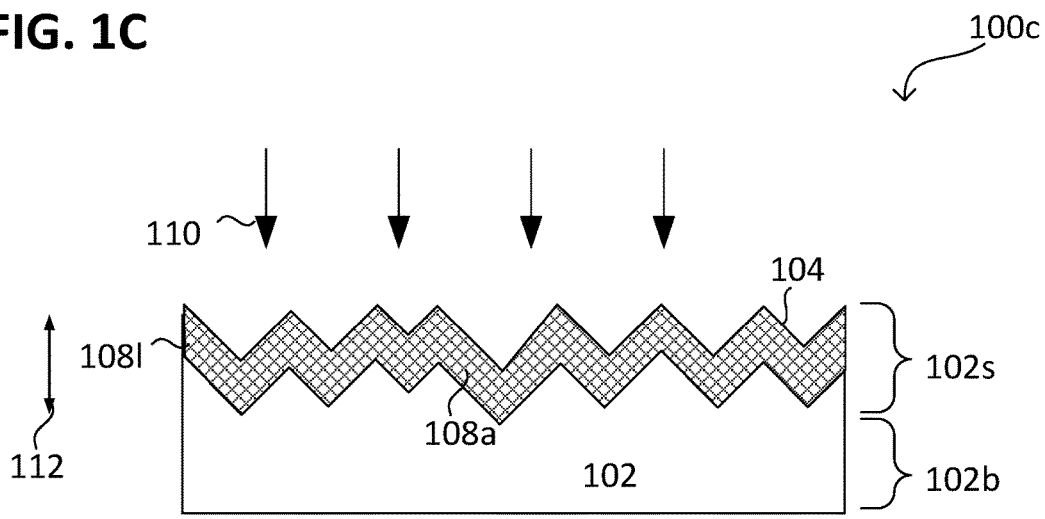

FIG. 1A, FIG. 1B and FIG. 1C illustrate a semiconductor device according to various embodiments in a method according to various embodiments in a schematic cross sectional view or side view According to various embodiments, the method may include in 100a structuring a semiconductor region 102 to form a structured surface 104 of the semiconductor region 102 for reducing a reflectance of the semiconductor region 102.

The semiconductor region 102 may include or be formed from a wafer (also referred to as substrate), e.g. a semiconductor wafer, e.g. a silicon wafer.

Reducing the reflectance of the semiconductor region 102 may provide an increased absorption of the semiconductor region 102. In other words, an absorption coefficient may be increased by structuring the semiconductor region 102, respectively a reflection coefficient may be reduced by structuring the semiconductor region 102. The absorption coefficient may describe a fraction of incident electromagnetic radiation, which is absorbed by the semiconductor region 102, e.g. by transforming the electromagnetic radiation into thermal energy. The reflection coefficient may describe a fraction of incident electromagnetic radiation, which is reflected (including reemission) by the semiconductor region 102.

According to various embodiments, the method may include in 100b disposing 106 a dopant 108 in the semiconductor region 102. Disposing the dopant in the semiconductor region 102 may include to form a concentration of the dopant (in other words, atoms of the dopant) in the semiconductor region 102 greater than about $10^{15}$ atoms per cubic centimeter (atoms/cm$^3$), e.g. greater than about $10^{16}$ atoms/cm$^3$, e.g. greater than about $10^{17}$ atoms/cm$^3$, e.g. greater than about $10^{18}$ atoms/cm$^3$, e.g. greater than about $10^{19}$ atoms/cm$^3$, e.g. greater than about $10^{20}$ atoms/cm$^3$, e.g. greater than about $10^{21}$ atoms/cm$^3$ or even higher (e.g. substantially equal to a solubility of the dopant in the semiconductor region 102), e.g. in the range from about $10^{16}$ atoms/cm$^3$ to about $10^{22}$ atoms/cm$^3$, e.g. in the range from about $10^{16}$ atoms/cm$^3$ to about $10^{18}$ atoms/cm$^3$.

Disposing the dopant in the semiconductor region 102 may include in 100b transferring the dopant 108 into the semiconductor region 102, e.g. by ion beam implantation. In other words, the dopant may be implanted into the semiconductor region 102 by ion beam implantation. For implanting the dopant 108, the semiconductor region 102, e.g. the structured surface 104 of the semiconductor region 102, may be irradiated with an ion beam 106 including ions of the dopant 108. Alternatively or additionally, the dopant 108 may be provided by a gas 106 (also referred to as dopant source gas) including the dopant 108, wherein the dopant 108 is released from the gas and diffuses into the semiconductor region 102.

Figure 3A:
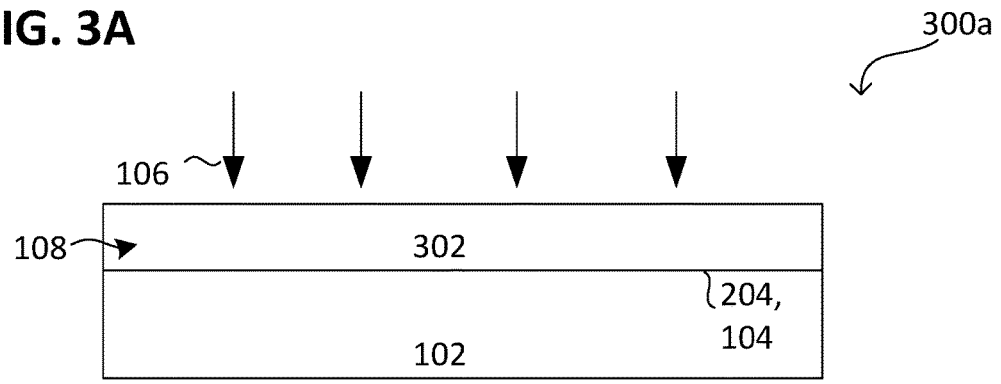
FIG. 3A, FIG. 3B and FIG. 3C respectively show a semiconductor device according to various embodiments in a method according to various embodiments in a schematic cross sectional view or side view.

Alternatively or additionally, the dopant may be provided via a dopant source layer (see FIG. 3A).

By disposing 106 the dopant 108 in the semiconductor region 102, a layer 108l (also referred to as dopant layer 108l) including the dopant and material of the semiconductor region 102 may be formed. The dopant layer 108l may be formed in a surface layer 102s of the semiconductor region 102, wherein the surface layer 102s of the semiconductor region 102 includes the structured surface 104 of the semiconductor region 102. In other words, the dopant layer 108l may be formed between the structured surface 104 of the semiconductor region 102 and a base region 102b of the semiconductor region 102.

According to various embodiments, the dopant layer 108l may include or be formed from a backside collector layer.

According to various embodiments, the method may include in 100c activating the dopant 108 at least partially by irradiating the structured surface 104 at least partially with electromagnetic radiation 110. By irradiating the structured surface 104, the semiconductor region 102 may be at least partially heated (in other words, at least a portion of the semiconductor region 102 may be heated). By activating the dopant 108, an activated dopant 108a may be provided. By activating the dopant 108, the dopant 108 may be incorporated into the semiconductor region 102, e.g. in a lattice structure of the semiconductor region 102, to provide the activated dopant 108a. Alternatively or additionally, by activating the dopant 108 the dopant 108 may chemically react with the semiconductor region 102, e.g. with the material of the semiconductor region 102, to provide the activated dopant 108a. By activating the dopant 108 at least one of an electrical property of the surface layer 102s, e.g. of the dopant layer 108l, may be changed. For example, an electrical conductivity of the surface layer 102s, e.g. of the dopant layer 108l, may be increased by activating the dopant 108.

According to various embodiments, during heating the semiconductor region 102 a temperature of the semiconductor region 102, e.g. of the surface layer 102s of the semiconductor region 102, may be increased, e.g. by a temperature difference. The temperature difference may be at least about 200 Kelvin (K), e.g. at least about 400 K, e.g. at least about 600 K, e.g. at least about 800 K, e.g. at least about 1000 K, e.g. in the range from about 600 K to about 1500 K. The temperature difference may be provided within a heating time defining a rate of the temperature difference over the heating time (also referred to as heating rate). The heating rate may be greater than about 100 Kelvin per second (K/s), e.g. greater than about 200 K/s, e.g. greater than about 300 K/s, e.g. greater than about 400 K/s, e.g. greater than about 1000 K/s (corresponding to $10^3$ K/s), e.g. greater than about 2000 K/s, e.g. greater than about 5000 K/s, e.g. greater than about $10^4$ K/s, e.g. greater than about $10^5$ K/s, e.g. greater than about $10^6$ K/s, e.g. greater than about $10^7$ K/s, e.g. greater than about $10^8$ K/s, e.g. greater than about $10^9$ K/s, e.g. greater than about $10^{10}$ K/s. The heating time may be defined by the irradiation time, in other words, the time in which the structured surface 104 of the semiconductor region 102 is irradiated by the electromagnetic radiation 110 (e.g. forming a temperature gradient pointing to the structured surface 104 of the semiconductor region 102). The irradiation time (e.g. per radiation pulse) may be less than about one microsecond (1 μs), e.g. less than about 1 nanosecond (1 ns), e.g. less than about 100 picoseconds (100 ps), e.g. less than about 10 picoseconds (10 ps).

The temperature difference and the heating depth (in other words, the depth in the semiconductor region up to which the semiconductor region is heated) may define a temperature gradient formed by irradiating the structured surface 104 of the semiconductor region 102. The temperature gradient may point to the structured surface 104 of the semiconductor region 102. The temperature gradient may be defined by the ratio of the temperature difference and the heating depth, e.g. least about 200 Kelvin (K) per heating depth (d), e.g. at least about 400 K/d, e.g. at least about 600 K/d, e.g. at least about 800 K/d, e.g. at least about 1000 K/d, e.g. in the range from about 600 K/d to about 1500 K/d. For example, the temperature gradient may be at least about 200 Kelvin per micrometer (K/μm), e.g. at least about 400 K/μm, e.g. at least about 600 K/μm, e.g. at least about 800 K/μm, e.g. at least about 1000 K/μm, e.g. in the range from about 600 K/μm to about 1500 K/μm.

For activating the dopant 108, the semiconductor region 102 may be at least partially, e.g. at least the surface region 102s (herein also referred to as surface layer 102s) of the semiconductor region 102, heated to a temperature (e.g. a dopant-activation temperature) of at least 70% of a melting temperature of the semiconductor region, e.g. greater than 900° C. (e.g. to provide a mixed phase or a glass phase).

According to various embodiments, a thickness 112 (also referred to as heating depth 112, e.g. melting depth if melted) of a portion of the semiconductor region 102 (e.g. the surface layer 102s) which is heated, e.g. by at least the temperature difference, is greater than about 0.4 μm, e.g. greater than about 0.5 μm, e.g. greater than about 0.6 μm, e.g. greater than about 0.7 μm, e.g. greater than about 0.8 μm, e.g. greater than about 0.9 μm, e.g. greater than about 1 μm, e.g. greater than about 1.5 μm, e.g. greater than about 2 μm. The heating depth 112 may be a spatial averaged thickness. The heating depth 112 may be greater than a thickness of the dopant layer 108l, e.g. greater than an implantation depth (the penetration depth of the ion beam into the semiconductor region 102), which may be defined by an energy of the ions of the ion beam.

The heating depth 112 may define a temperature gradient (e.g. along the depth direction), e.g. by a temperature difference within the heating depth 112.

According to various embodiments, the semiconductor region 102 may include or be formed from a single crystalline semiconductor material (also referred to as single crystalline material of the semiconductor region 102). Alternatively or additionally, the semiconductor region 102 may include or be formed from a polycrystalline semiconductor material (also referred to as polycrystalline material of the semiconductor region 102).

By activating the dopant 108, a doped surface layer 102*s* may be formed within the semiconductor region 102. The doped surface layer 102*s* may include the material of the semiconductor region 102 and the dopant which is activated (in other words, the activated dopant).

Figure 2A:
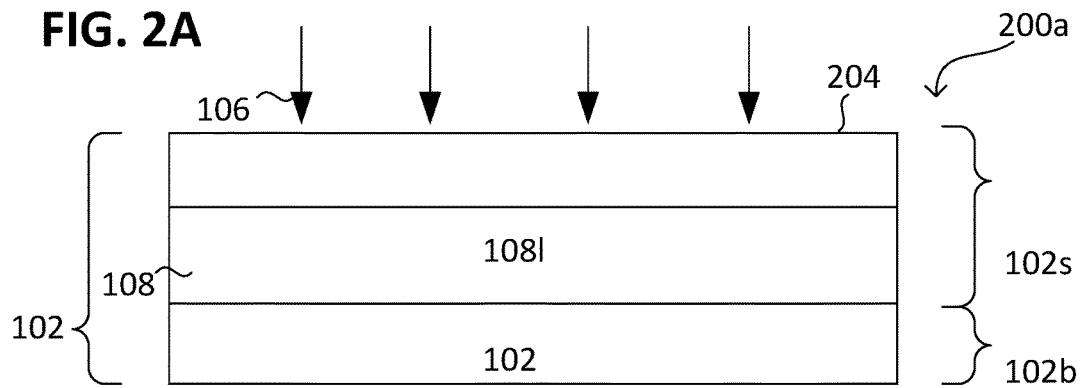
FIG. 2A, FIG. 2B, FIG. 2C and FIG. 2D respectively show a semiconductor device according to various embodiments in a method according to various embodiments in a schematic cross sectional view or side view.
Figure 2B:
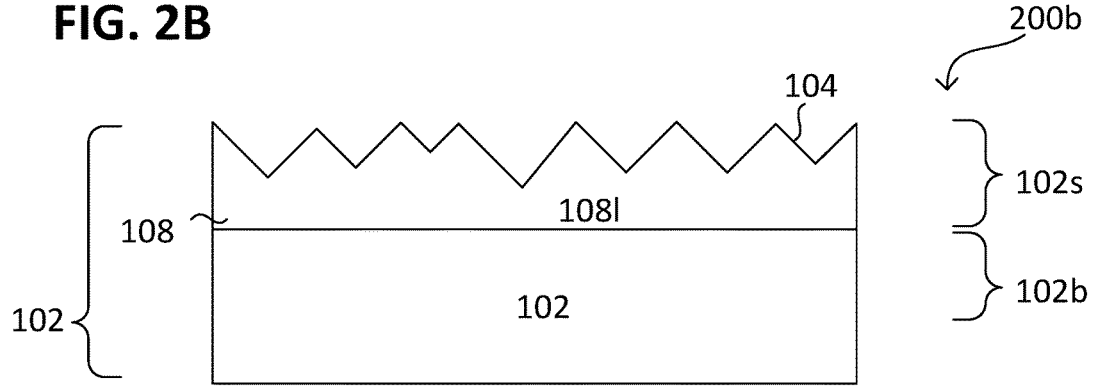
Figure 2C:
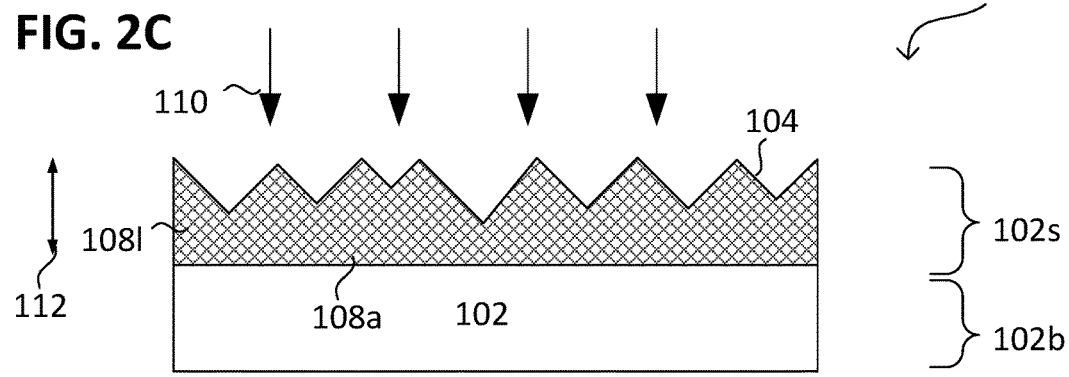
Figure 2D:
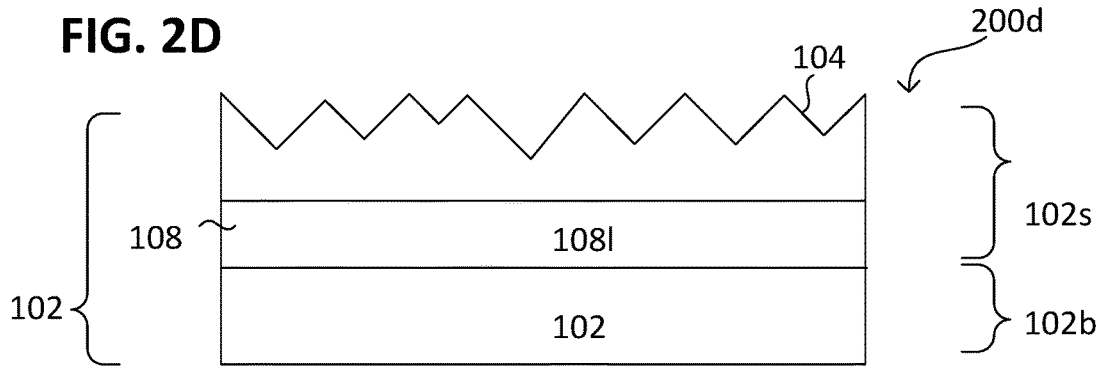

According to various embodiments, the surface of the semiconductor region 102 may be structured before the dopant 108 is disposed in the semiconductor region 102, as illustrated in FIG. 1A and FIG. 1B. Alternatively or additionally, the surface of the semiconductor region 102 may be structured after the dopant 108 is disposed in the semiconductor region 102, as illustrated in FIG. 2A and FIG. 2B. In this case, the dopant 108 may be implanted into the semiconductor region 102, e.g. forming a buried dopant layer 108*l* including the dopant 108. Illustratively, the buried dopant layer 108*l* including the dopant 108 may be disposed in the semiconductor region 102, as illustrated in FIG. 2A and FIG. 2D.

FIG. 2A, FIG. 2B, FIG. 2C and FIG. 2D respectively illustrate a semiconductor device according to various embodiments in a method according to various embodiments in a schematic cross sectional view or side view.

According to various embodiments, the method may include in 200*a* disposing 106 the dopant 108 in the semiconductor region 102. Disposing 106 the dopant 108 in 200*a* may be configured similar to disposing 106 the dopant 108 in 100*b*.

By disposing 106 the dopant 108 in the semiconductor region 102, the dopant layer 108*l* (also referred to as doped surface layer) may be formed including the dopant and material of the semiconductor region 102. The dopant layer 108*l* may be formed in a surface layer 102*s* of the semiconductor region 102, wherein the surface layer 102*s* of the semiconductor region 102 includes an unstructured surface 204 of the semiconductor region 102 (e.g. a planar surface 204). In other words, the dopant layer 108*l* may be formed between the unstructured surface 204 of the semiconductor region 102 and the base region 102*b* of the semiconductor region 102.

According to various embodiments, the method may include in 200*b* structuring the semiconductor region 102 to form a structured surface 104 of the semiconductor region 102 for reducing a reflectance of the semiconductor region 102. Structuring the semiconductor region 102 in 200*b* may be configured similar to structuring the semiconductor region 102 in 100*a*.

Forming the structured surface 104 of the semiconductor region 102 may include processing the unstructured surface 204 of the semiconductor region 102. Structuring the semiconductor region 102 may include structuring the dopant layer 108*l* to form a structured surface 104 of the dopant layer 108*l*.

According to various embodiments, the method may include in 200*c* activating the dopant 108 at least partially by irradiating the structured surface 104 at least partially with electromagnetic radiation 110 to heat the semiconductor region 102 at least partially. In other words, the activated dopant 108*a* may be provided. Activating the dopant 108 in 200*c* may be configured similar to activating the dopant 108 in 100*c*. The semiconductor region 102 may be at least partially heated, that means at least the surface layer 102*s* of the semiconductor region 102 may be heated. The surface layer 102*s* may optionally be segmented. For example, the surface layer 102*s* may include a plurality of segments, which are heated to a temperature greater than a temperature between the segments. Therefore, a mask 1802 may be used exposing the plurality of segments of the surface layer 102*s*.

According to various embodiments, the heating process may include or be formed from at least one of a non-equilibrium heating process and a non-thermal heating process. The non-thermal heating process may include forming the electromagnetic radiation by an electromagnetic radiation source, wherein a wavelength of the electromagnetic radiation is independent from a temperature of the electromagnetic radiation source. For example, the wavelength of the electromagnetic radiation may be defined by at least one of a material of the electromagnetic radiation source (e.g. an optically active material), a resonator of the electromagnetic radiation source and an energy supplied to the electromagnetic radiation source. For example, the electromagnetic radiation source may include or be formed from a non-thermal electromagnetic radiation source.

According to various embodiments, the electromagnetic radiation source may include or be formed from an optical resonator, e.g. in case of a laser source. In this case, the electromagnetic radiation may include or may be laser radiation, polarized radiation, pulsed radiation and/or coherent radiation. Pulsed radiation may include at least one electromagnetic radiation pulse (one or more electromagnetic radiation pulses).

A non-equilibrium heating process may include forming a temperature gradient in the semiconductor region 102. For example, an equilibrium heating process may require a furnace. Illustratively, in a non-equilibrium heating process substantially no thermal equilibrium is reached during the heating. For example, in a non-equilibrium heating process the structured surface 104 of the semiconductor region 102 may absorb a larger amount of electromagnetic radiation than it emits, for example, the structured surface 104 of the semiconductor region 102 may absorb at least two times the electromagnetic radiation it emits, for example, at least five times the electromagnetic radiation it emits, for example, at least ten times the electromagnetic radiation it emits, for example, at least hundred times the electromagnetic radiation it emits. Alternatively or additionally, in a non-equilibrium heating process a thermal energy introduced by the electromagnetic radiation may propagate further (e.g. to a region that lies deeper than the heating depth) after the electromagnetic radiation is switched of or interrupted (e.g. between pulses of the electromagnetic radiation). For example, the non-equilibrium heating process may include or may be achieved by heating substantially only the structured surface 104 of the semiconductor region 102. As used herein, heating a surface may be understood as transferring thermal energy (e.g. via electromagnetic radiation) into the surface and/or through the surface (into a region adjacent to the surface, also referred to as surface region). The thermal energy may be absorbed at least by material forming the surface region 102*s*. For example, heating the surface may include irradiating the surface by electromagnetic radiation, wherein the electromagnetic radiation may be absorbed by the surface and the region adjacent to the surface. In this connection, the "region adjacent to the surface" or "surface region 102s" may refer to a region that reaches to a depth of up to 20 μm, e.g. up to 15 μm, e.g. up to 10 μm, e.g. up to 5 μm, e.g. up to 3 μm, e.g. up to 2 μm.

According to various embodiments, the electromagnetic radiation may include at least one discrete wavelength (one or more discrete wavelengths, e.g. two, three, four, five, more than five, e.g. ten or more than ten discrete wavelengths). Radiation having a discrete wavelength may be understood as radiation having a distinct (e.g. line-shaped) radiation intensity peak at the discrete wavelength. The radiation intensity peak may be broadened defining a range of wavelengths around the discrete wavelength (illustratively, a broadness). The radiation intensity peak may have a width (e.g. a full width half maximum (FWHM)) less than about 25% of the (value of the) discrete wavelength, e.g. less than about 10% of the discrete wavelength, e.g. less than about 5% of the discrete wavelength, e.g. less than about 2.5% of the discrete wavelength, e.g. less than about 1% of the discrete wavelength. For example, a radiation intensity peak having a FWHM of less than about 25% (e.g. 10%, 5%, or 1%) of the peak position and/or less than about 10 nm (e.g. 5 nm, 1 nm, 0.5 nm or 0.1 nm) may be understood as a discrete wavelength. If the electromagnetic radiation includes more than one discrete wavelength (e.g. more than one radiation intensity peak), optionally at least two adjacent discrete wavelengths may partially overlap. For example, two adjacent radiation intensity peaks of the electromagnetic radiation may be understood as discrete wavelengths, if a radiation intensity between the two radiation intensity peaks drops to less than about 50% (e.g. 25%, 10%, 5%, or 1%) of the maximum radiation intensity of that radiation intensity peak of the two adjacent radiation intensity peaks that has the lower maximum radiation intensity. Alternatively or additionally, two adjacent radiation intensity peaks of the electromagnetic radiation may be understood as discrete wavelengths, if a distance between the two adjacent radiation intensity peaks (e.g. between their peak positions) is larger than a width (e.g. a FWHM) of that radiation intensity peak of the two adjacent radiation intensity peaks that has the larger width, e.g. more than 200% of the width, e.g. more than 500% of the width.

According to various embodiments, the electromagnetic radiation used for irradiating the structured surface 104 of the semiconductor region 102 may include or may be electromagnetic radiation (e.g. having at least one discrete wavelength) within an electromagnetic radiation range (also referred to as absorbing range) for which the reflectance of the semiconductor region 102 is reduced by structuring the semiconductor region 102 by a value of at least about 0.1, e.g. at least about 0.2, e.g. at least about 0.3, e.g. at least about 0.4, e.g. at least about 0.5. In other words, structuring may define the absorbing range (e.g. defining at least one of the electromagnetic radiation, a wavelength range, an energy range and a frequency range) for which structuring the semiconductor region 102 reduces the reflectance of the semiconductor region 102 by at least the value.

According to various embodiments, an energy of the electromagnetic radiation may be absorbed mainly by a surface layer (in other words, within a heating depth), e.g. more than about 50% (e.g. more than about 75%, e.g. more than about 80%, e.g. more than about 90%) of the electromagnetic radiation may be absorbed by the surface layer.

According to various embodiments, irradiating the structured surface 104 of the semiconductor region 102 may include or achieve heating at least one of a plurality of protrusions and a plurality of recesses of the structured surface 104 (in other words, a plurality of protrusions and/or a plurality of recesses).

As illustrated in FIG. 2D, after forming the structured surface 104 of the semiconductor region 102, the dopant layer 108l may be covered by (e.g. undoped) material of the semiconductor region 102 (e.g. at least partially). For example, the dopant layer 108l may be at least partially buried after forming the structured surface 104 of the semiconductor region 102. Alternatively, as illustrated in FIG. 2B, forming the structured surface 104 of the semiconductor region 102 may remove more material, e.g. thereby at least partially exposing the buried dopant layer 108l. For example, the buried dopant layer 108l may be at least partially (partially or completely) exposed by the structuring process (forming the structured surface 104 of the semiconductor region 102).

Figure 3B:
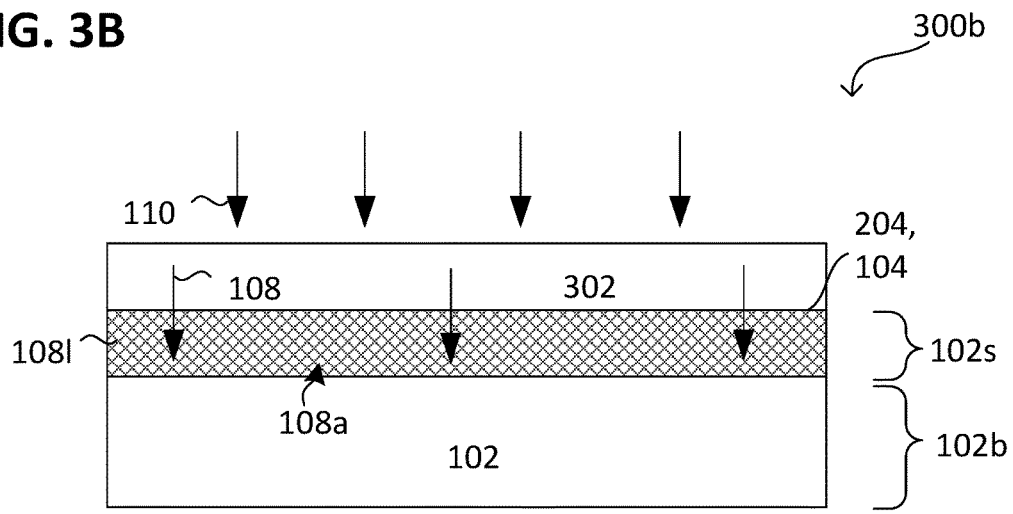

FIG. 3A and FIG. 3B respectively illustrate a semiconductor device according to various embodiments in a method according to various embodiments in a schematic cross sectional view or side view.

According to various embodiments, disposing the dopant over the semiconductor region 102 may include in 300a forming a dopant source layer 302 over the semiconductor region 102, e.g. over the unstructured surface 204 of the semiconductor region 102 or over the structured surface 104 of the semiconductor region 102. The dopant source layer 302 may be formed using at least one of: physical vapor deposition, chemical vapor deposition, or fluid deposition (e.g. spin coating). Alternatively or additionally, the dopant source layer 302 may include or be formed from a doped oxide layer.

The dopant source layer 302 may include the dopant 108, e.g. at least one of disposed in or as part of a host material of the dopant source layer 102, e.g. chemically bonded in the host material. The dopant source layer 302 may be formed by depositing the host material over the semiconductor region 102, e.g. over the unstructured surface 204 of the semiconductor region 102 or over the structured surface 104 of the semiconductor region 102.

According to various embodiments, disposing the dopant in the semiconductor region 102 may include in 300b transferring the dopant 108 into the semiconductor region 102, e.g. from the dopant source layer 302. The dopant source layer 302, e.g. the host material, may be configured to provide the dopant 108, e.g. by heating the dopant source layer 302. The dopant source layer 302 may be heated by at least one of: irradiation with electromagnetic radiation 110 or tempering. The dopant 108 provided by the dopant source layer 302 may migrate (e.g. by chemical reaction and/or diffusion) into the semiconductor region 102, e.g. forming the dopant layer 108l (see FIG. 3B and FIG. 3C).

According to various embodiments, by irradiating the dopant source layer 102 with electromagnetic radiation 110, the dopant may be activated simultaneously. In other words, during transferring the dopant 108 into the semiconductor region 102, the dopant 108 may be activated at least partially.

Figure 3C:
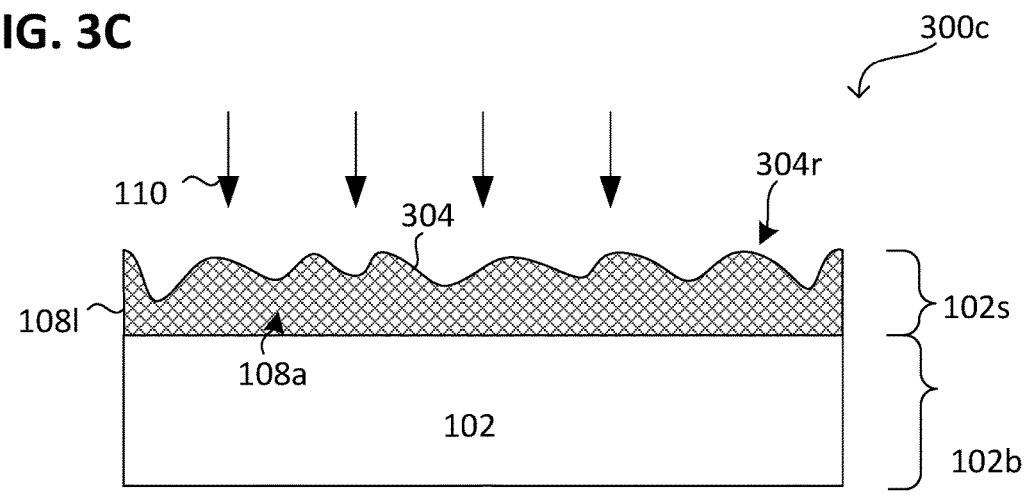

FIG. 3C illustrates a semiconductor device according to various embodiments in a method according to various embodiments in a schematic cross sectional view or side view.

According to various embodiments, the method may include in 300c flattening the structured surface 104 of the semiconductor region 102 during heating the semiconductor region 102. For example, during the activation of the dopant 108 the structured surface 104 may be flattened. Flattening the structured surface 104 may provide a structured surface 304 (also referred to as second structured surface 304, illustratively, a transformed surface 304) including rounded protrusions 304r (or respective rounded recesses), illustratively an irregular surface 304 with nodular protrusions 304r. In other words, by flattening the structured surface 104 (also referred to as first structured surface 104) the roughness of the semiconductor region 102 may be reduced. The second structured surface 304 may include a nodular structure.

A rounded protrusion 304r (or respective rounded recesses) may illustratively be understood as being free from at least one of an edge or a corner. The rounded protrusion 304r (or respective rounded recesses) may include a curvature having a radius of curvature greater than about 10% (e.g. greater than about 25%, e.g. greater than about 50%, e.g. greater than about 75%) of at least one of a height of the rounded protrusion 304r, a width of the rounded protrusion 304r, a roughness (e.g. root mean squared) of the structured surface 304 of the semiconductor region 102 and a respective maximum height difference of the structured surface 304 of the semiconductor region 102.

For flattening, the semiconductor region 102, e.g. the surface region 102s of the semiconductor region 102, may be melted at least partially, in other words partially (e.g. sectionally) or completely. For example, during activating the dopant, the surface region 102s of the semiconductor region 102 may be partially in a melted phase and partially in a solid phase (mixed phase). Alternatively or additionally, the semiconductor region 102 may be at least partially in a glass phase (illustratively, between the solid phase and the melted phase). The glass phase may have a viscosity greater than the melted phase of the semiconductor region 102.

A transparence (transmission coefficient) of the semiconductor region 102 (e.g. its material) may be greater in the glass or melted phase than in the solid phase. In other words, melting the semiconductor region 102 at least partially may provide to increase the penetration depth of electromagnetic radiation.

For flattening, the semiconductor region 102 may be at least partially, e.g. at least the surface region 102s of the semiconductor region 102, heated to a temperature of equal to or greater than the melting temperature of the semiconductor region 102, e.g. greater than 1200° C. (for example, to provide a transition to at least one of the glass phase or the melted phase). The temperature may be provided for a time greater than the heating time.

According to various embodiments, heating the semiconductor region 102 may define a temperature peak (e.g. the maximum temperature at the end of the heating time) greater than 70% of the melting temperature of the semiconductor region 102, e.g. greater than 900° C., e.g. greater than the melting temperature of the semiconductor region 102.

According to various embodiments, increasing the absorption of electromagnetic radiation 110 (e.g. including laser light), in other words, increasing the absorption coefficient, may result in an increased energy transfer to the semiconductor region 102 (from the electromagnetic radiation) via the structured surface 104 of the semiconductor region 102. Increasing the absorption of the electromagnetic radiation (or the energy transfer respectively) may result in flattening the first structured surface 104 of the semiconductor region 102, e.g. due to a higher temperature peak during heating the first structured surface 104 of the semiconductor region 102. Flattening of the first structured surface 104 of the semiconductor region 102 may provide indirect evidence of an increased absorption of laser light (or the energy transfer respectively). Flattening of the first structured surface 104 of the semiconductor region 102 may occur if the melting depth is larger than a roughness of the structured surface of the semiconductor region. The melting depth may describe an extension of the semiconductor region 102, e.g. the surface region 102s of the semiconductor region 102, having a temperature equal to, or greater than the melting temperature of the semiconductor region 102.

According to various embodiments, a semiconductor device may include the semiconductor region 102 including the second structured surface 304 and an activated dopant 108a. The activated dopant 108a may be disposed adjacent to the structured surface 304 of the semiconductor region 102. For example, the activated dopant 108a may be disposed in the surface region 102s of the semiconductor region 102. The second structured surface 304 may include or be formed from a plurality of rounded protrusions.

Figure 4A:
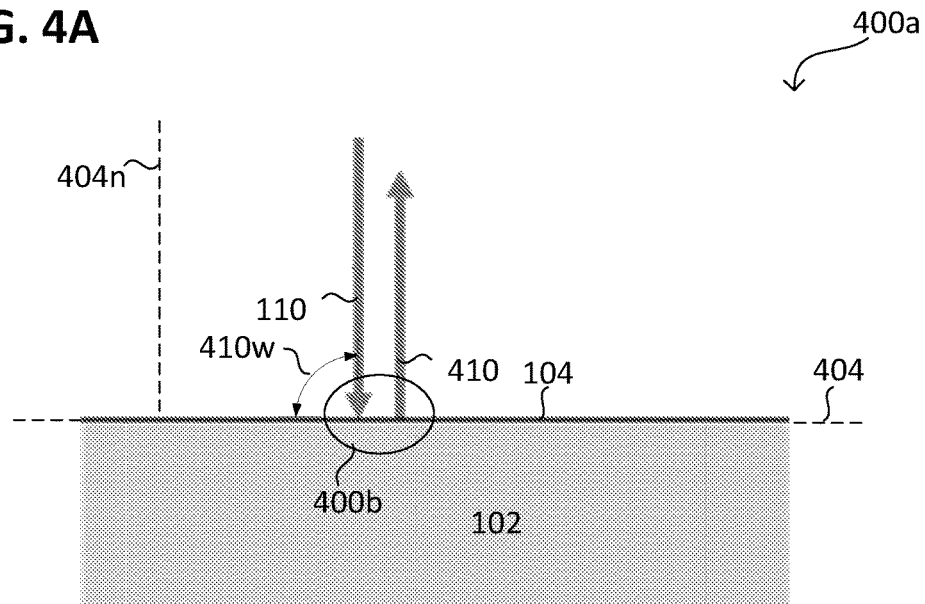
FIG. 4A and FIG. 4B respectively show a semiconductor device according to various embodiments in a method according to various embodiments in a schematic cross sectional view or side view.
Figure 4B:
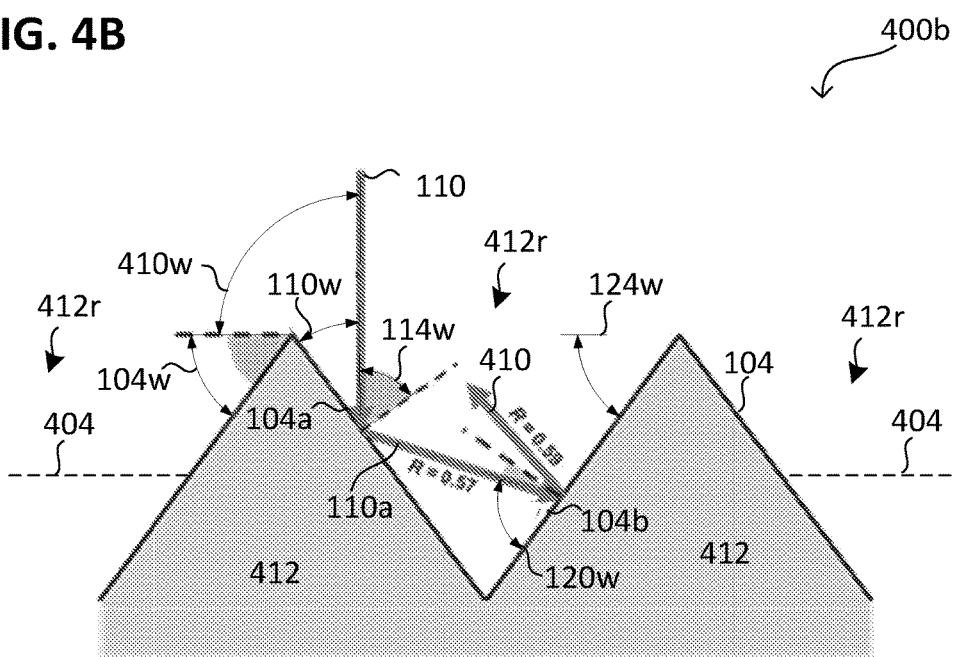

FIG. 4A and FIG. 4B respectively illustrate a semiconductor device according to various embodiments in a method according to various embodiments in a schematic cross sectional view or side view.

According to various embodiments, the method may include in 400a irradiating the structured surface 104 of the semiconductor region 102 by electromagnetic radiation 110 incident on the semiconductor region 102 (incident electromagnetic radiation 110).

The reflection coefficient may define a fraction of the reflected electromagnetic radiation 410 to the incident electromagnetic radiation 110. The electromagnetic radiation 110 (illustratively, incoming electromagnetic radiation 110) may be provided by irradiating the semiconductor region 102. The electromagnetic radiation 110 may be provided by an electromagnetic radiation source, e.g. a laser source.

According to various embodiments, the reflection coefficient may be dependent on an incident angle 410w (also referred to as main incident angle 410w) between the incident electromagnetic radiation 110 and a macroscopic surface plane 404 (illustratively, mean surface plane 404) of the structured surface 104. The macroscopic surface plane 404 may be disposed and aligned such, that it includes a maximum number of points of (or a respective maximum intersection with) the structured surface 104 of the semiconductor region 102.

According to various embodiments, the incident electromagnetic radiation 110 may be in a direction substantially perpendicular to the macroscopic surface plane 404. In other words, the incident angle 110w may be in the range from about 80° to about 100°, e.g. about 90°. In other words, the incident electromagnetic radiation 110 may be substantially parallel to a macroscopic surface normal 404n of the structured surface 104. The macroscopic surface normal 404n of the structured surface 104 may be perpendicular to the macroscopic surface plane 404 of the structured surface 104.

If the incident electromagnetic radiation 110 is in a direction substantially perpendicular to the macroscopic surface plane 404, the reflection coefficient may be minimized. The reflection coefficient may be dependent on the incident angle, the wavelength of the electromagnetic radiation and the material of the semiconductor region 102. Alternatively or additionally, the reflection coefficient may be dependent on the polarization of the electromagnetic radiation 110.

The reflection coefficient provided by the structured surface 104 of the semiconductor region 102 according to various embodiments, may also be referred to as total effective reflection coefficient. The reflection coefficient provided by a planar surface of the semiconductor region 102 may be also referred to as reference reflection coefficient.

The total effective reflection coefficient may be smaller than the reference reflection coefficient, e.g. smaller than about 0.59 (in other words, less than 59% of the incident electromagnetic radiation 110 may be reflected), e.g. smaller than about 0.55, e.g. smaller than about 0.5, e.g. smaller than about 0.45, e.g. smaller than about 0.4, e.g. smaller than about 0.35, e.g. in the range from about 0.2 to about 0.5.

According to various embodiments, the structured surface 104 may include or be formed from a plurality of protrusions 412, e.g. tapered protrusions 412 as illustrated in FIG. 4B. For example, each protrusion of the plurality of protrusions 412 may be faceted, e.g. including at least two facets 104a, 104b, e.g. three or more, e.g. four or more than four facets 104a, 104b. Between the plurality of protrusions 412 a plurality of recesses may be formed, which are shaped in accordance with the plurality of protrusions 412.

The structured surface 104 of the semiconductor region 102 may include at least one portion 104a, 104b (e.g. including or formed from a sidewall 104a, 104b) which is inclined with respect to the macroscopic surface normal 404n of the structured surface 104. The sidewall 104a, 104b may be a sidewall of a protrusion of the plurality of protrusions 412 or respectively of the recess of the plurality of recesses adjacent to the protrusion. For example, each protrusion of the plurality of protrusions 412 may include at least one portion 104a, 104b, which is inclined with respect to the macroscopic surface normal 404n of the structured surface 104.

According to various embodiments, the reflection coefficient may be dependent on an incident angle 110w (also referred to as first effective incident angle 110w) between the incident electromagnetic radiation 110 and the structured surface 104 of the semiconductor region 102, see FIG. 4B, e.g. a first portion 104a of the structured surface 104.

As illustrated in a detailed view 400b, the structured surface 104 of the semiconductor region 102 may provide in 400b an effective incident angle 110w less than the main incident angle 410w, e.g. less than about 80°, e.g. less than about 70°, e.g. less than about 60°, e.g. less than about 50°, e.g. less than about 40°, e.g. about 35.3°.

The structured surface 104 of the semiconductor region 102 may be configured to provide multiple reflections of the incident electromagnetic radiation 110 as described in the following. The multiple reflections may include at least two reflections (first reflection and second reflection).

A first portion 110a of the incident electromagnetic radiation 110 (also referred to as first reflected electromagnetic radiation 110a) may be reflected (first reflection) at the first portion 104a of the structured surface 104 (e.g. a first facet). A second portion of the incident electromagnetic radiation 110 (e.g. the leftover incident electromagnetic radiation 110) may be directed into the semiconductor region 102 to be absorbed by the semiconductor region 102 (for transferring its energy to the semiconductor region 102).

The first effective incident angle 110w may be smaller than the main incident angle 410w. Therefore, the first reflected electromagnetic radiation 110a may be in a direction (radiates) towards a second portion 104b of the structured surface 104 (e.g. a second facet). A first portion 410 of the first reflected electromagnetic radiation 110a (also referred to as second reflected electromagnetic radiation 410) may be reflected (second reflection) at the second portion 104b of the structured surface 104. A second portion of the first reflected electromagnetic radiation 110a (e.g. the leftover first reflected electromagnetic radiation 110a) may be directed into the semiconductor region 102 to be absorbed by the semiconductor region 102 (for transferring its energy to the semiconductor region 102). A reflection coefficient for the second reflection (also referred to as second reflection coefficient) may be dependent on an incident angle 120w (also referred to as second effective incident angle 110w) between the second reflected electromagnetic radiation 410 and the second portion 104b of structured surface 104.

The second reflected electromagnetic radiation 410 may be directed away from the semiconductor region 102 as illustrated in FIG. 4B. Alternatively, the structured surface 104 of the semiconductor region 102 may be configured such that second reflected electromagnetic radiation 410 may be directed to another portion of the structured surface 104. In other words, the multiple reflections may include more than two reflections.

According to various embodiments, a first structural angle 104w between the first portion 104a of the structured surface 104 (also referred to as first surface portion 104a) and the macroscopic surface plane 404 may define the first effective angle 110w. According to various embodiments, a second structural angle 124w between the second portion 104b of the structured surface 104 (also referred to as second surface portion 104b) and the macroscopic surface plane 404 may define the second effective angle 120w. According to various embodiments, the first structural angle 104w and the second structural angle 124w may differ less than about 30° from each other, e.g. less than about 20°, e.g. less than about 10°, e.g. less than about 5°, e.g. about 0° (in other words, they may be equal)

According to various embodiments, the correlation between a reflection coefficient and an incident angle related thereto may depend on the material of the semiconductor region 102 and a wavelength of the electromagnetic radiation. For example, the reflection coefficient may decrease with decreasing effective incident angle.

A reflection coefficient for the first reflection (first effective reflection coefficient) may be substantially the reference reflection coefficient of the semiconductor region 102 (e.g. in a range of 10% around the reference reflection coefficient), e.g. may be 0.57. A reflection coefficient for the second reflection (second effective reflection coefficient) may be substantially the reference reflection coefficient of the semiconductor region 102 (e.g. in a range of 10% around the reference reflection coefficient), e.g. may be 0.59.

The total effective reflection coefficient may be defined by a superposition of all effective reflection coefficients of the multiple reflection (in other words, each effective reflection coefficient related the reflections of the multiple reflection). If the multiple reflection includes two reflections, as illustrated in FIG. 4B, the total effective reflection coefficient may be defined by a superposition of the first effective reflection coefficient and the second effective reflection coefficient. For example, the total effective reflection coefficient may be smaller than the reference reflection coefficient, e.g. smaller than about 90% of the reference reflection coefficient, e.g. smaller than about 80% of the reference reflection coefficient, e.g. smaller than about 70% of the reference reflection coefficient, e.g. smaller than about 60% of the reference reflection coefficient, e.g. smaller than about 50% of the reference reflection coefficient, e.g. smaller than about 40% of the reference reflection coefficient, e.g. smaller than about 30% of the reference reflection coefficient.

Illustratively, the electromagnetic radiation reflected at a portion of the structured surface 104 may be directed to at least one further portion of the structured surface 104 such that at least one further portion of the electromagnetic radiation may be absorbed by the at least one further portion of the structured surface 104. For example, the electromagnetic radiation may be reflected at least one of in or outside the semiconductor region 102. For example, at least one portion of the electromagnetic radiation may be transmitted into a protrusion of the structured surface 104 and reflected by at least one further portion of the protrusion.

In contrast thereto, antireflective coatings are based on constructive interference (in direction towards the structured surface 104 of the semiconductor region 102) and destructive interference (in direction away from the structured surface 104 of the semiconductor region 102, in other words, in direction of the reflected electromagnetic radiation 410). Optionally, an antireflective coating (also referred to as antireflective layer) may be formed over the structured surface 104 of the semiconductor region 102 (see FIG. 19B).

FIG. 5A illustrates a reflection characteristic of a semiconductor device according to various embodiments in a method according to various embodiments in a schematic diagram 500*a*. The schematic diagram 500*a* illustrates the reflection characteristics 502, 504, 506 between the reflectance coefficient 501 and the energy 503 (in electron Volts—eV) of the electromagnetic radiation (e.g. for a main incident angle substantially equal to 90°).

The schematic diagram 500*a* illustrates the reflection characteristic 502 and the reflection characteristic 504 for the reference reflectance coefficient, in other words, the correlation between the reference reflectance coefficient and the energy 503 of the electromagnetic radiation. The reflection characteristic 502 represents the reference reflectance coefficient 501 according to a theoretical expectation and the reflection characteristic 504 represents the reference reflectance coefficient 501 according to a measurement, e.g. at a planar surface of the semiconductor region 102.

The schematic diagram 500*a* illustrates the reflection characteristic 506 for the total effective reflectance coefficient. The reflection characteristic 506 represents the reflectance coefficient 501 for a structured surface 104 of the semiconductor region 102 according to various embodiments, wherein a detailed view is provided in callout portion 500*b*.

According to various embodiments, the electromagnetic radiation may include or be formed from radiation in the range from ultraviolet radiation to infrared radiation. For example, the electromagnetic radiation may include radiation in the range from about 0.1 eV (corresponds to a wavelength of about 12400 nm, e.g. in mid infrared radiation) to about 12.4 eV (corresponds to a wavelength of about 100 nm, e.g. in vacuum ultraviolet radiation), e.g. in the range from about 1 eV (corresponds to a wavelength of about 1240 nm, e.g. in near infrared radiation) to about 7 eV (corresponds to a wavelength of about 180 nm, e.g. in vacuum ultraviolet radiation), e.g. in the range from about 2 eV (corresponds to a wavelength of about 620 nm, e.g. in red visible radiation) to about 6 eV (corresponds to a wavelength of about 205 nm, e.g. in deep ultraviolet radiation), e.g. in the range from about 3 eV (corresponds to a wavelength of about 410 nm, e.g. in violet visible radiation) to about 5 eV (corresponds to a wavelength of about 250 nm, e.g. in deep ultraviolet radiation), e.g. about 4 eV (corresponds to a wavelength of about 308 nm, e.g. in mid ultraviolet radiation). In accordance with various embodiments, the wavelength of the radiation may be in a wavelength range for which reflectance of the semiconductor region 102 has been reduced by structuring the semiconductor region 102. This wavelength range may also be referred to herein as "absorbing range".

According to various embodiments, a reflection characteristic 506 (e.g. a total reflectance coefficient 501) of the structured surface 104 of the semiconductor region 102 may be smaller than about 0.5, e.g. smaller than about 0.45, e.g. smaller than about 0.4, e.g. for electromagnetic radiation in the range (e.g. the absorbing range) from about 3 eV (corresponds to about 415 nm) to about 7 nm, e.g. in the range from about 3.5 nm (corresponds to about 350 nm) to about 5 nm (corresponds to about 250 nm). The electromagnetic radiation may be incident along a direction of a macroscopic surface normal of the structured surface 104. The macroscopic surface normal of the structured surface 104 may be perpendicular to the macroscopic surface plane 404 of the structured surface 104 (see for example, FIG. 4A and FIG. 4B).

FIG. 5B illustrates a reflection characteristic of a semiconductor device according to various embodiments in a method according to various embodiments in a schematic diagram 500*b*. The schematic diagram 500*b* illustrates the reflection characteristic 512, 506 over the wavelength 505 (in nanometer—nm) of the electromagnetic radiation (e.g. for a main incident angle substantially equal to 90°).

The schematic diagram 500*a* illustrates the reflection characteristic 512 for the reference reflectance coefficient and the reflection characteristic 506 for the total effective reflectance coefficient (in other words, for a structured surface 104 of the semiconductor region 102 according to various embodiments).

According to various embodiments, the electromagnetic radiation may include or be formed from radiation having a wavelength in the absorbing range, e.g. in the range from about 250 nm (corresponds to about 5 eV) to about 350 nm (corresponds to about 3.5 eV), e.g. in the range from about 300 nm (corresponds to about 4.1 eV) to about 320 nm (corresponds to about 3.88 eV), or e.g. in the range from about 500 nm (corresponds to about 2.5 eV) to about 600 nm (corresponds to about 2 eV), e.g. including or formed from green light, e.g. green laser light.

A larger wavelength may increase a penetration depth of the electromagnetic radiation, which may increase the heating depth. Alternatively or additionally, a larger wavelength may provide to increase the transferred energy, since the energy is distributed to a larger heating depth.

Figure 6A:
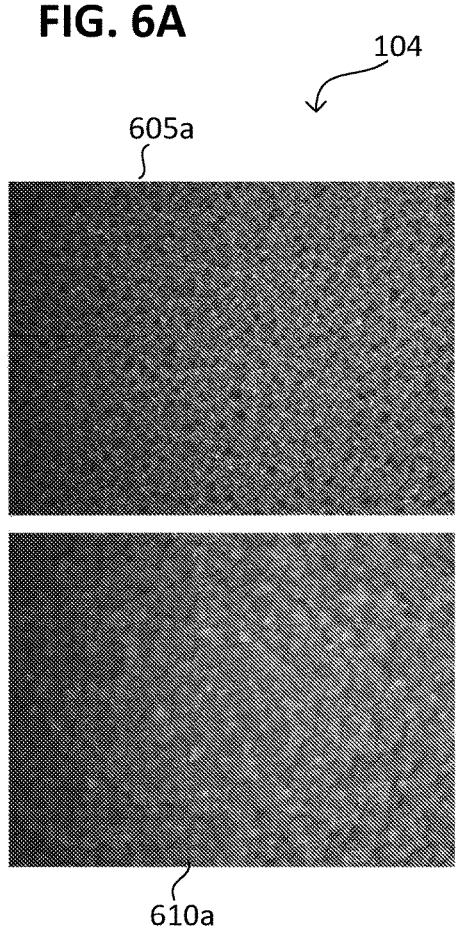
FIG. 6A and FIG. 6B respectively show a structured surface according to various embodiments in a method according to various embodiments in a schematic top view.
Figure 6B:
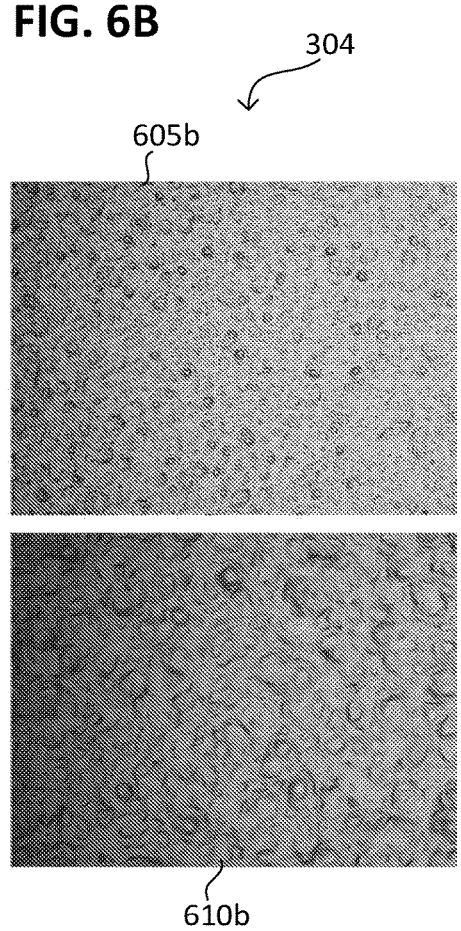

FIG. 6A and FIG. 6B respectively illustrate a structured surface of the semiconductor region 102 according to various embodiments in a method according to various embodiments in a schematic top view. FIG. 6A illustrate the first structured surface 104 (in other words, before activating the dopant) and FIG. 6B illustrate the second structured surface 304 (in other words, after activating the dopant).

The first structured surface 104 of the semiconductor region 102 is illustrated in view 605*a* and in view 610*a* in a 2× magnification of view 605*a* before activating the dopant, e.g. before irradiation with electromagnetic radiation. Before activating the dopant, sharp contours of the structured surface 104 are visible.

The second structured surface 304 of the semiconductor region 102 is illustrated in view 605*b* in and in view 610*b* in a 2× magnification of view 605*b* after activating the dopant, e.g. after irradiation with electromagnetic radiation. After activating the dopant, rounded contours of the second structured surface 304 are visible. According to various embodiments, the sharp contours may be rounded due to a partially melting of the structured surface 104 of the semiconductor region 102, e.g. resulting in rounded protrusions.

FIG. 7 illustrates a structured surface 104 of the semiconductor region 102 according to various embodiments in a method according to various embodiments in a schematic top view.

The structured surface of the semiconductor region 102 is illustrated in view 705, in view 710 in a 2× magnification of view 705 and in 720 in a 8× magnification of view 705 before 104 and after 304 activating the dopant (e.g. by electromagnetic irradiation). Illustratively, FIG. 7 illustrates a direct comparison before 104 and after 304 activating the dopant, e.g. at the interface between the (as-structured) first structured surface 104 of the semiconductor region 102 and the (irradiated) second structured surface 304 of the semiconductor region 102.

As visible, the reflectivity of the first structured surface 104 of the semiconductor region 102 is lower than the reflectivity of the second structured surface 304 of the semiconductor region 102. Illustratively, the as-structured structured surface 104 appears darker than the irradiated structured surface 304.

Figure 8:
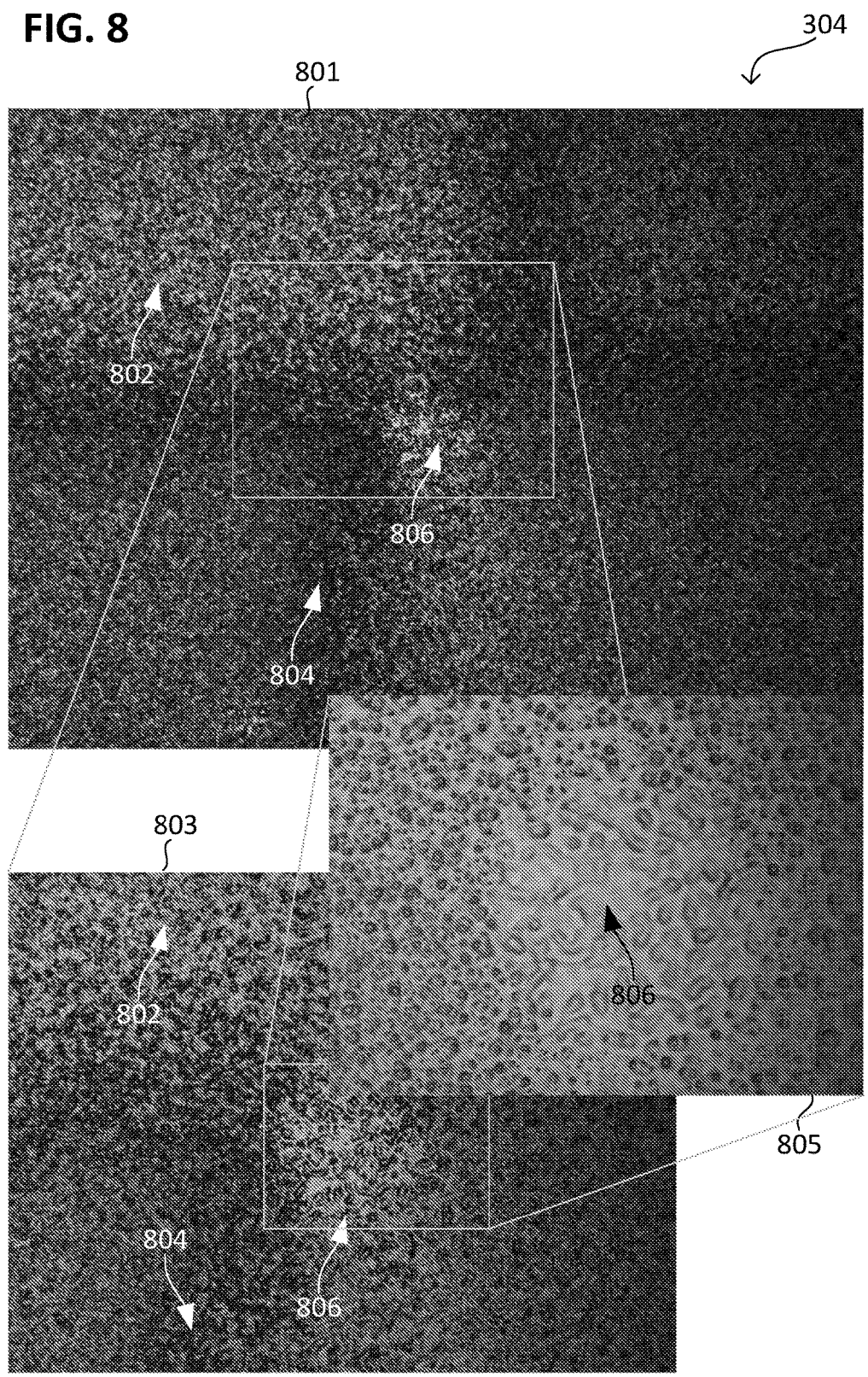
FIG. 8 shows a structured surface according to various embodiments in a method according to various embodiments in a schematic top view.

FIG. 8 illustrates the second structured surface 304 of the semiconductor region 102 according to various embodiments in a method according to various embodiments in a schematic top view.

According to various embodiments, the form and shape of structured surface 304 of the semiconductor region 102 may depend on an energy density of the electromagnetic radiation. The energy density may describe the energy per area applied to the structured surface 104 of the semiconductor region 102. The electromagnetic radiation may be configured to provide the energy density at the structured surface 104 of the semiconductor region 102. For example, the energy density may be configured by at least one of the following: collimating the electromagnetic radiation, focusing the electromagnetic radiation, multiple irradiation with electromagnetic radiation (e.g. by more than one pulse).

According to various embodiments, the energy density provided at the structured surface 104 of the semiconductor region 102 may be greater than a critical energy density at which the semiconductor region 102 (or its material) may be changed at least one of physically or chemically. The critical energy density may be defined by at least one of the semiconductor region 102 or the dopant.

According to various embodiments, the energy density provided at the structured surface 104 of the semiconductor region 102 may be in the range from about 2 Joule/square centimeter ($J/cm^2$) to about 50 $J/cm^2$, e.g. in the range from about 3 $J/cm^2$ to about 30 $J/cm^2$, e.g. in the range from about 3.5 $J/cm^2$ to about 20 $J/cm^2$.

The second structured surface 304 of the semiconductor region 102 is illustrated in view 801, in 803 in a 2× magnification of view 801 and in 805 in a 5× magnification of view 801 for a irradiation of the structured surface 104 with a first energy density 802, a second energy density 804 and a third energy density 806.

The first energy density 802 may be greater than about 0.5 $J/cm^2$, e.g. greater than about 1 $J/cm^2$, e.g. greater than about 2 $J/cm^2$, and/or in the range from about 0.5 $J/cm^2$ to about 10 $J/cm^2$, e.g. in the range from about 1 $J/cm^2$ to about 8 $J/cm^2$, e.g. in the range from about 3.5 $J/cm^2$ to about 4 $J/cm^2$, e.g. about 3.8 $J/cm^2$. For example, the first energy density 802 may be provided by one pulse of the electromagnetic radiation (e.g. laser light) having the first energy density 802. The one pulse of the electromagnetic radiation may define a first irradiation time.

The second energy density 804 may be greater than (e.g. about more than or equal to double) the first energy density 802, e.g. greater than about 1 $J/cm^2$, e.g. greater than about 2 $J/cm^2$, e.g. greater than about 4 $J/cm^2$, and/or in the range from about 2 $J/cm^2$ to about 20 $J/cm^2$, e.g. in the range from about 4 $J/cm^2$ to about 15 $J/cm^2$, e.g. in the range from about 7 $J/cm^2$ to about 8 $J/cm^2$, e.g. about 7.6 $J/cm^2$. For example, the second energy density 804 may be provided by two pulses of the electromagnetic radiation (e.g. two laser pulses), each having at least one of: the first energy density 802, or the first irradiation time. Alternatively, the second energy density 804 may be provided by one pulse of the electromagnetic radiation having twice the first energy density 802 and the first irradiation time or having the first energy density 802 and twice the first irradiation time.

The third energy density 806 may be greater than (e.g. about more than or equal to double) the first energy density 802 and/or the second energy density 804, e.g. greater than about 2 $J/cm^2$, e.g. greater than about 4 $J/cm^2$, e.g. greater than about 8 $J/cm^2$, and/or in the range from about 4 $J/cm^2$ to about 50 $J/cm^2$, e.g. in the range from about 8 $J/cm^2$ to about 25 $J/cm^2$, e.g. in the range from about 10 $J/cm^2$ to about 20 $J/cm^2$, e.g. in the range from about 14 $J/cm^2$ to about 16 $J/cm^2$, e.g. about 15.2 $J/cm^2$. For example, the third energy density 806 may be provided by four pulses of the electromagnetic radiation (e.g. four laser pulses), each having the first energy density 802. Alternatively, the third energy density 806 may be provided by one pulse of the electromagnetic radiation having four times the first energy density 802 and the first irradiation time or having the first energy density 802 and four times the first irradiation time.

According to various embodiments, other tuples of irradiation time and energy density per pulse may be used to provide the designated energy density, e.g. including a plurality of pulses.

According to various embodiments, activating the dopant may include at least partially recrystallizing the semiconductor region 102, e.g. the structured surface 104 of the semiconductor region 102. For example, if the semiconductor region 102 includes or is formed from a polycrystalline material, the polycrystalline material may recrystallize partially, e.g. a size of the crystals of the polycrystalline material may increase during activating the dopant. Alternatively or additionally, if the semiconductor region 102 includes defects (e.g. from an ion implantation), the defects may be reduced by recrystallization, e.g. in their size or in their amount.

According to various embodiments, during the activating of the dopant the semiconductor region 102, e.g. the structured surface 104 of the semiconductor region 102, is at least partially heated to a temperature less than a melting temperature of the semiconductor region 102 (e.g. of a material of the structured surface 104), e.g. less than a recrystallization temperature of the semiconductor region 102 (e.g. of a material of the structured surface 104), e.g. by using the first energy density 802. The material of the structured surface 104 may be equal to the material of the semiconductor region 102.

According to various embodiments, during the activating of the dopant the semiconductor region 102, e.g. the structured surface 104 of the semiconductor region 102, is at least partially heated to a temperature less than a melting temperature of the semiconductor region 102 (e.g. of a material of the structured surface 104), e.g. greater than a recrystallization temperature of the semiconductor region 102 (e.g. of a material of the structured surface 104), e.g. of more than about 70% of a melting temperature of the semiconductor region, e.g. greater than 900° C. (e.g. by using the second energy density 804).

According to various embodiments, during the activating of the dopant the semiconductor region 102, e.g. the structured surface 104 of the semiconductor region 102, may be at least partially heated to a temperature greater than a melting temperature of the semiconductor region 102 (e.g. of a material of the structured surface 104), e.g. by using the third energy density 806.

Figure 9A:
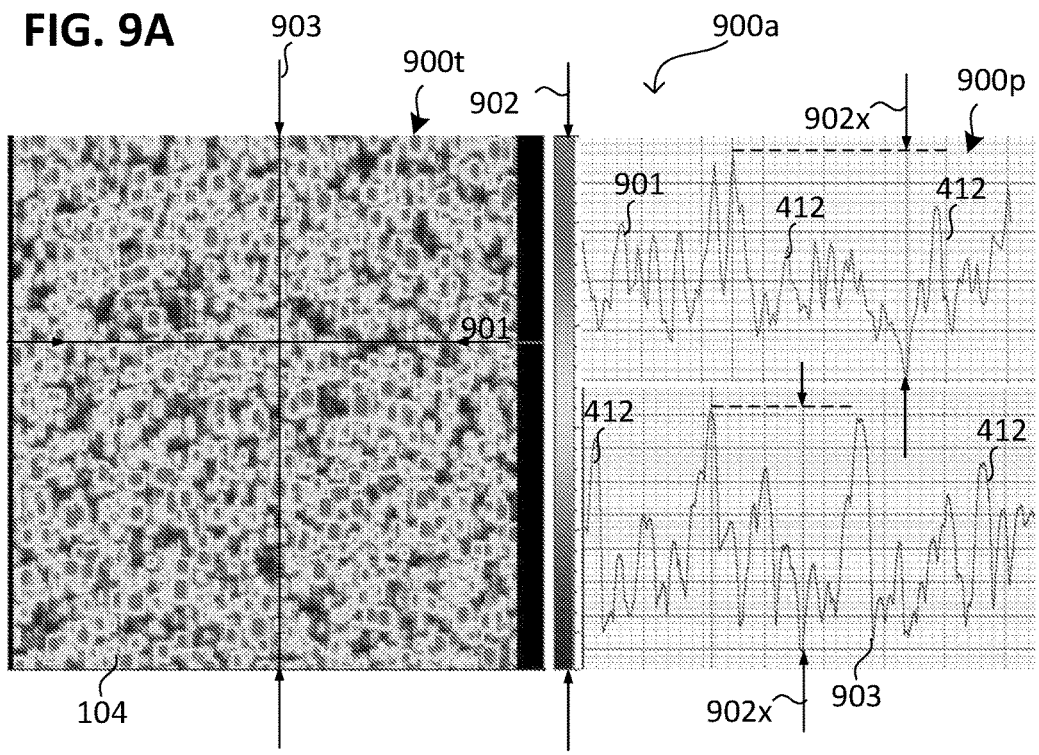
FIG. 9A and FIG. 9B respectively show a structured surface according to various embodiments in a method according to various embodiments in a schematic analytic view.
Figure 9B:
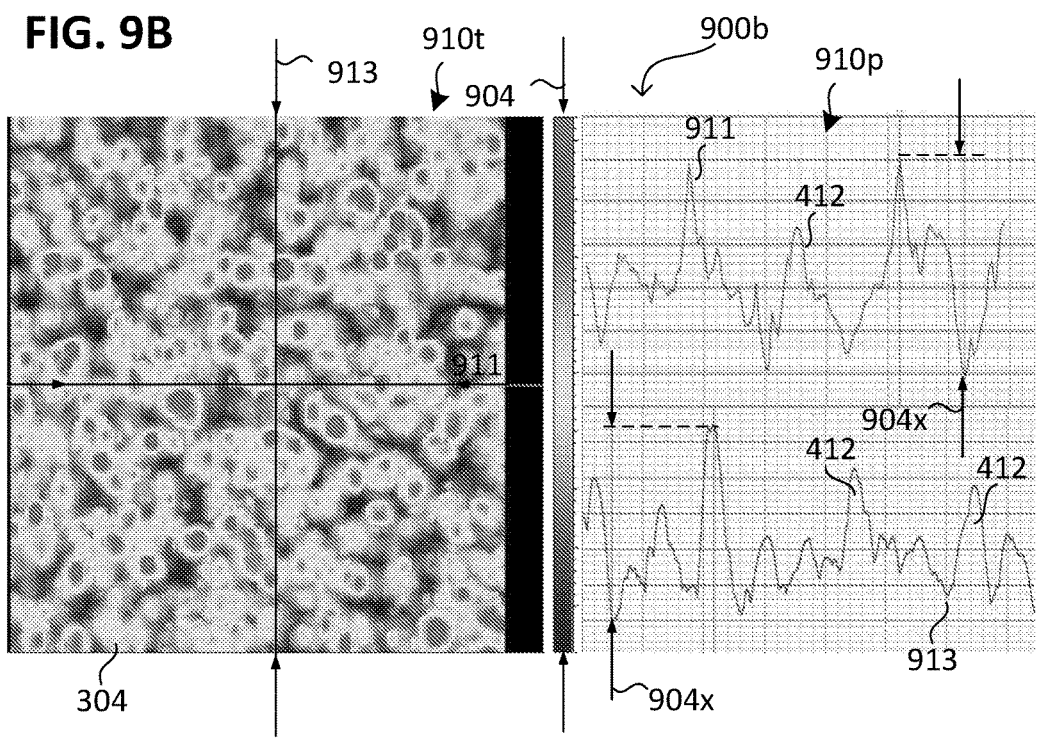

FIG. 9A and FIG. 9B respectively illustrate a structured surface according to various embodiments in a method according to various embodiments in a schematic analytic view.

In a first schematic analytic view 900*a* a first topography analysis 900*t* and a first profile analysis 900*p* is illustrated for the first structured surface 104 of the semiconductor region 102 (in other words, before activation of the dopant).

In a second schematic analytic view 900*b* a second topography analysis 910*t* and a second profile analysis 910*p* is illustrated for the second structured surface 104 of the semiconductor region 102 (in other words, after activation of the dopant).

A first height scale 902 of the first topography analysis 900*t* may be greater than a second height scale 904 of the second topography analysis 910*t*. The first height scale 902 of the first topography analysis 900*t* may be in the range from about 5 nm to about 5.5 µm, e.g. about 5.3 µm. The second height scale 904 of the second topography analysis 910*t* may be in the range from about 4.5 µm to about 5 µm, e.g. about 4.6 µm.

At least one of a first maximum height difference 902*x* for a first direction 901 (e.g. a linear path having a length of about 150 µm) of the first topography analysis 900*t*; or a second maximum height difference 902*y* for a second direction 903 (e.g. a linear path having a length of about 150 µm) of the first topography analysis 900*t* may be larger than at least one of a first maximum height difference 904*x* for a first direction 911 (e.g. a linear path having a length of about 150 µm) of the second topography analysis 910*t*; or a second maximum height difference 904*y* for a second direction 913 (e.g. a linear path having a length of about 150 µm) of the second topography analysis 910*t*.

The maximum height difference 902*x*, 902*y* of the first topography analysis 900*t* (in other words, before activation of the dopant) may be greater than the maximum height difference 904*x*, 904*y* the second topography analysis 910*t* (in other words, after activation of the dopant). The maximum height difference 902*x*, 902*y* of the first topography analysis 900*t* may be greater than about 3 µm, e.g. in the range from about 3 µm to about 5 µm. The maximum height difference 904*x*, 904*y* of the second topography analysis 910*t* may be less than about 3 µm, e.g. in the range from about 2 µm to about 3 µm.

For example, the maximum height difference 902*x* for the first direction 901 of the first topography analysis 900*t* and/or for the second direction 903 of the first topography analysis 900*t* may be in the range from about 3 µm to about 5 µm, e.g. about 3.4 µm or about 4.6 µm.

For example, the maximum height difference 904*x* for the first direction 911 of the second topography analysis 910*t* and/or for the second direction 913 of the second topography analysis 910*t* may be in the range from about 2 µm to about 3 µm, e.g. about 2.7 µm or about 2.5 µm.

According to various embodiments, structuring the semiconductor region 102 may include roughening the semiconductor region 102. The first structured surface 104 of the semiconductor region 102 may include a roughness (root mean squared) greater than about 0.1 µm, e.g. greater than about 0.2 µm, e.g. greater than about 0.3 µm, e.g. greater than about 0.4 µm, e.g. greater than about 0.5 µm, e.g. greater than about 0.6 µm, e.g. greater than about 0.7 µm. For example, during structuring the semiconductor region 102, the roughness (root mean squared) of the semiconductor region 102 may be increased by more than about 0.1 µm, e.g. more than about 0.2 µm, e.g. more than about 0.3 µm, e.g. more than about 0.4 µm, e.g. more than about 0.5 µm, e.g. more than about 0.6 µm, e.g. more than about 0.7 µm.

For example, a roughness (root mean squared) of the first topography analysis 900*t* may be in the range from about 0.6 µm to about 0.8 µm.

According to various embodiments, during activating the dopant the semiconductor region 102 may be flattened. The second structured surface 304 of the semiconductor region 102 may include a roughness (root mean squared) of less than about 0.6 µm, e.g. less than about 0.5 µm, e.g. less than about 0.4 µm, e.g. less than about 0.3 µm, e.g. less than about 0.2 µm, e.g. less than about 0.1 µm. For example, during activating the dopant, the roughness (root mean squared) of the semiconductor region 102 may be reduced by more than about 0.1 µm, e.g. more than about 0.2 µm, e.g. more than about 0.3 µm, e.g. more than about 0.4 µm, e.g. more than about 0.5 µm, e.g. more than about 0.6 µm.

For example, a roughness (root mean squared) of the second topography analysis 910*t* may be in the range from about 0.01 µm to about 6 µm, e.g. in the range from about 0.05 µm to about 3 µm, e.g. in the range from about 0.1 µm to about 0.6 µm.

FIG. 10A and FIG. 10B respectively illustrate a structured surface according to various embodiments in a method according to various embodiments in a schematic analytic view.

In a first schematic analytic view 1000*a* a first topography analysis 900*t* and a first profile analysis 900*p* is illustrated for the first structured surface 104 of the semiconductor region 102 similar to the first schematic analytic view 900*a* described before. In a second schematic analytic view 900*b* a second topography analysis 910*t* and a second profile analysis 910*p* is illustrated for the second structured surface 304 of the semiconductor region 102 similar to the second schematic analytic view 900*b* described before.

According to various embodiments, a first developed interfacial area ratio (first SdR) of the first topography analysis 900*t* may be greater than a second developed interfacial area ratio (second SdR) of the second topography analysis 910*t*. In other words, the first SdR of the first structured surface 104 of the semiconductor region 102 (before activating the dopant) may be greater than the second SdR of the second structured surface 304 of the semiconductor region 102 (after activating the dopant).

According to various embodiments, SdR, the Developed Interfacial Area Ratio, may be expressed as the percentage of additional surface area contributed by the structure a surface as compared to an ideal plane (planar surface) having the size of the measurement region. Illustratively, the SdR may be used to differentiate surfaces of similar amplitudes and average roughness.

During activating the dopant, the SdR of the structured surface 104 may be reduced by more than about 1%, e.g. by more than about 5%, e.g. by more than about 10%, e.g. by more than about 20%. For example, the first SdR may be greater than about 10%, e.g. in the range from about 10% to about 50%, e.g. about 25%. For example, the second SdR may be smaller than about 10%, e.g. in the range from about 1% to about 10%, e.g. about 8%.

FIG. 11A and FIG. 11B respectively illustrate a structured surface according to various embodiments in a method according to various embodiments in a schematic analytic view.

In a first schematic analytic view 1100a a first topography analysis 900t and a first profile analysis 900p is illustrated for the first structured surface 104 of the semiconductor region 102 similar to the first schematic analytic view 900a described before. In a second schematic analytic view 1100b a second topography analysis 910t and a second profile analysis 910p is illustrated for the second structured surface 304 of the semiconductor region 102 similar to the second schematic analytic view 900b described before.

According to various embodiments, at least one of the first structural angle between a first surface portion 104a and the macroscopic surface plane 404 or a second structural angle between a second surface portion 104b and the macroscopic surface plane 404 may be greater before activating the dopant (see 1100a) than after activating the dopant (see 1100b). In general, a structural angle (e.g. at least one of the first structural angle or the second structural angle) between a surface portion (e.g. at least one of the first surface portion 104a or the second surface portion 104b) and the macroscopic surface plane 404 may be reduced during activating the dopant, e.g. by more than about 1°, e.g. more than about 5°, e.g. more than about 10°, e.g. more than about 15°, e.g. more than about 20°, e.g. in the range from about 5° to about 40°.

For example, at least one of the first structural angle or the second structural angle before activating the dopant may be greater than about 35°, e.g. in the range from about 35° to about 60°, e.g. about 45° or about 35°. For example, at least one of the first structural angle or the second structural angle after activating the dopant may be less than about 35°, e.g. in the range from about 5° to about 35°, e.g. about 23° or about 34°.

Figure 12A:
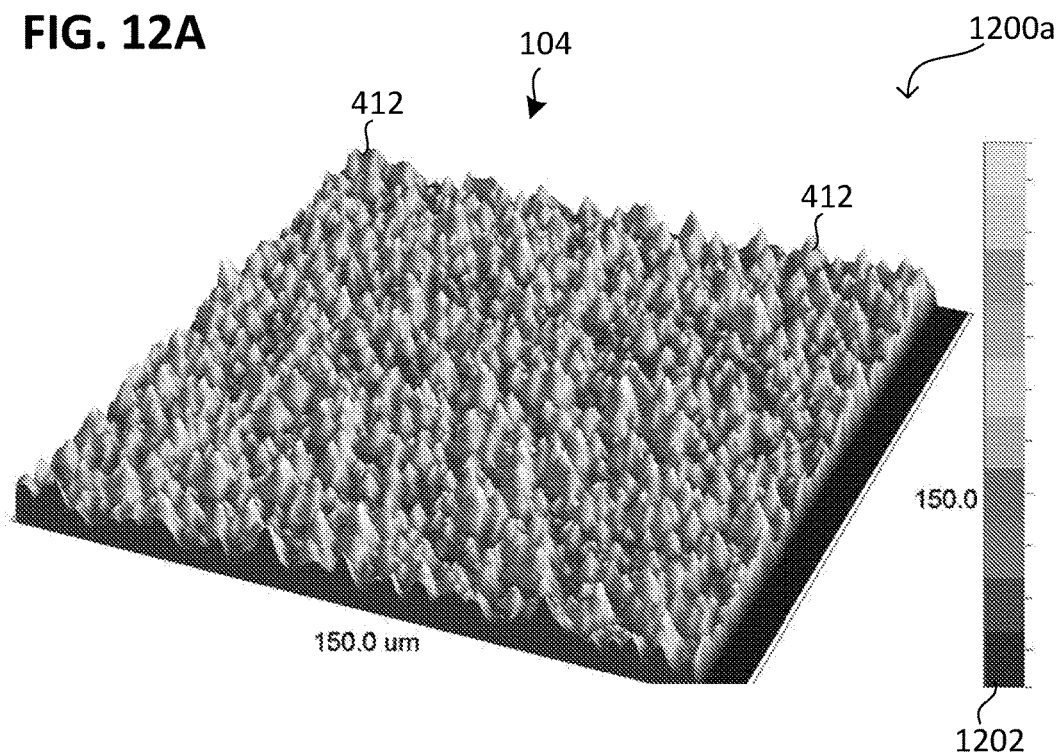
FIG. 12A and FIG. 12B respectively show a structured surface according to various embodiments in a method according to various embodiments in a schematic perspective view.
Figure 12B:
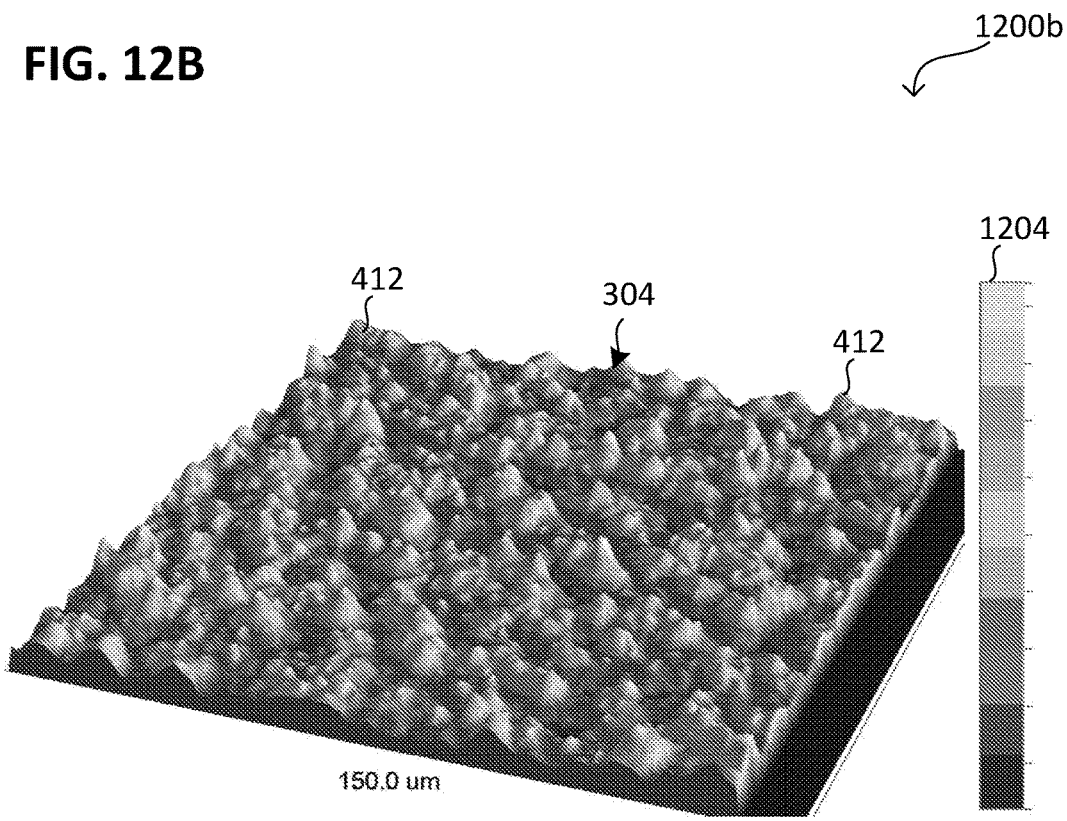

FIG. 12A and FIG. 12B respectively illustrate a structured surface of the semiconductor region 102 according to various embodiments in a method according to various embodiments in a first schematic perspective view 1200a for the first structured surface 104 and in a second schematic perspective view 1200b for the second structured surface 304. The illustrated area may have a size of about 150 μm to about 150 μm.

A first height scale 1202 before activating the dopant may be in the range from about 5 μm to about 5.5 μm, e.g. about 5.2 μm. A second height scale 1204 after activating the dopant may be in the range from about 4.5 μm to about 5 μm, e.g. about 4.6 μm.

As visible in the comparative first schematic perspective view 1200a and second schematic perspective view 1200b, the feature size (e.g. at least one of protrusions width or protrusions height) is decreasing during activating the dopant providing a plurality rounded features (e.g. protrusions), e.g. reducing at least one of protrusions width or protrusions height.

Figure 13A:
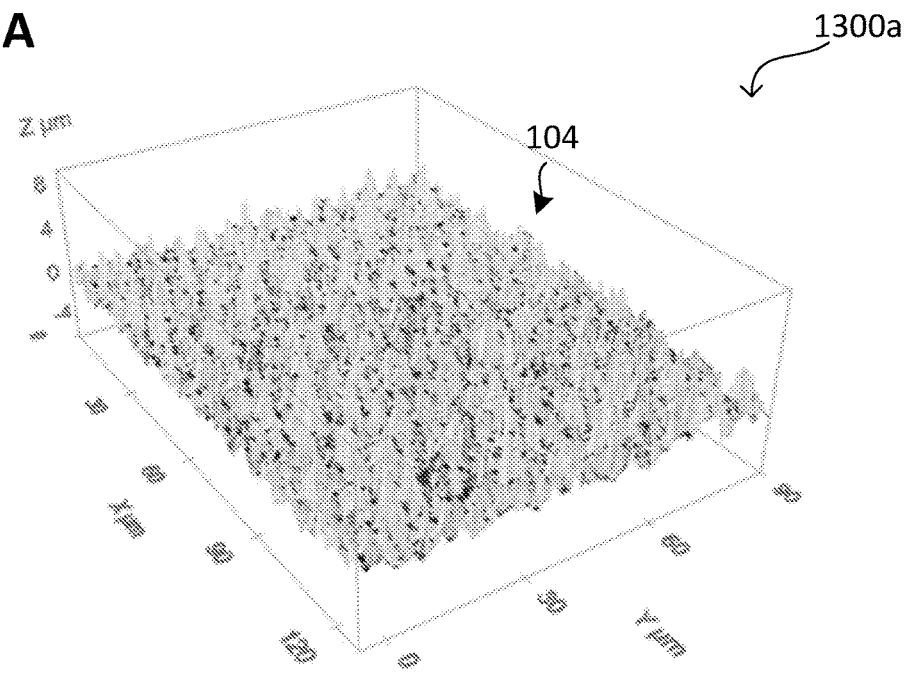
FIG. 13A and FIG. 13B respectively show a structured surface according to various embodiments in a method according to various embodiments in a schematic perspective view.
Figure 13B:
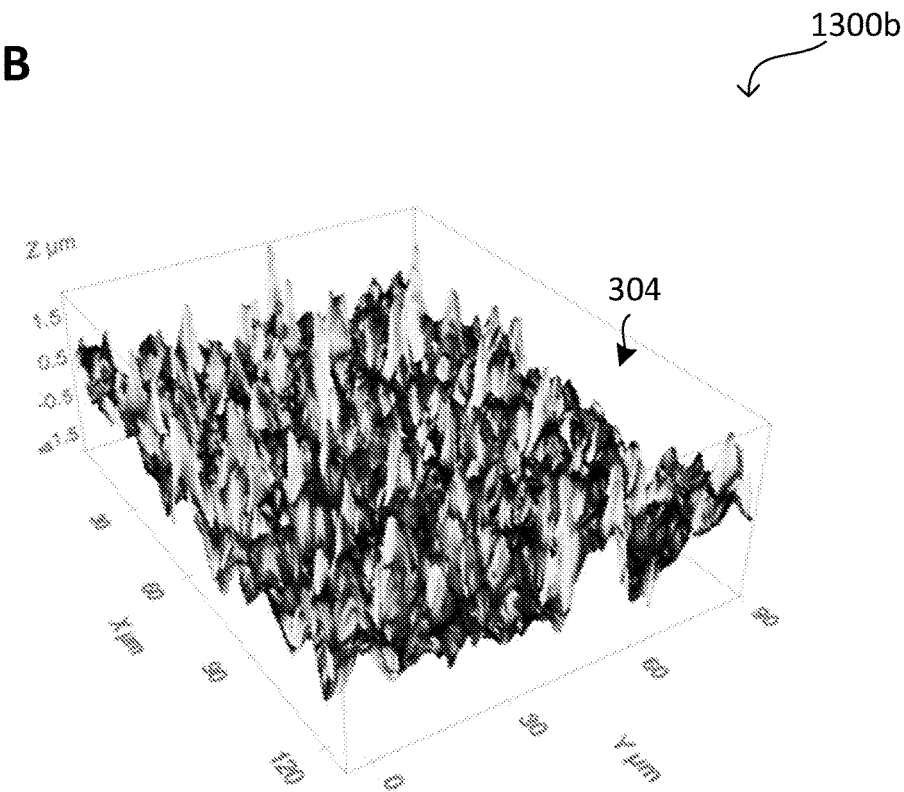

FIG. 13A and FIG. 13B respectively illustrate a structured surface according to various embodiments in a method according to various embodiments in a first schematic perspective view 1300a for the first structured surface 104 and in a second schematic perspective view 1300b for the second structured surface 304. The illustrated area may have a size of about 150 μm to about 150 μm. The black-intensity-scale corresponds to the amount of reflected electromagnetic radiation. In other words, the fraction of reflected electromagnetic radiation after activating the dopant may be greater than before activating the dopant.

Figure 14A:
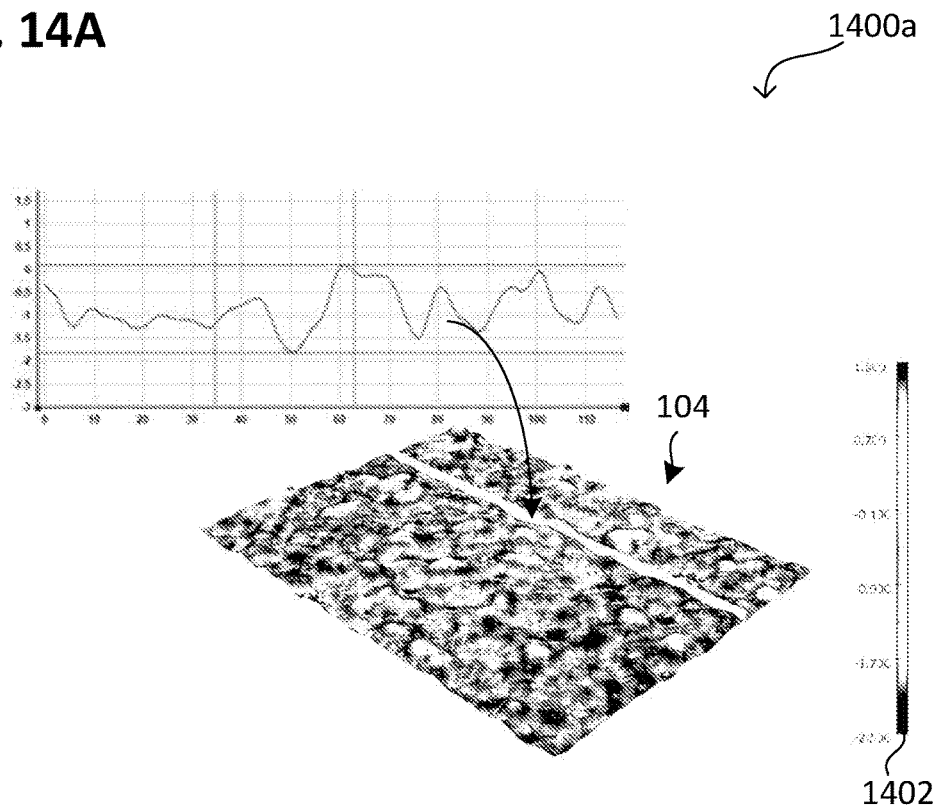
FIG. 14A and FIG. 14B respectively show a structured surface according to various embodiments in a method according to various embodiments in a schematic perspective view.
Figure 14B:
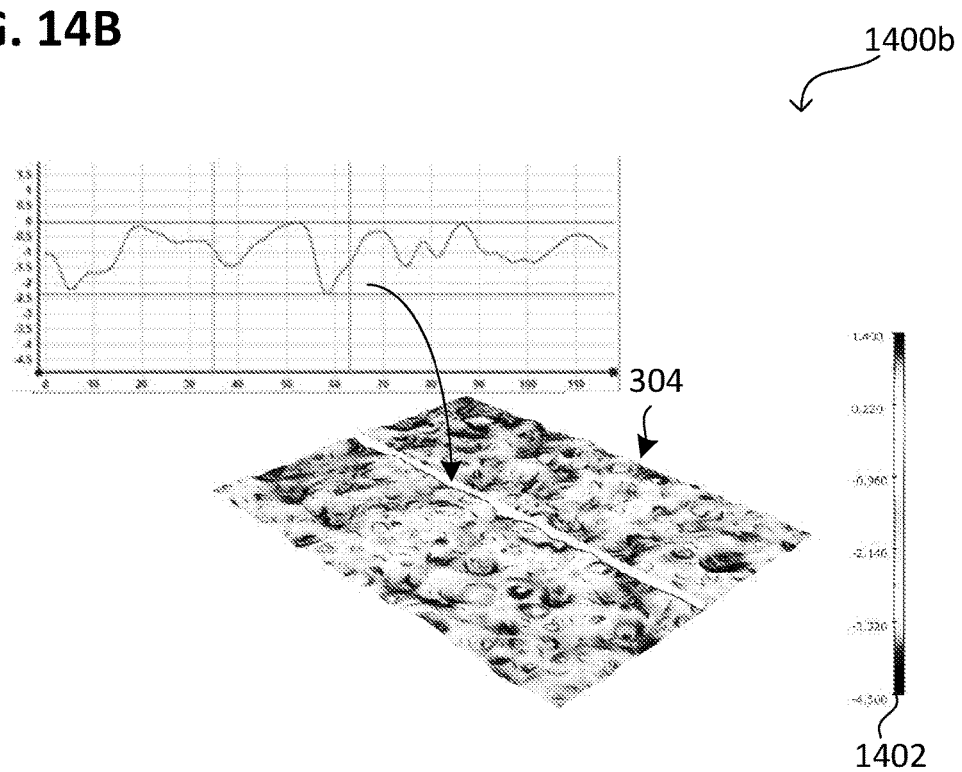

FIG. 14A and FIG. 14B respectively illustrate a structured surface according to various embodiments in a method according to various embodiments in a first schematic perspective view 1400a for the first structured surface 104 and in a second schematic perspective view 1400b for the second structured surface 304.

A first height scale 1402 before activating the dopant may be in the range from about 3.5 μm to about 4.5 μm, e.g. about 4 μm. A second height scale 1404 after activating the dopant may be in the range from about 5.5 μm to about 6 μm, e.g. about 5.9 μm.

FIG. 15A illustrates the first structured surface 104 according to various embodiments in a method according to various embodiments (before activating the dopant) in a schematic perspective view 1500a (e.g. in a view direction regarding the macroscopic surface plane 404 of about 45°) and FIG. 15B in a schematic cross sectional view 1500b (e.g. in a view direction parallel to the macroscopic surface plane 404) in various magnifications. A length scale 1502 may have a length of about 100 μm for a first magnification 1501, a length of about 20 μm for a second magnification 1503, and a length of about 10 μm for a third magnification 1505.

According to various embodiments, structuring the semiconductor region 102 (e.g. its surface) may include forming a pyramid structure. The pyramid structure may include a plurality of protrusions 412 each in form of a pyramid (in other words, a plurality of pyramids). For example, a size (e.g. at least one of height or width) of the plurality of pyramids may vary over the structured surface 104 of the semiconductor region 102 (also referred to as random pyramids), e.g. depending on the chosen structuring process. For example, a maximum height difference 1510 before activating the dopant may be greater than about 3 μm, e.g. in the range from about 3 μm to about 10 μm, e.g. about 5.4 μm.

According to various embodiments, the pyramid structure may provide a high absorption coefficient of the structured surface 104 of the semiconductor region 102. The incident electromagnetic radiation (e.g. laser light) may be multiple reflected. The pyramid structure may be formed using a wet etching process, e.g. including an alkaline etchant. For example, the shape of the pyramid structure (e.g. the structural angles) may be defined by an etchant-semiconductor combination. For example, if the semiconductor region 102 includes or is formed from silicon, forming the pyramid structure may include anisotropic etching provided by the etchant-silicon combination.

The pyramid structure may be formed by an anisotropic etching procedure, e.g. by using an anisotropic etchant, e.g. applying the anisotropic etchant to the semiconductor region 102. The anisotropic etchant may include or be formed from at least one alkaline etchant, e.g. including or formed from at least one of tetramethylammonium hydroxide (TMAH) and potassium hydroxide (KOH). Alternatively or additionally, an anisotropic etching procedure may be provided by using at least one of sodium hydroxide (NaOH), lithium hydroxide (LiOH) and ethylenediamine pyrocatechol (EDP). Optionally, the anisotropic etching procedure may include using additives (e.g. in a mixture) with the etchant, e.g. at least one of a wetting agent (also referred to as surfactant) like isopropanol, a dissolved salt and an oxidant like hydrogen peroxide.

Other structured surfaces (see for example, FIG. 17C) may be also obtained by using at least one of an alkaline etchant and an acidic etchant. The alkaline etchant may include or be formed from one of the etchants listed above. The acidic etchant may include or be formed from at least one of the following etchants: hydrofluoric acid (HF), nitric acid (HNO$_3$), sulfuric acid (H$_2$SO$_4$), phosphoric acid (H$_3$PO$_4$).

According to various embodiments, an aspect ratio of the plurality of protrusions 412 (protrusions 412 of the structured surface 104) may be greater than about 0.5, e.g. greater than about 0.6, e.g. greater than about 0.7, e.g. greater than about 0.8, e.g. greater than about 0.9, e.g. greater than about 1. The aspect ratio may describe a height 1504h (protrusion height) to width 1504w (protrusion width) ratio of the protrusions 412 of the structured surface 104. The aspect ratio may be defined by the structural angle (e.g. equal to about half a tangent of the structural angle). The width 1504w of a protrusion 412 may be measured at a base of the protrusion 412, wherein the height of the protrusion may be measured from the base of the protrusion 412. The aspect ratio may be a spatially averaged aspect ratio (e.g. averaged over the each protrusions of the plurality of protrusions 412).

FIG. 16A illustrates the second structured surface 304 according to various embodiments in a method according to various embodiments (after activating the dopant) in a schematic perspective view 1600a (e.g. in a view direction regarding the macroscopic surface plane 404 of about 45°) and FIG. 16B in a schematic cross sectional view 1600b (e.g. in a view direction parallel to the macroscopic surface plane 404) in various magnifications 1501, 1503, 1505 similar to FIG. 15A and FIG. 15B.

As illustrated in FIG. 16A and FIG. 16B, the plurality of protrusions 412 may be flattened during activating the dopant. For example, a maximum height difference 1610 after activating the dopant may be smaller than about 3 µm, e.g. in the range from about 1 µm to about 3 µm, e.g. about 2.9 µm.

According to various embodiments, the aspect ratio may be reduced during activating the dopant, by more than about 0.1, e.g. more than about 0.2, e.g. more than about 0.3, e.g. more than about 0.4, e.g. more than about 0.5, e.g. more than about 0.6. For example, the aspect ratio of the structured surface 104 of the semiconductor region 102 after activating the dopant may be smaller than about 0.5, e.g. smaller than about 0.4, e.g. smaller than about 0.3, e.g. smaller than about 0.2, e.g. smaller than about 0.1.

Figure 17A:
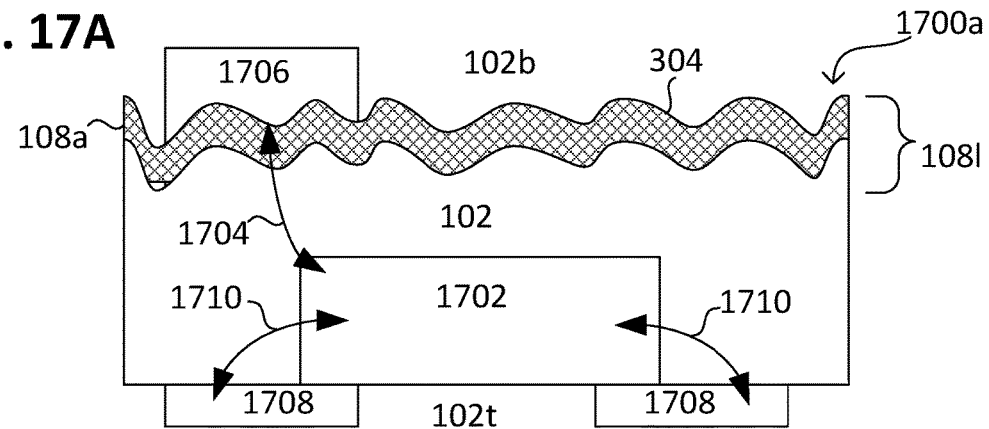
FIG. 17A and FIG. 17B respectively show a semiconductor device according to various embodiments in a method according to various embodiments in a schematic cross sectional view or side view.

FIG. 17A illustrates a semiconductor device 1700a according to various embodiments in a method according to various embodiments in a schematic cross sectional view or side view.

Before activating the dopant, the semiconductor region 102 may be structured to form the first structured surface 104 of the semiconductor region 102 at a second side 102b of the semiconductor region 102 for reducing reflectance of the semiconductor region 102 at the second side 102b of the semiconductor region 102 (see FIG. 1A to FIG. 1B). For example, the first side 102t may be a top side and the second side may be a bottom side. The first structured surface 104 may be transformed into the second structured surface 304.

According to various embodiments, the semiconductor device 1700a may include the second structured surface 304 of the semiconductor region 102. The second structured surface 304 of the semiconductor region 102 may include or be formed from rounded surface protrusions (see FIG. 3C).

The semiconductor device 1700a may include an activated dopant 108a disposed adjacent to the second structured surface 304, e.g. in physical contact with the second structured surface 304 of the semiconductor region 102. The activated dopant 108a may be disposed in a dopant layer 108l adjacent to the second structured surface 304, e.g. in physical contact with the second structured surface 304 of the semiconductor region 102.

Optionally, the semiconductor device 1700a may include a semiconductor circuit element 1702, e.g. a power semiconductor circuit element 1702, formed at least one of over or in the semiconductor region at a first side 102t of the semiconductor region. For example, the semiconductor circuit element 1702 may include or be formed from at least one transistor (in other words, one or more transistors) in electrical contact 1704 to the second structured surface 304 of the semiconductor region 102.

Optionally, the semiconductor device 1700a may include at least one first contact pad 1706 (e.g. at least one collector contact pad 1706) formed in electrical contact to the second structured surface 304 of the semiconductor region 102. In other words, the at least one first contact pad 1706 may be electrically connected to the semiconductor circuit element 1702. Alternatively or additionally, the semiconductor device 1700a may include at least one second contact pad 1708 (e.g. a source/drain contact pad 1708) formed in electrical contact 1710 to the semiconductor circuit element 1702. The at least one second contact pad 1708 may optionally include a gate contact pad, e.g. which may be formed electrically insulated from the semiconductor region 102.

According to various embodiments, the semiconductor circuit element 1702 may include or be formed from insulated-gate bipolar transistor.

Figure 17B:
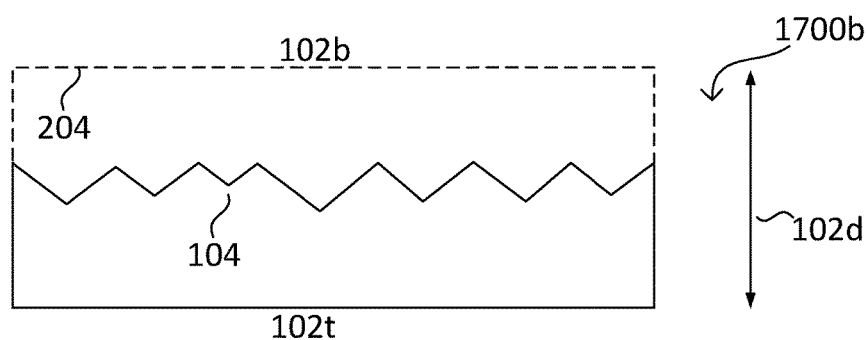

FIG. 17B illustrates a semiconductor device 1700b according to various embodiments in a method according to various embodiments in a schematic cross sectional view or side view.

According to various embodiments, structuring the semiconductor region 102 may include or be formed from roughening the semiconductor region 102. In other words, a first surface 204 (e.g. a unstructured surface 204), e.g. being provided before structuring the second side 102b of the semiconductor region 102, may include a smaller roughness than the first structured surface 104 of the semiconductor region 102, e.g. being provided after structuring the second side 102b of the semiconductor region 102.

According to various embodiments, structuring the semiconductor region 102 may include or be formed from at least one of: chemical processing the semiconductor region 102, electrochemical processing the semiconductor region 102, or mechanical processing the semiconductor region 102. In other words, structuring the semiconductor region 102 may include or be formed from at least one process selected from the following processes: chemical processing the semiconductor region 102, electrochemical processing the semiconductor region 102, or mechanical processing the semiconductor region 102. According to various embodiments, mechanical processing may include or be formed from at least one of sanding, grinding, sawing, sandblasting, milling.

Alternatively or additionally, chemical processing may include or be formed from at least one of wet chemical etching, or dry chemical etching (e.g. plasma etching), for example, at least one of: stain etching, metal-assisted chemical etching, reactive-ion etching, or deep reactive ion etching. Alternatively or additionally, electrochemical processing may include using an electrolyte carrying an electrical current flowing between the structured surface 104 of the semiconductor region 102 and an electrode.

According to various embodiments, structuring the semiconductor region 102 may include or be formed from thinning the semiconductor region 102 (e.g. by back grinding). In other words, during structuring the semiconductor region 102, a thickness 102d of the semiconductor region 102 (e.g. extending from the first side 102t to the second side 102b) may be reduced, e.g. to less than about 50%, e.g. to less than about 25%, e.g. to less than about 10%. Alternatively or additionally, the thickness 102d of the semiconductor region 102 may be reduced to less than about 500 µm, e.g. to less than about 250 µm, e.g. to less than about 100 µm, e.g. to less than about 50 µm, e.g. in the range from about 10 µm to about 200 µm.

According to various embodiments, semiconductor thinning (e.g. wafer thinning) may be configured to provide the first structured surface 104 at the end of the semiconductor thinning. For example, an etchant for semiconductor thinning may be configured to provide the first structured surface 104. Alternatively or additionally, an abrasive for semiconductor thinning may be configured to provide the first structured surface 104. For example, at least one of the etchant for semiconductor thinning or the abrasive for semiconductor thinning may be configured to roughen the semiconductor region 102.

Figure 17C:
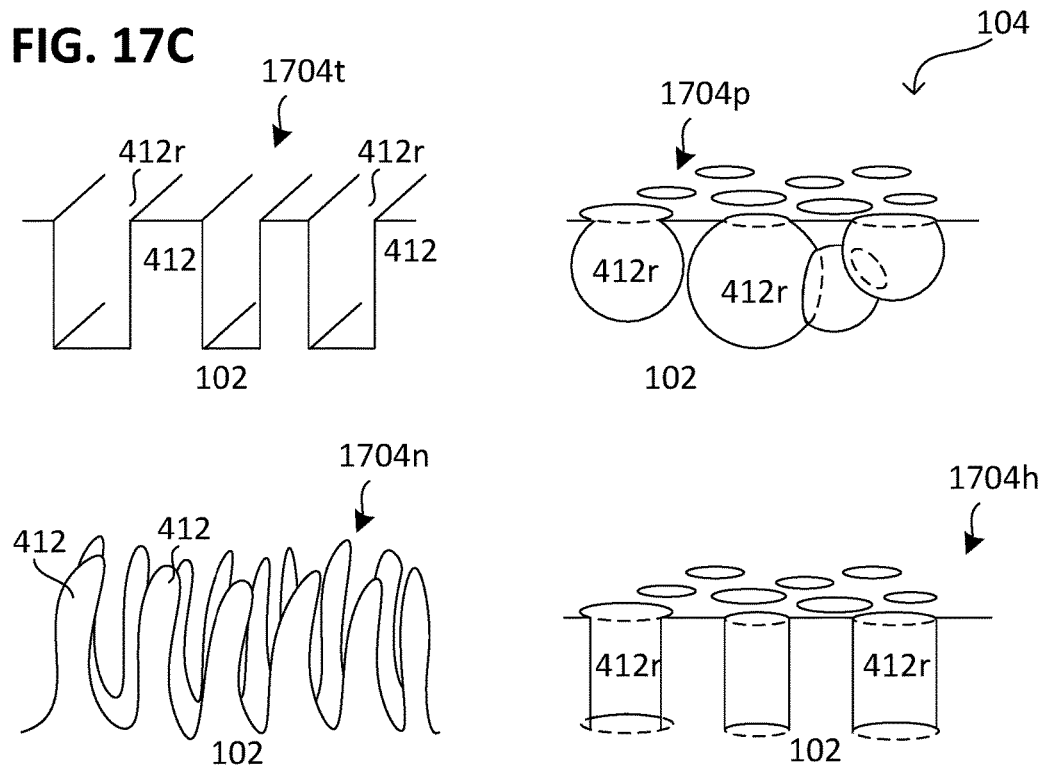
FIG. 17C shows a structured surface according to various embodiments in a method according to various embodiments in a schematic perspective view.

FIG. 17C illustrates the first structured surface 104 of the semiconductor region 102 according to various embodiments in a method according to various embodiments in a schematic cross sectional view.

According to various embodiments, the first structured surface 104 of the semiconductor region 102 may include various structures for increasing the absorption of electromagnetic radiation (e.g. laser light). For example, the first structured surface 104 of the semiconductor region 102 may include a rough surface (e.g. formed by rough etching), e.g. see FIG. 14A and FIG. 14B). Alternatively or additionally, the structured surface 104 of the semiconductor region 102 may include or be formed from at least one structure type selected from the following structure types: a trench structure 1704t, a pyramid structure (see FIG. 15A and FIG. 15B), a porous structure 1704p, a needle structure 1704n, or a hole structure 1704h.

According to various embodiments, the structured surface 104 of the semiconductor region 102 may include or be formed from a trench structure 1704t. The trench structure 1704t may include or be formed from a plurality of protrusions 412 separated from each other by a plurality of recesses 412r in form of plurality of trenches (plurality of trenches 412r). Each trench of the plurality of trenches 412r may be extended in a direction parallel to the macroscopic surface normal 404n. The extension of the trenches of the plurality of trenches 412r in a direction parallel to the macroscopic surface normal may be greater than at least one of a distance between them or an extension of them parallel to the macroscopic surface normal 404n. In other words, the trenches of the plurality of trenches 412r may be elongated. Optionally, each protrusion of the plurality of protrusions 412 may be tapered. Alternatively or additionally, each protrusion of the plurality of protrusions 412 may be facetted. The plurality of trenches 412r may be formed using etching or sawing.

According to various embodiments, the first structured surface 104 of the semiconductor region 102 may include or be formed from a porous structure 1704p. The porous structure 1704p may include or be formed from a plurality of recesses 412r in form of pores (illustratively, cavities), also referred to as plurality of pores 412r. Each pore of the plurality of pores 412r may be opened through the structured surface 104 of the semiconductor region 102. Optionally, at least a portion of the pores of the plurality of pores 412r may be interconnected to each other, e.g. by adjoining each other and/or by other pores. A distance between the pores of the plurality of pores 412r may be smaller than at least one of their extension parallel to the macroscopic surface normal 404n, or their extension perpendicular to the macroscopic surface normal 404n. Optionally, each pore of the plurality of pores 412r may be tapered. Alternatively or additionally, each pore of the plurality of pores 412r may be facetted.

According to various embodiments, the first structured surface 104 of the semiconductor region 102 may include or be formed from a needle structure 1704n. The needle structure 1704n may include or be formed from a plurality of protrusions 412 in needle form (plurality of needles 412) disposed distant from each other. The needle structure 1704n may include or be formed from black silicon. The needle structure 1704n may be formed by reactive ion etching. Each needle of the plurality of needles 412 may be extended in a direction perpendicular to the macroscopic surface normal 404n. The extension of the needles of the plurality of needles 412 may be greater than at least one of a distance between them or an extension of them parallel to the macroscopic surface normal 404n. In other words, the needles of the plurality of needles 412 may be elongated. Optionally, each needle of the plurality of needles 412 may be tapered. Alternatively or additionally, each needle of the plurality of needles 412 may be facetted.

According to various embodiments, the first structured surface 104 of the semiconductor region 102 may include or be formed from a hole structure 1704h. The hole structure 1704h may include or be formed from a plurality of recesses 412r in form of holes, also referred to as plurality of holes 412r. Each hole of the plurality of holes 412r may extend into the semiconductor region 102, wherein the plurality of holes 412r may be separated from each other. The extension of the holes of the plurality of holes 412r into the semiconductor region 102 may be greater than at least one of their extension parallel to the macroscopic surface normal 404n, or their distance to each other. Optionally, each hole of the plurality of holes 412r may be tapered. Alternatively or additionally, each hole of the plurality of holes 412r may be facetted.

Figure 18A:
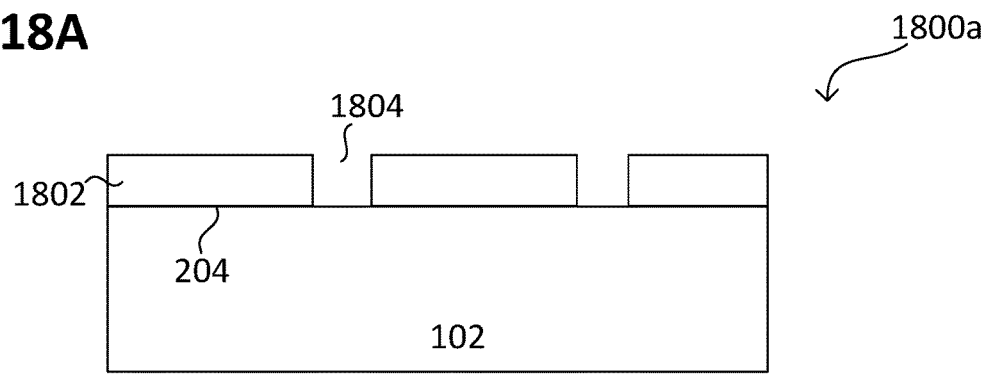
FIG. 18A, FIG. 18B and FIG. 18C respectively show a semiconductor device according to various embodiments in a method according to various embodiments in a schematic cross sectional view or side view.

FIG. 18A illustrates a semiconductor device 1800a according to various embodiments in a method according to various embodiments in a schematic cross sectional view or side view.

According to various embodiments, structuring the semiconductor region 102 may include using a mask 1802. Therefore, the mask 1802 may be formed over the semiconductor region 102, e.g. over an unstructured surface 204 of the semiconductor region 102. The mask 1802 may be formed before structuring the semiconductor region 102. The mask 1802 may include a plurality of openings 1804 exposing the semiconductor region 102, e.g. the unstructured surface 204 of the semiconductor region 102.

According to various embodiments, the openings of the plurality of openings 1804 may be arranged in a pattern, e.g. periodically (e.g. in two dimensions), e.g. in a chessboard structure. According to various embodiments, the mask 1704 may include or be formed from an oxide, e.g. a semiconductor oxide or a metal oxide.

Using the mask 1704 may provide to form a periodical structure in the semiconductor region 102, e.g. at least one of periodical pyramids, periodical needles, periodical trenches, periodical holes, periodical pores. This may provide a homogeneous absorption over the first structured surface 104 of the semiconductor region 102 (including the periodical structure).

Structuring the semiconductor region 102 may include processing the semiconductor region 102 through the openings of the plurality of openings 1804, in other words, processing the exposed portions of the semiconductor region 102.

Figure 19A:
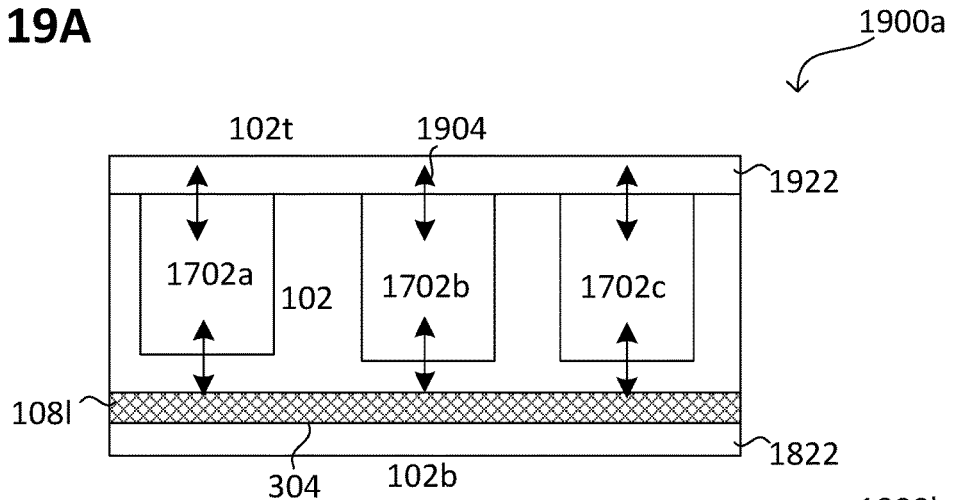
FIG. 19A, FIG. 19B and FIG. 19C respectively show a semiconductor device according to various embodiments in a method according to various embodiments in a schematic cross sectional view or side view.
Figure 19B:
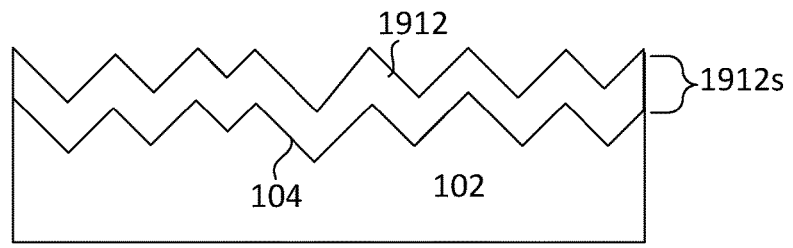
Figure 19C:
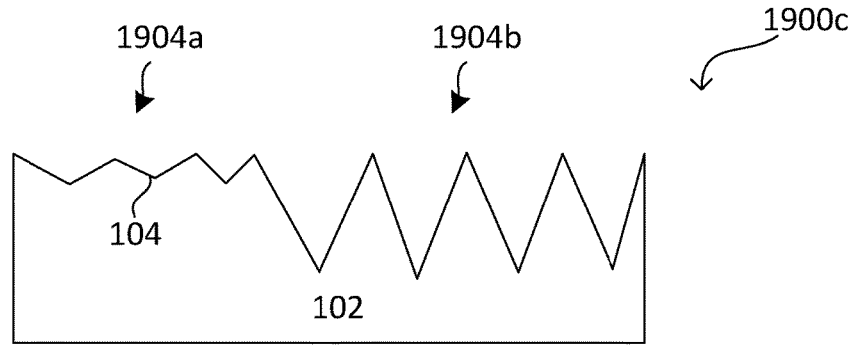

Alternatively or additionally, the mask 1802 may be configured to form a first region 1904a and a second region 1904b differing in their reflection characteristic (see FIG. 19C or see FIG. 5A and FIG. 5B).

Figure 18B:
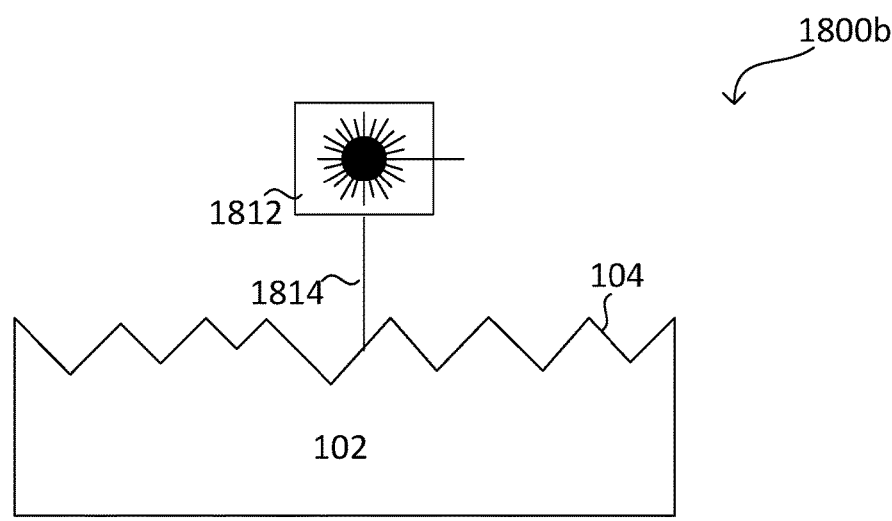

FIG. 18B illustrates a semiconductor device 1800b according to various embodiments in a method according to various embodiments in a schematic cross sectional view or side view.

According to various embodiments, structuring the semiconductor region 102 may include or be formed from irradiating the structured surface 104 of the semiconductor region 102 using a laser source 1812 (laser light source). The laser source 1812 may be configured to provide a laser beam 1814 including electromagnetic radiation (e.g. laser light) which is optionally coherent.

According to various embodiments, the laser source 1812 may be configured to provide a pulsed laser beam 1814. Alternatively or additionally, the laser source 1812 may be configured to provide a continuous laser beam 1814.

According to various embodiments, irradiating the structured surface 104 of the semiconductor region 102 may include or be formed from scanning the structured surface 104 of the semiconductor region 102 surface with the electromagnetic radiation, e.g. the laser beam 1814. In other words, the electromagnetic radiation, e.g. the laser beam 1814, may be moved over the structured surface 104 of the semiconductor region 102, e.g. in accordance with a predetermined irradiation pattern.

The laser beam 1814 may include or be formed from (e.g. per pulse) an energy density in the range from about 2 J/cm$^2$ to about 10 J/cm$^2$, in the range from about 3 J/cm$^2$ to about 5 J/cm$^2$, e.g. about 3.8 J/cm$^2$.

Figure 18C:
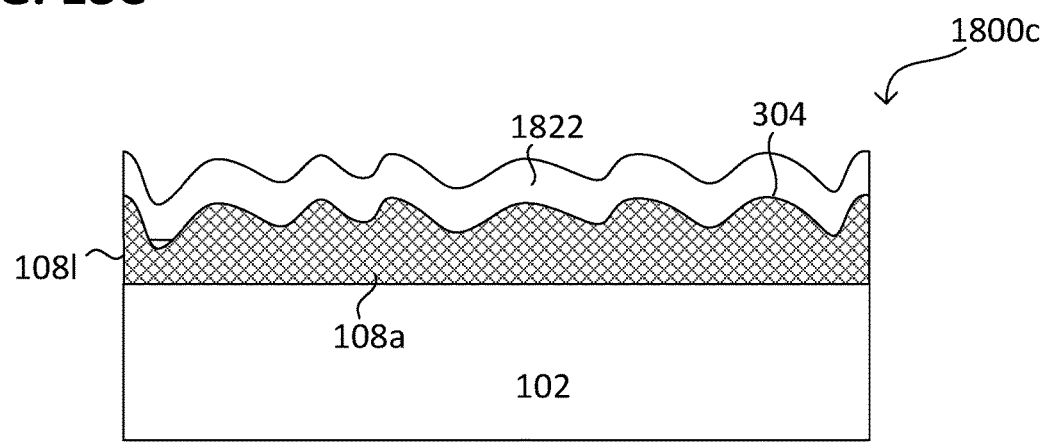

FIG. 18C illustrates a semiconductor device 1800c according to various embodiments in a method according to various embodiments in a schematic cross sectional view or side view.

According to various embodiments, the semiconductor device 1800c may include a metallization layer 1822 formed over the semiconductor region, e.g. over the second structured surface 304 of the semiconductor region 102. The metallization layer 1822 may be formed conformal or, in an alternative non-conformal, to regarding the second structured surface 304 of the semiconductor region 102.

According to various embodiments, the metallization layer 1822 may include or be formed from at least one contact pad. According to various embodiments, the metallization layer 1822, e.g. the at least one contact pad, may include or be formed from an opaque material. In other words, the metallization layer 1822, e.g. the at least one contact pad, may be opaque.

FIG. 19A illustrates a semiconductor device 1900a according to various embodiments in a method according to various embodiments in a schematic cross sectional view or side view.

According to various embodiments, the semiconductor device 1900a may include a plurality of semiconductor circuit elements 1702a, 1702b, 1702c electrically connected 1904 in parallel to each other and in electrical contact to the structured surface 304 of the semiconductor region 102.

Optionally, the semiconductor device 1900a may include a first metallization 1922 on the first side 102t of the semiconductor region 102. Each semiconductor circuit element of the plurality of semiconductor circuit elements 1702a, 1702b, 1702c may be electrically connected 1904 to the first metallization 1922. The at least one second contact pad 1708 may be formed from the first metallization 1922.

According to various embodiments, each semiconductor circuit element of the plurality of semiconductor circuit elements 1702a, 1702b, 1702c may include or be formed from a diode structure or a transistor structure (also referred to as transistor cell).

Alternatively or additionally, the semiconductor device 1900a may include a second metallization 1822 on the second side 102b of the semiconductor region 102. Each semiconductor circuit element of the plurality of semiconductor circuit elements 1702a, 1702b, 1702c may be electrically connected 1904 to the second metallization 1822, e.g. via the structured surface 304 of the semiconductor region 102. The at least one first contact pad 1706 may be formed from the second metallization 1822.

According to various embodiments, the plurality of semiconductor circuit elements 1702a, 1702b, 1702c may be part of or form a power semiconductor circuit element.

According to various embodiments, each semiconductor circuit element of the plurality of semiconductor circuit elements 1702a, 1702b, 1702c (e.g. the power semiconductor circuit element) may include or be formed from a vertical structure. A vertical structure may be understood as providing a current flow from the first side 102t of the semiconductor region 102 to the second side 102b of the semiconductor region 102 or vice versa, e.g. perpendicular to the macroscopic surface plane 404 of the structured surface 104.

According to various embodiments, each semiconductor circuit element of the plurality of semiconductor circuit elements 1702a, 1702b, 1702c (e.g. the power semiconductor circuit element) may include at least one gate contact pad. The at least one gate contact pad may be provided by (e.g. formed from) at least one of (if present) the first metallization 1922.

According to various embodiments, each semiconductor circuit element of the plurality of semiconductor circuit elements 1702a, 1702b, 1702c (e.g. the power semiconductor circuit element) may include or be formed from a transistor (e.g. a power transistor).

FIG. 19B illustrates a semiconductor device 1900b according to various embodiments in a method according to various embodiments in a schematic cross sectional view or side view.

According to various embodiments, the semiconductor device 1900b may include an layer 1912 (also referred to as optical modification layer 1912) formed over the first structured surface 104 of the semiconductor region 102, e.g. before disposing a dopant in the semiconductor region 102 or after disposing the dopant in the semiconductor region 102.

In general, the optical modification layer 1912 formed over the semiconductor region 102 may influence the result of activating the dopant. For example, atoms (impurity atoms) of the optical modification layer 1912 may diffuse into the semiconductor region 102 during activating the dopant. Alternatively or additionally, the optical modification layer 1912 may induce crystal defects in the semiconductor region 102 during activating the dopant (e.g. arising from mechanical stress of the optical modification layer 1912).

According to various embodiments, the optical modification layer 1912 may be configured in accordance with at least one of the structured surface 104 of the semiconductor region 102 or the dopant to avoid at least one of impurity atom diffusion from the optical modification layer 1912 into the semiconductor region 102 (e.g. causing unwanted doping), or crystal defects in the semiconductor region 102. For example, a material of the optical modification layer 1912 may be configured similar to at least one of the semiconductor region 102 or the dopant, such that atoms diffusing into the semiconductor region 102 may be similar (or equal) to atoms of at least one of the semiconductor region 102 or the dopant. Alternatively or additionally, the structured surface 104 may be heated to a temperature smaller than its melting temperature. Due to an increased heating depth provided by the structured surface 104 according to various embodiments, still enough energy may be transferred to the dopant to activate the dopant without melting the structured surface 104. This may avoid intermixture of the optical modification layer 1912 with the structured surface 104 of the semiconductor region 102.

For avoiding impact of the mechanical stress on the semiconductor region 102, e.g. during activating the dopant, the optical modification layer 1912 may include or be formed from a layer stack 1912s (also referred to as stress compensation stack 1912s) including at least one first layer made from a first material and at least one second layer made from a second material, e.g. in alternating order, e.g. one first layer between two second layers, e.g. the two second layers between two further first layers, etc. At least one of the first material or its thickness (thickness of the at least one first layer) may be configured to at least partially compensate a mechanical stress arising from the second material. Alternatively or additionally, at least one of the second material or its thickness (thickness of the at least one second layer) may be configured to at least partially compensate a mechanical stress arising from the first material. In other words, a mechanical stress transferred from the layer stack 1912s to the semiconductor region 102 may be smaller than at least one of a mechanical stress of the first material or a mechanical stress of the second material.

Optional, the optical modification layer 1912 may be removed after activating the dopant.

According to various embodiments, the optical modification layer 1912 may include or be formed from an antireflective coating (e.g. including at least one antireflective layer). The antireflective coating may be configured to reduce the reflectivity of the structured surface 104 of the semiconductor region 102, e.g. the first structured surface 104 of the semiconductor region 102. In other words, a reflection coefficient of the antireflective coating may be smaller than a reflection coefficient of the semiconductor region 102.

Alternatively or additionally, the optical modification layer 1912 may include or be formed from an absorptive coating (e.g. including at least one absorptive layer). The absorptive coating may be configured to increase the absorption of the structured surface 104 of the semiconductor region 102. In other words, an absorption coefficient of the absorptive coating may be greater than an absorption coefficient of the semiconductor region 102, e.g. the first structured surface 104 of the semiconductor region 102. The absorptive coating may transform the electromagnetic radiation at least partially into thermal energy a transfer the thermal energy to the semiconductor region 102, e.g. via the first structured surface 104 of the semiconductor region 102.

FIG. 19C illustrates a semiconductor device 1900c according to various embodiments in a method according to various embodiments in a schematic cross sectional view or side view.

According to various embodiments, structuring the semiconductor region may include forming the first region 1904a and the second region 1904b.

According to various embodiments, the first structured surface 104 of the semiconductor region 102 may include or be formed from the first region 1904a and the second region 1904b. The first region 1904a may differ from the second region 1904b in a reflection characteristic, for example, describing a wavelength dependent reflection coefficient (see FIG. 5A and FIG. 5B).

According to various embodiments, the first region 1904a of the structured surface 104 and the second region 1904b of the structured surface 104 may differ in at least one structural feature selected from the following structural features: a roughness (root mean squared), a developed interfacial area ratio, a structure type, a spatially averaged structure height, a spatially averaged structure width; an optical modification layer 1912.

The first region 1904a and the second region 1904b may provide to modulate the absorption of the structured surface 104 of the semiconductor region 102, e.g. in accordance with a predetermined pattern or modulation. In other words, structuring the semiconductor region 102 may include adjusting a spatially distributed reflectance of the semiconductor region 102. This may enable to adjust the spatially resolved energy transfer to the semiconductor region 102, e.g. via the structured surface 104 of the semiconductor region 102.

Figure 20A:
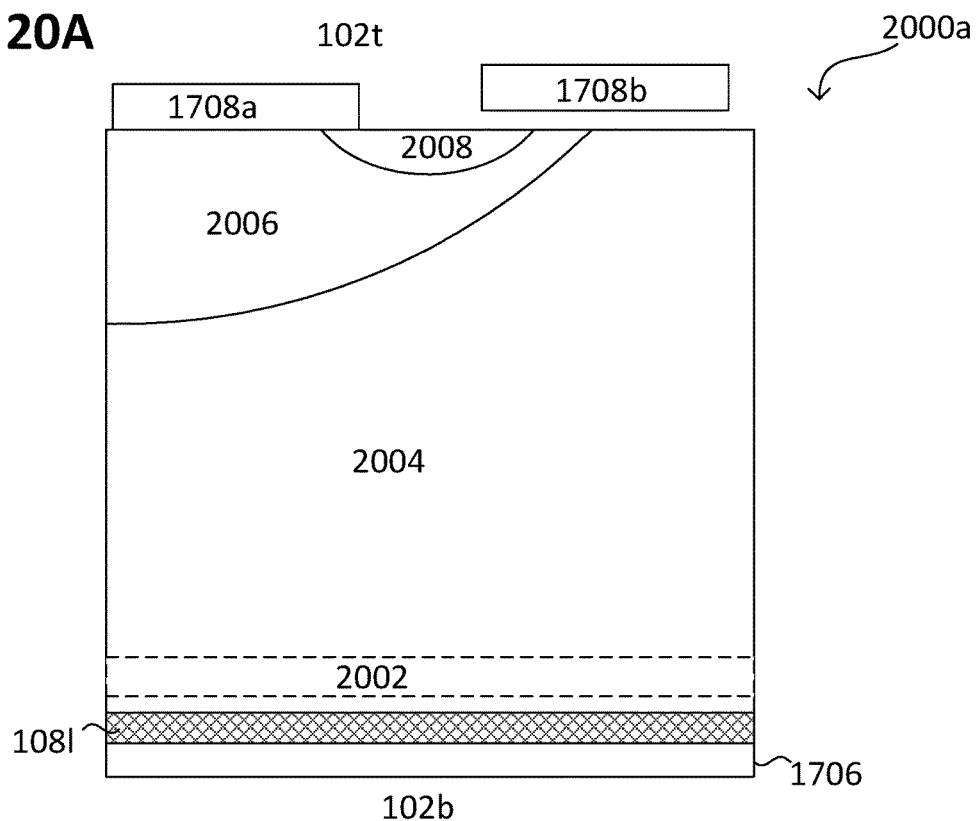
FIG. 20A and FIG. 20B respectively show a semiconductor device according to various embodiments in a method according to various embodiments in a schematic cross sectional view or side view.

FIG. 20A illustrates a semiconductor device 2000a according to various embodiments in a method according to various embodiments in a schematic cross sectional view (e.g. in the schematic cross sectional view 2106, see FIG. 21) or side view, e.g. a semiconductor circuit element 1702a, 1702b, 1702c, e.g. a power semiconductor circuit element 1702.

The semiconductor device 2000a may include the dopant layer 108l formed on the second side 102b. The dopant layer 108l (in other words, the activated dopant) may include or be formed from a first doping type. The dopant layer 108l may include or be formed from a collector region (a doped region in form of a collector region).

The semiconductor device 2000a may further include a first contact pad 1706 first contact pad 1706 in form of a collector contact pad 1706 (e.g. a drain contact pad). The first contact pad 1706 may electrical contact the dopant layer 108l. The first contact pad 1706 may include or be formed from a metallization layer. The first contact pad 1706 may cover more than half of the dopant layer 108l, cover the dopant layer 108l substantially (e.g. more than 80% of the dopant layer 108l). The first contact pad 1706 may include or be formed from an opaque layer.

Further, the semiconductor device 2000a may include a first doped region 2006. The first doped region 2006 may include or be formed from a base region. The first doped region 2006 may include (e.g. a dopant having) a doping type equal to the dopant layer 108l (in other words, the dopant of the dopant layer 108l), e.g. the first doping type. The semiconductor device 2000a may further include a second contact pad 1708a electrical contacting the first doped region 2006. The second contact pad 1708a may include or be formed from an emitter contact pad 1708a (e.g. a source contact pad 1708a). The second contact pad 1708a may include or be formed from a metallization layer.

Further, the semiconductor device 2000a may include a second doped region 2004 formed between the first doped region 2006 and the dopant layer 108l. The second doped region 2004 may include or be formed from a drift region.

The second doped region 2004 may include a doping type (second doping type) different from the dopant layer 108*l*, e.g. a dopant having the second doping type. The second doped region 2004 may include an epitaxial formed layer.

The semiconductor device 2000*a* may further include a further second contact pad 1708*b*. The further second contact pad 1708*b* may include or be formed from a gate contact pad 1708*b*. The further second contact pad 1708*b* may be formed electrical insulated from the second doped region 2004, e.g. by an electrically insulating layer formed between the further second contact pad 1708*b* and the second doped region 2004. The further second contact pad 1708*b* may include or be formed from a metallization layer.

Further, the semiconductor device 2000*a* may include a third doped region 2008. The third doped region 2008 may include or be formed from an emitter region. The third doped region 2008 may include (e.g. a dopant having) a doping type different from the dopant layer 108*l*, e.g. the second doping type. A dopant concentration of the third doped region 2008 may be greater than of the second doped region 2004.

Optionally, the semiconductor device 2000*a* may include a fourth doped region 2002 between the second doped region 2004 and the dopant layer 108*l*. The fourth doped region 2002 may include or be formed from a field stop region. The fourth doped region 2002 may include a dopant having a doping type different from the dopant layer 108*l*. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

Optionally, the dopant layer 108*l* may include or be formed from a plurality of first segments including the first doping type and a plurality of second segments including the second doping type. In other words, the plurality of first segments may include a doping type different from the doping type of the plurality of second segments. The segments of the plurality of first segments and the segments of the plurality of second segments may be disposed in an alternating order, e.g. adjacent to each other.

The semiconductor device 2000*a*, e.g. a semiconductor circuit element 1702 may include or be formed from a transistor structure, e.g. a planar transistor structure (providing a vertical current flow). A transistor structure may include or be formed from a plurality of p-n junctions. A p-n junction may be formed by an interface of two doped regions having different doping types, e.g. an interface between at least one the following: the first doped region 2006 and the second doped region 2004; the first doped region 2006 and the third doped region 2008; the second doped region 2004 and the dopant layer 108*l*; the dopant layer 108*l* and the fourth doped region 2002 (if present, e.g. in an IGBT).

According to various embodiments, the second doped region 2004 and the fourth doped region 2002 may include the same doping type. As described above, the dopant layer 108*l* may differ from the second doped region 2004 and the fourth doped region 2002 in the doping type. In this case, the dopant layer 108*l* may provide a backside emitter region (e.g. for an IGBT). Alternatively, the dopant layer 108*l* may have the same doping type as the second doped region 2004 and the fourth doped region 2002. In this case, the dopant layer 108*l* may provide a contact enhancement region (e.g. for a vertical metal-oxide-semiconductor field-effect transistor).

According to various embodiments, the semiconductor device 2000*a*, e.g. a semiconductor circuit element 1702, may include or be formed from insulated-gate bipolar transistor.

Figure 20B:
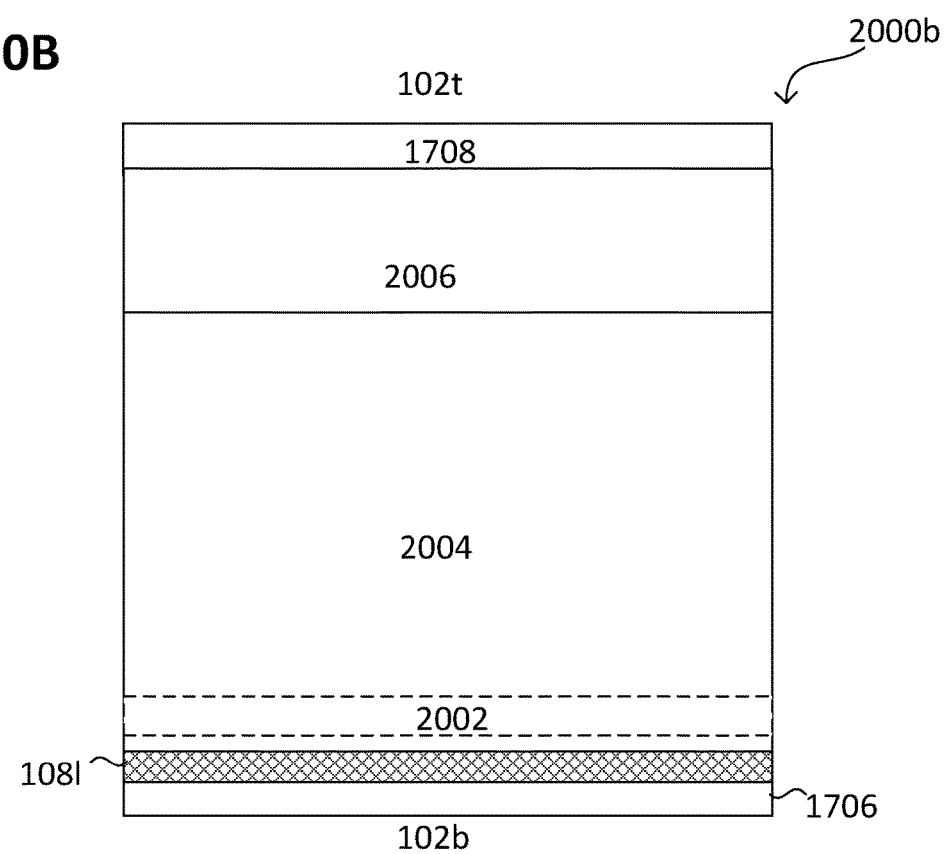

FIG. 20B illustrates a semiconductor device 2000*b* according to various embodiments in a method according to various embodiments in a schematic cross sectional view (e.g. in the schematic cross sectional view 2106, see FIG. 21) or side view, e.g. a semiconductor circuit element 1702*a*, 1702*b*, 1702*c*, e.g. a power semiconductor circuit element 1702.

The semiconductor device 2000*b* may include the dopant layer 108*l* formed on the second side 102*b*. The dopant layer 108*l* (in other words, the activated dopant) may include or be formed from a first doping type.

The semiconductor device 2000*b* may further include a first contact pad 1706 electrically contacting the dopant layer 108*l*. The first contact pad 1706 may include or be formed from an electrode contact pad. The first contact pad 1706 may include or be formed from a metallization layer. The first contact pad 1706 may substantially cover the dopant layer 108*l*. An extension of the first doped region 2006 (e.g. in a direction pointing from the first side 102*t* to the second side 102*b*, in other words, a vertical direction) may be less than an extension of the second doped region 2004 (e.g. in the direction pointing from the first side 102*t* to the second side 102*b*). Illustratively, the first doped region 2006 may provide a thin doped region and/or the second doped region 2004 may provide a thick drift zone. The first doped region 2006 may be electrically and/or physically connected with a second contact pad 1708.

Further, the semiconductor device 2000*b* may include a first doped region 2006. The first doped region 2006 may include or be formed from a first junction region. The first doped region 2006 may include a dopant having a doping type different from the dopant layer 108*l* (in other words, the dopant of the dopant layer 108*l*), e.g. the second doping type. The semiconductor device 2000*b* may further include the second contact pad 1708 electrical contacting the first doped region 2006. The second contact pad 1708 may include or be formed from an electrode contact pad. The second contact pad 1708*a* may include or be formed from a metallization layer. Further, the semiconductor device 2000*b* may include a second doped region 2004 formed between the first doped region 2006 and the dopant layer 108*l*. The second doped region 2004 may include or be formed from a second junction region. The second doped region 2004 may include a doping type equal to a doping type of the dopant layer 108*l*, e.g. a dopant having the first doping type.

Optionally, the semiconductor device 2000*b* may include a third doped region 2002 between the second doped region 2004 and the dopant layer 108*l*. The third doped region 2002 may include or be formed from a field stop region. The third doped region 2002 may include (e.g. a dopant having) a doping type equal to a doping type of the dopant layer 108*l*. The third doped region 2002 may include a dopant concentration higher than the second doped region 2004.

The semiconductor device 2000*b*, e.g. a semiconductor circuit element 1702, e.g. a power semiconductor circuit element may include or be formed from a diode structure, e.g. a planar diode structure (providing a vertical current flow). A diode structure may include or be formed from a p-n junction, e.g. formed by an interface of two doped regions having different doping types, e.g. an interface between the first doped region 2006 and the second doped region 2004.

Optionally, the dopant layer 108*l* may include or be formed from a plurality of first segments including the first doping type and a plurality of second segments including the second doping type. The segments of the plurality of first segments and the segments of the plurality of second segments may be disposed in an alternating order. In this case, the dopant layer **108*l*** may be part of backward-diode structure.

Figure 21:
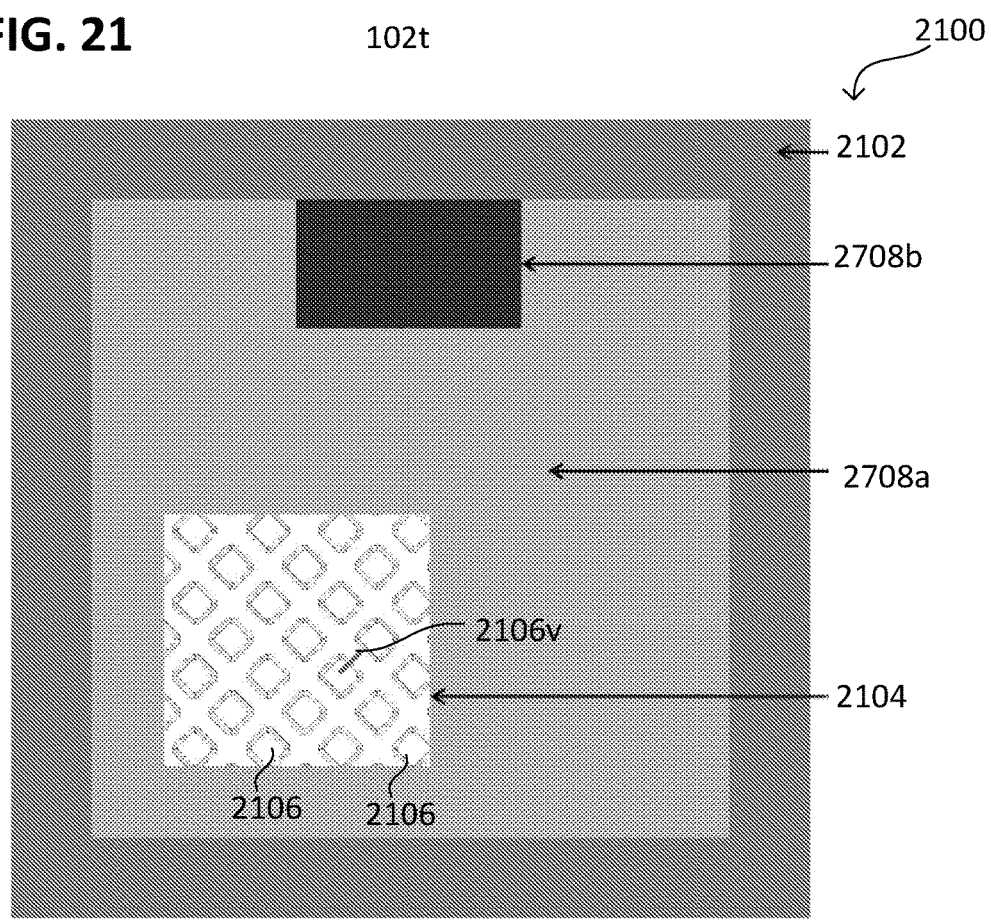
FIG. 21 shows a semiconductor device according to various embodiments in a method according to various embodiments in a schematic top view.

FIG. 21 illustrates a semiconductor device 2100 according to various embodiments in a method according to various embodiments in a schematic top view (showing the top side of the semiconductor device 2100).

The device may include a first contact terminal **2708*a* and a second contact terminal 2708*b*. The second contact terminal 2708*a* may cover an active area of the semiconductor device 2100 in which a plurality of semiconductor circuit elements 2106 (e.g. transistor structures or diode structures) may be disposed, as visible in a detailed (magnified) top view 2104**.

The first contact terminal **2708*a* (e.g. a source contact terminal 2708*a*) may be electrically connected to the second contact pad 1708*a* (e.g., a source contact pad 1708*a*) of each semiconductor circuit element of the plurality of semiconductor circuit elements 2106. The second contact terminal 2708*b* (e.g. a gate contact terminal 2708*b*) may be electrically connected to the further second contact pad 1708*b* (e.g., the gate contact pad 1708*b*) of each semiconductor circuit element of the plurality of semiconductor circuit elements 2106. Therefore, the plurality of semiconductor circuit elements 2106** may be connected in parallel.

Each semiconductor circuit element of the plurality of semiconductor circuit elements 2106 may be in shape of a stripe cell or a quadratic cell, optionally including a trench structure (see FIG. 23B) for the gate terminal, as described in the following. For example, each semiconductor circuit element of the plurality of semiconductor circuit elements 2106 may include or be formed from an insulated-gate bipolar transistor (IGBT), e.g. a field stop IGBT (including a field stop region).

The device may include an edge-termination structure 2102, which may be electrically insulated to the second contact terminal **2708*b*. The edge-termination structure 2102 may be electrically connected from the first contact terminal 2708*a***.

FIG. 22 illustrates a semiconductor device 2200 according to various embodiments in a method according to various embodiments in a schematic cross sectional view, e.g. in the schematic cross sectional view **2106*v* (see FIG. 21), similar to semiconductor device 2000*a*, showing an electrical field distribution 2202 over the semiconductor region 102. The at least one first contact pad 1706 may be electrically connected to a third contact terminal 2710 (e.g. a collector terminal 2710**).

The semiconductor device 2200 may include or be formed from a punch trough structure.

The further second contact pad **1708*b* may be formed electrical insulated from the second doped region 2004, e.g. by an electrically insulating layer 2208 formed between the further second contact pad 1708*b* and the second doped region 2004 and 2208 formed between the further second contact pad 1708*b* and the second contact pad 1708*a***.

Figure 23A:
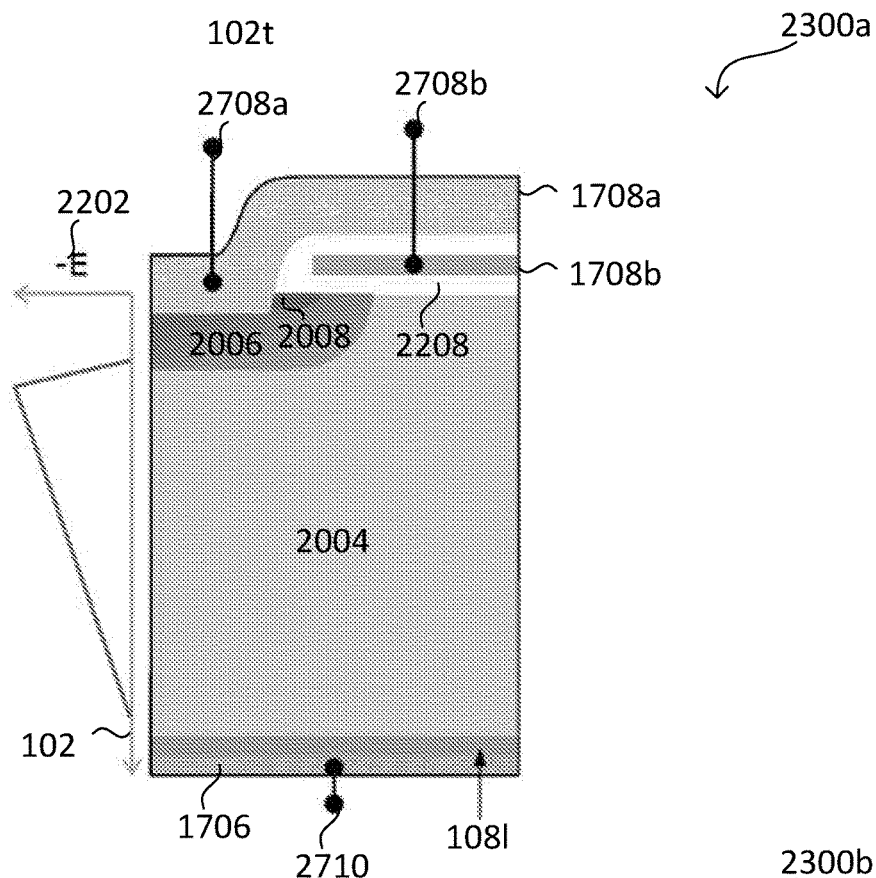
FIG. 23A and FIG. 23B respectively show a semiconductor device according to various embodiments in a method according to various embodiments in a schematic cross sectional view or side view.
Figure 23B:
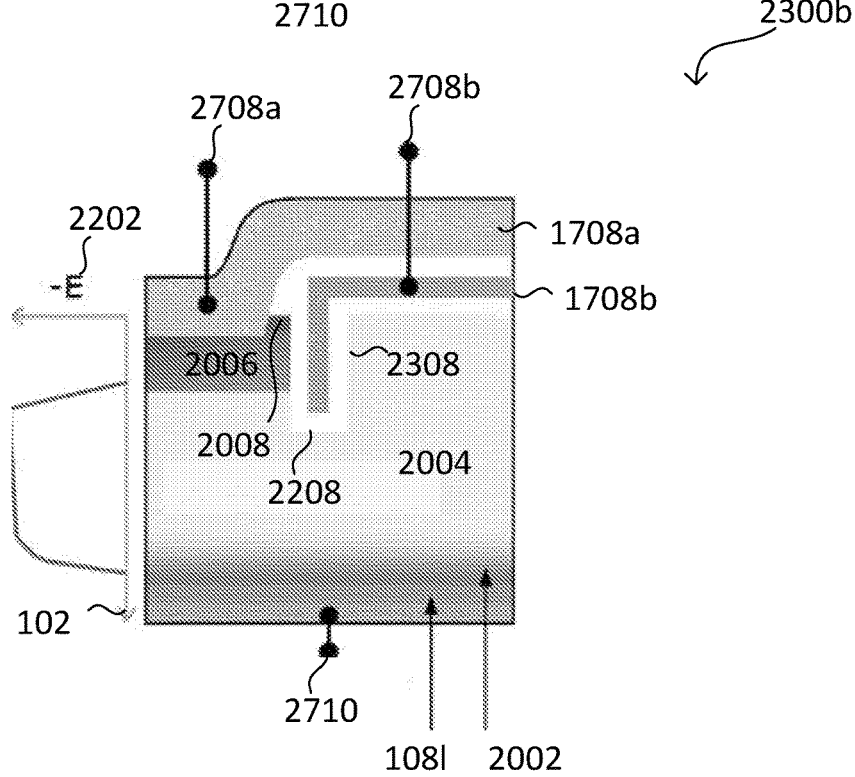

FIG. 23A and FIG. 23B respectively show a semiconductor device **2300*a*, 2300*b* according to various embodiments in a method according to various embodiments in a schematic cross sectional view, e.g. in the schematic cross sectional view 2106*v*** (see FIG. 21).

The semiconductor device **2300*a* may include or be formed from a non-punch trough structure. The semiconductor device 2300*b*** may include or be formed from a trench-and-field stop structure.

The second doped region 2004 may be part of a substrate (e.g. a semiconductor substrate), having a second doping type (e.g. an n-type doping type). The dopant layer **108*l* may be formed in the substrate, e.g. by dopant implantation. The dopant layer 108*l* may provide at least one of a better adjustability of the semiconductor device 2300*a*, 2300*b*, lower switching losses, a higher switching robustness, and direct current functionality. For example, the doping concentration of the dopant layer 108*l* may define a voltage drop of the semiconductor device 2300*a*, 2300*b* in conducting mode. The dopant layer 108*l*** may provide a backside emitter.

According to various embodiments, the semiconductor device **2300*b* may include a trench structure 2308, in which the further second contact pad 1708*b* (e.g., a gate contact pad 1708*b*) may be extended. In other words, the further second contact pad 1708*b* may extend into the second doped region 2004, e.g. between the first doped region 2006 and the second doped region 2004**.

The fourth doped region 2002 may be formed in the substrate, e.g. by dopant implantation. The fourth doped region 2002 may be formed between the dopant layer **108*l* and the second doped region 2004. The fourth doped region 2002 may enable to reduce the thickness of the second doped region 2004 (e.g. including or formed from a base region) without reducing a robustness of the semiconductor device 2300*b*. According to various embodiments, a robustness of the semiconductor device 2300*b* may be comparable to the semiconductor device 2300*a*. Further, the fourth doped region 2002** may reduce a collector-emitter saturation voltage (VCEsat).

The first doped region 2006 may include or be formed from a highly doped semiconductor region having a first doping type (e.g. p-doping type). The dopant layer **108*l* may include or be formed from a highly doped semiconductor region having the first doping type. The second doped region 2004 may include or be formed from a low doped semiconductor region having a second doping type. The third doped region 2008 and the fourth doped region 2002** respectively the may include or be formed from a highly doped semiconductor region having a second doping type. The low doped region may include a lower doping concentration than the highly doped region.

Figure 24A:
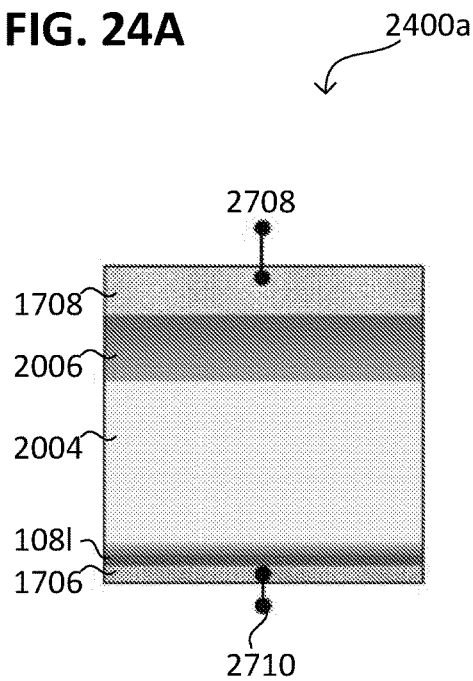
FIG. 24A, FIG. 24B and FIG. 24C respectively show a semiconductor device according to various embodiments in a method according to various embodiments in a schematic cross sectional view or side view.
Figure 24B:
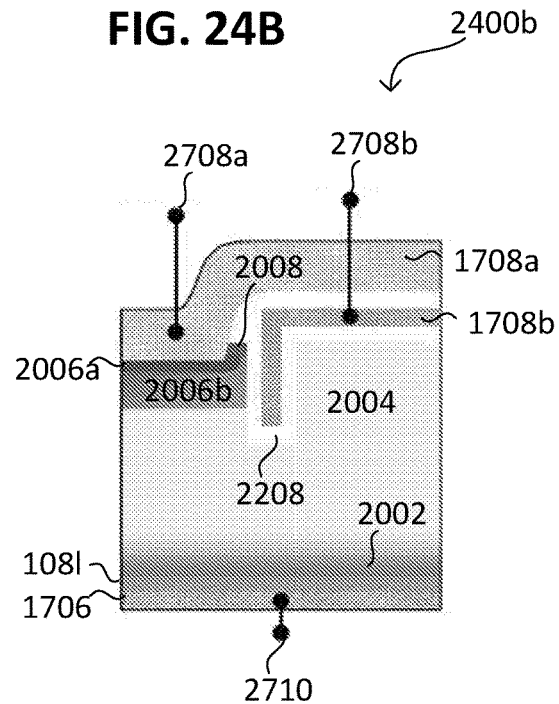
Figure 24C:
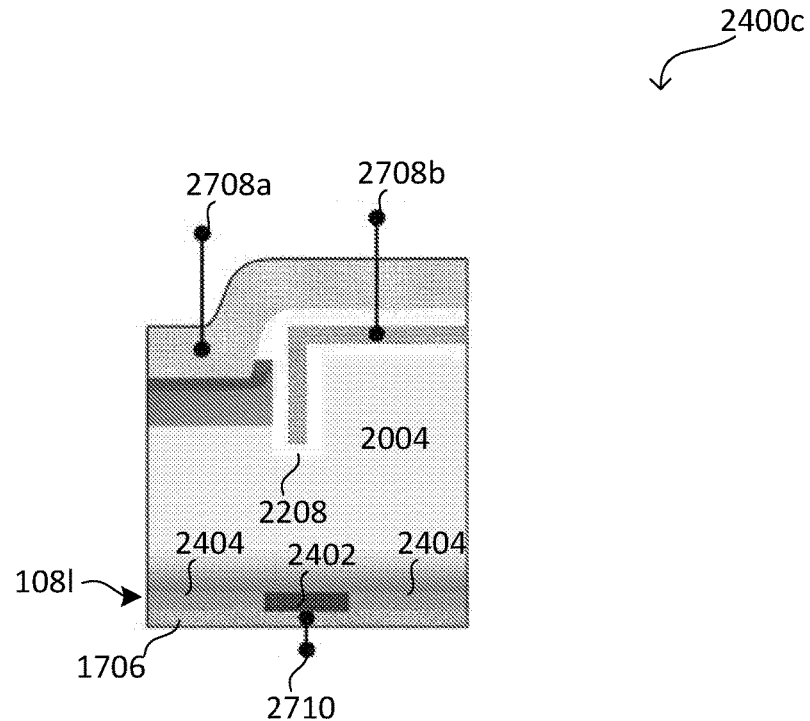

FIG. 24A, FIG. 24B and FIG. 24C respectively illustrate a semiconductor device according to various embodiments in a method according to various embodiments in a schematic cross sectional view, e.g. in the schematic cross sectional view **2106*v*** (see FIG. 21).

FIG. 24A illustrates a semiconductor device **2400*a* having a diode structure, e.g. similar to the semiconductor device 2000*b*. The second contact pad 1708 (e.g. an anode contact pad 1708) may be electrically connected to a first contact terminal 2708 (e.g. an anode contact terminal 2708). The first doped region 2006 may include or be formed from a highly doped semiconductor region having a first doping type. The dopant layer 108*l* may include or be formed from a highly doped semiconductor region having a second doping type. The second doped region 2004** may include or be formed from a low doped semiconductor region having the second doping type.

FIG. 24B illustrates a semiconductor device **2400*b* having a transistor structure, e.g. similar to the semiconductor device 2300*b*. The first doped region 2006 may include or be formed from a first highly doped semiconductor region 2006*a*** having a first doping type and a second highly doped semiconductor region 2006b having the first doping type, wherein a dopant concentration of the first highly doped semiconductor region 2006a may be higher than of the second highly doped semiconductor region 2006b. The dopant layer 108l may include or be formed from a highly doped semiconductor region having the first doping type. The second doped region 2004 may include or be formed from a low doped semiconductor region having the second doping type. The third doped region 2008 and fourth doped region 2002 respectively the may include or be formed from a highly doped semiconductor region having a second doping type.

FIG. 24C illustrates a semiconductor device 2400c having a transistor structure (e.g. a backward-transistor structure), e.g. similar to the semiconductor device 2300b, wherein the dopant layer 108l includes at least one first segment 2402 (e.g. a plurality of first segments 2402) disposed between two second segments 2404 (e.g. of a plurality of second segments). The first segment 2402 (e.g. the plurality of first segments) may include or be formed from highly doped semiconductor region having the second doping type (e.g. different from the doping type of the second doped region 2004). The two second segments 2404 (e.g. the plurality of second segments) may include or be formed from highly doped semiconductor region having the first doping type (e.g. equal to the doping type of the second doped region 2004). The segments of the plurality of first segments and the segments of the plurality of second segments may be disposed in an alternating order, e.g. adjacent to each other.

Further, preferred embodiments will be described in the following:

According to various embodiments, a method may include: structuring a semiconductor region to form a structured surface of the semiconductor region for reducing a reflectance of the semiconductor region; disposing a dopant in the semiconductor region (e.g. through the structured surface); and activating the dopant at least partially by irradiating the structured surface at least partially with electromagnetic radiation to heat the semiconductor region at least partially.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with electromagnetic radiation having at least one discrete wavelength to heat the semiconductor region at least partially.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with laser radiation to heat the semiconductor region at least partially.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with pulsed electromagnetic radiation (e.g. having at least one discrete wavelength) to heat the semiconductor region at least partially.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with electromagnetic radiation (e.g. having at least one discrete wavelength) to heat the semiconductor region at least partially in a thermal non-equilibrium heating process.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with non-thermally formed (non-thermally generated) electromagnetic radiation to heat the semiconductor region at least partially.

According to various embodiments, substantially only at least one of the structured surface of the semiconductor region or a side of the semiconductor region (e.g. on which the structured surface of the semiconductor region is disposed) may be heated, e.g. to at least a dopant-activation temperature. For example, a temperature gradient may be formed in the semiconductor region. The temperature gradient may point to the structured surface.

According to various embodiments, a method may include: structuring a semiconductor region to form a structured surface of the semiconductor region for reducing a reflectance of the semiconductor region; disposing a dopant in the semiconductor region; and activating the dopant at least partially by irradiating the structured surface at least partially with electromagnetic radiation (e.g. having at least one discrete wavelength) to heat substantially only the structured surface (or substantially only the respective side of the structured surface) at least partially, e.g. to a dopant-activation temperature.

According to various embodiments, the dopant-activation temperature may be greater than about 400° C., e.g. at least about 600° C., e.g. at least about 800° C., e.g. at least about 900° C.

According to various embodiments, a temperature gradient of at least 200 K/µm may be formed by irradiating the structured surface of the semiconductor region. The temperature gradient may point to the structured surface.

According to various embodiments, the electromagnetic radiation may include or be formed from at least one of pulsed radiation, polarized radiation, at least one discrete wavelength and coherent radiation.

According to various embodiments, heating the semiconductor region may include or may be achieved by a thermal non-equilibrium heating process. The thermal non-equilibrium heating process may include forming a temperature gradient in the semiconductor region.

According to various embodiments, substantially only the structured surface of the semiconductor region may be heated (e.g. at least within a heating depth). For example, the semiconductor region may be heated only via the structured surface. In other words, the semiconductor region may be heated substantially only through the structured surface. In still other words, energy used for heating may enter the semiconductor region substantially only through the structured surface.

According to various embodiments, the method may further include forming a doped region (e.g. a doped semiconductor region) on at least one of over or in the semiconductor region at a side opposite the dopant, wherein the doped region includes a doping type different to the dopant to form a power semiconductor circuit element including the dopant and the doped region.

According to various embodiments, the doped region may include or be formed from at least one of the following: a drift region, an emitter region, a junction region.

According to various embodiments, the doped region may be part of a diode structure, e.g. a vertical diode structure.

According to various embodiments, the doped region may be part of a transistor structure, e.g. a vertical transistor structure.

According to various embodiments, the method may further include forming an opaque layer over the structured surface after activating the dopant.

According to various embodiments, the opaque layer may be electrically conducting.

According to various embodiments, the opaque layer may include or be formed from a metal.

According to various embodiments, the opaque layer may be cover more than half of the structured surface.

According to various embodiments, structuring the semiconductor region may include or be formed from roughening the semiconductor region.

According to various embodiments, the semiconductor region is structured such that a first reflection characteristic of a first region of the structured surface is different from a second reflection characteristic of a second region of the structured surface (e.g. for a certain wavelength or range of wavelengths).

According to various embodiments, structuring the semiconductor region may include or be formed from at least one of: chemical processing, electrochemical processing or mechanical processing. In other words, structuring the semiconductor region may include or be formed from at least one processing of the following processing types: chemical processing, electrochemical processing or mechanical processing.

According to various embodiments, structuring the semiconductor region may include or be formed from at least one of: etching the semiconductor region, sanding the semiconductor region, grinding the semiconductor region, sawing into the semiconductor region, sandblasting the semiconductor region, or milling the semiconductor region.

According to various embodiments, structuring the semiconductor region may include or be formed from at least one of: electrochemical etching, stain etching, metal-assisted chemical etching, reactive-ion etching, or deep reactive ion etching (black silicon).

According to various embodiments, the structured surface may include or be formed from at least one of: a facetted structure, a pyramid structure, a trench structure, a needle structure, a hole structure, or a porous structure. According to various embodiments, the structured surface may include or be formed from at least one of: a plurality of facets, a plurality of pyramids, a plurality of trenches, a plurality of needles, a plurality of holes, or a plurality of pores.

According to various embodiments, the structuring the semiconductor region comprises forming random pyramids by anisotropically etching the semiconductor region.

According to various embodiments, the structured surface may include or be formed from a plurality of tapered protrusions.

According to various embodiments, each tapered protrusion of the plurality of tapered protrusions is faceted.

According to various embodiments, each tapered protrusion of the plurality of tapered protrusions may include or be formed from at least one sidewall which is inclined with respect to a macroscopic surface normal of the structured surface.

According to various embodiments, the structured surface may include or be formed from a plurality of tapered recesses.

According to various embodiments, each tapered recess of the plurality of tapered recesses is faceted.

According to various embodiments, each tapered recess of the plurality of tapered recesses may include or be formed from at least one sidewall which is inclined with respect to a macroscopic surface normal of the structured surface.

According to various embodiments, structuring the semiconductor region may include using a mask for adjusting a spatial distribution of a reflectance of the structured surface.

According to various embodiments, the structured surface is heated to a temperature less than an evaporation temperature of the structured surface during activating the dopant.

According to various embodiments, the electromagnetic radiation may include or be formed from radiation in the range from ultraviolet radiation to infrared radiation. In other words, the electromagnetic radiation may also include at least one of ultraviolet radiation, visible radiation or infrared radiation. For example, the electromagnetic radiation may include or be formed from ultraviolet radiation. Alternatively or additionally, the electromagnetic radiation may include or be formed from infrared radiation. Alternatively or additionally, the electromagnetic radiation may include or be formed from visible radiation and/or a discrete spectrum (radiation having one or more discrete wavelengths).

According to various embodiments, disposing a dopant may include or be formed from at least one of: implanting ions into the semiconductor region (e.g. by irradiating the semiconductor region with the ions), the ions including or formed from the dopant (also referred to as doping ions), forming a layer including the dopant over the semiconductor region, and exposing the semiconductor region to a gas including the dopant. In other words, disposing a dopant may include implanting dopant ions into the semiconductor region to form a layer including the dopant in the semiconductor region.

According to various embodiments, activating the dopant may include or be formed from increasing the electrical conductivity of the semiconductor region, e.g. of at least the structured surface of the semiconductor region.

According to various embodiments, activating the dopant may include or be formed from incorporating the dopant at least partially into a lattice structure of the semiconductor region.

According to various embodiments, activating the dopant may include or be formed from at least partially recrystallizing the semiconductor region (e.g. at least a portion of the semiconductor region in which the dopant is disposed).

According to various embodiments, during the activating of the dopant the semiconductor region is at least partially heated to a temperature less than a melting temperature of the semiconductor region.

According to various embodiments, during the activating of the dopant, the semiconductor region is at least partially heated to a temperature of at least about 70% of a melting temperature of the semiconductor region, e.g. of at least about 80% of a melting temperature of the semiconductor region, e.g. of at least about 90% of a melting temperature of the semiconductor region. Alternatively or additionally, during the activating of the dopant, the semiconductor region is at least partially heated to a temperature less than a melting temperature of the semiconductor region According to various embodiments, during the activating of the dopant, the semiconductor region is at least partially heated to a temperature of at least about 900° C. (more than about 900° C.), e.g. of at least about 1000° C., e.g. of at least about 1100° C., e.g. of at least about 1200° C., e.g. of at least about 1500° C., e.g. of at least about 2000° C.

According to various embodiments, during the activating of the dopant, the semiconductor region is at least partially heated to a temperature greater than a melting temperature of the semiconductor region, e.g. greater than 110% of the melting temperature of the semiconductor region, e.g. greater than 120% of the melting temperature of the semiconductor region, e.g. greater than 140% of the melting temperature of the semiconductor region, e.g. greater than 160% of the melting temperature of the semiconductor region.

According to various embodiments, during the activating of the dopant, a surface layer of the structured surface having a thickness of greater than about 0.4 µm is heated, e.g. to the temperature.

According to various embodiments, a roughness of the semiconductor region is increased during the structuring the semiconductor region (in other words, the semiconductor region is roughened); and the roughness of the semiconductor region is reduced during the activating of the dopant (in other words, the semiconductor region is flattened).

According to various embodiments, during the activating of the dopant the structured surface is flattened (in other words, reduced in roughness).

According to various embodiments, irradiating the structured surface may include using an optical resonator, e.g. a laser source. In other words, the electromagnetic radiation may include or be formed from laser light.

According to various embodiments, irradiating the structured surface may include scanning the structured surface with the electromagnetic radiation.

According to various embodiments, the electromagnetic radiation may include or be formed from a wavelength in the range from about 500 nm to 600 nm.

According to various embodiments, the electromagnetic radiation may include or be formed from a wavelength in the range from about 350 nm to 500 nm.

According to various embodiments, the electromagnetic radiation may include or be formed from a wavelength in the range from about 250 nm to 350 nm.

According to various embodiments, the electromagnetic radiation may include or be formed from pulsed electromagnetic radiation.

According to various embodiments, irradiating the structured surface may include or be formed from laser thermal annealing.

According to various embodiments, the method may further include forming a metallization layer over the semiconductor region after activating of the dopant.

According to various embodiments, the method may further include forming at least one transistor in electrical contact to the structured surface. The transistor may be formed at least one of in or on the semiconductor region.

According to various embodiments, the method may further include forming at least one gate contact pad in electrical contact to the structured surface, e.g. over the structured surface.

According to various embodiments, the method may further include forming a plurality of semiconductor circuit elements electrically connected in parallel to each other and in electrical contact to the structured surface.

According to various embodiments, the semiconductor region may include or be formed from a single crystalline semiconductor material.

According to various embodiments, the semiconductor region may include or be formed from a polycrystalline semiconductor material.

According to various embodiments, structuring the semiconductor region may include thinning the semiconductor region. In other words, during structuring the semiconductor region the semiconductor region may be thinned.

According to various embodiments, activating the dopant may include forming a doped surface layer within the semiconductor region. In other words, during activating the dopant, the doped surface layer may be formed within the semiconductor region.

According to various embodiments, the doped surface layer may include the dopant and a material of the semiconductor region.

According to various embodiments, the doped surface layer may include the dopant activated in the material of the semiconductor region.

According to various embodiments, the doped surface layer may be adjacent to the structured surface.

According to various embodiments, the doped surface layer may include the structured surface.

According to various embodiments, the structured surface and the irradiating of the structured surface are configured to provide multiple reflections of the electromagnetic radiation at least one of at or in the structured surface.

According to various embodiments, the structured surface is configured to provide multiple reflections of the electromagnetic radiation incident on the structured surface.

According to various embodiments, the method may further include forming an antireflective coating over the structured surface of the semiconductor region before the activating of the dopant.

According to various embodiments, a reflectance (reflection coefficient) of the structured surface is less than about 0.5 for electromagnetic radiation in the range from about 250 nm to about 350 nm and incident along a direction of a macroscopic surface normal of the structured surface. For example, the reflectance may be less than about 0.45, e.g. less than about 0.4, e.g. less than about 0.3.

According to various embodiments, a reflectance (reflection coefficient) of the structured surface is less than about 0.5 for electromagnetic radiation in the range from about 500 nm to about 600 nm and incident along a direction of a macroscopic surface normal of the structured surface. For example, the reflectance may be less than about 0.45, e.g. less than about 0.4, e.g. less than about 0.3.

According to various embodiments, a method may include: structuring the semiconductor region to form a structured surface of the semiconductor region at a first side of the semiconductor region; disposing a dopant at least one of over or in the semiconductor region at the first side of the semiconductor region; and activating the dopant at least partially by irradiating the structured surface at least partially with electromagnetic radiation (e.g. having at least one discrete wavelength) to at least a portion of the semiconductor region at the first side of the semiconductor region; and forming a doped region on at least one of over or in the semiconductor region at a second side of the semiconductor region opposite the first side, wherein the doped region includes a doping type different to the dopant to form a power semiconductor circuit element including the dopant and the doped region.

According to various embodiments, the power semiconductor circuit element may include or be formed from at least one transistor structure.

According to various embodiments, the power semiconductor circuit element may include or be formed from a vertical structure.

According to various embodiments, the power semiconductor circuit element may include at least one gate contact pad (in other words, one gate contact pad or more gate contact pad).

According to various embodiments, the power semiconductor circuit element may include or be formed from a plurality of semiconductor circuit elements connected in parallel to each other.

According to various embodiments, structuring the semiconductor region may include thinning the semiconductor region.

According to various embodiments, a semiconductor device may include: a semiconductor region including a structured surface and an activated dopant; wherein the activated dopant is disposed adjacent to the structured surface; wherein the structured surface may include or be formed from at least one of a plurality of rounded protrusions, or a plurality of rounded recesses.

What is claimed is:

1. A method comprising:
    structuring a semiconductor region to form a structured surface of the semiconductor region;
    disposing a dopant in the semiconductor region;
    activating the dopant at least partially by irradiating the structured surface at least partially with electromagnetic radiation having at least one discrete wavelength to heat the semiconductor region at least partially; and
    forming a doped region on at least one of over or in the semiconductor region at a side opposite the dopant, wherein the doped region comprises a doping type different to the dopant to form a power semiconductor circuit element comprising the dopant and the doped region.

2. The method of claim 1,
    wherein the dopant is disposed in the semiconductor region at least one of before and after the structuring the semiconductor region.

3. The method of claim 1,
    wherein the semiconductor region is heated substantially only through the structured surface.

4. The method of claim 1,
    wherein the electromagnetic radiation comprises at least one of pulsed radiation and coherent radiation.

5. The method of claim 1,
    wherein heating the semiconductor region comprises a thermal non-equilibrium heating process.

6. The method of claim 1,
    wherein the semiconductor region is structured such that a first reflection characteristic of a first region of the structured surface is different from a second reflection characteristic of a second region of the structured surface.

7. The method of claim 1,
    wherein the structured surface comprises at least one of: a facetted structure, a pyramid structure, a trench structure, a needle structure, a hole structure, a porous structure, plurality of tapered protrusions.

8. The method of claim 1,
    wherein the structuring the semiconductor region comprises forming random pyramids by anisotropically etching the semiconductor region.

9. The method of claim 1,
    wherein structuring the semiconductor region comprises using a mask for adjusting a spatial distribution of a reflectance of the structured surface.

10. The method of claim 1,
    wherein the structured surface is heated to a temperature less than an evaporation temperature of the structured surface during activating the dopant.

11. The method of claim 1,
    wherein activating the dopant comprises at least partially recrystallizing the semiconductor region.

12. The method of claim 1,
    wherein a roughness of the semiconductor region is increased during the structuring the semiconductor region; and
    wherein the roughness of the semiconductor region is reduced during the activating of the dopant.

13. The method of claim 1,
    wherein irradiating the structured surface comprises using a laser source.

14. The method of claim 1, further comprising:
    forming at least one collector contact pad in electrical contact to the structured surface.

15. The method of claim 1,
    wherein structuring the semiconductor region comprises thinning the semiconductor region.

16. The method of claim 1,
    wherein activating the dopant comprises forming a doped surface layer within the semiconductor region.

17. The method of claim 1,
    wherein the structured surface is configured to provide multiple reflections of the electromagnetic radiation incident on the structured surface.

18. The method of claim 1,
    wherein a reflectance of the structured surface is less than about 0.5 for electromagnetic radiation in the range from about 250 nm to about 350 nm and incident along a direction of a macroscopic surface normal of the structured surface.

19. A method comprising:
    structuring a semiconductor region to form a structured surface of the semiconductor region at a first side of the semiconductor region;
    disposing a dopant at least one of over or in the semiconductor region at the first side of the semiconductor region; and
    activating the dopant at least partially by irradiating the structured surface at least partially with electromagnetic radiation to at least a portion of the semiconductor region at the first side of the semiconductor region; and
    forming a doped region on at least one of over or in the semiconductor region at a second side of the semiconductor region opposite the first side, wherein the doped region comprises a doping type different to the dopant to form a power semiconductor circuit element comprising the dopant and the doped region.

20. The method of claim 19,
    wherein the power semiconductor circuit element comprises at least one transistor structure.

21. The method of claim 19,
    wherein the power semiconductor circuit element comprises a vertical structure.

22. The method of claim 19,
wherein structuring the semiconductor region comprises thinning the semiconductor region.

\* \* \* \* \*